United States Patent
Ikeda et al.

(10) Patent No.: US 8,675,387 B2
(45) Date of Patent: Mar. 18, 2014

(54) VARIABLE RESISTANCE NONVOLATILE MEMORY DEVICE AND PROGRAMMING METHOD FOR SAME

(75) Inventors: Yuichiro Ikeda, Hyogo (JP); Kazuhiko Shimakawa, Osaka (JP); Yoshihiko Kanzawa, Osaka (JP); Shunsaku Muraoka, Osaka (JP); Yoshikazu Katoh, Osaka (JP)

(73) Assignee: Panasonic Corporation, Osaka (JP)

( * ) Notice: Subject to any disclaimer, the term of this patent is extended or adjusted under 35 U.S.C. 154(b) by 303 days.

(21) Appl. No.: 13/121,262

(22) PCT Filed: Jul. 26, 2010

(86) PCT No.: PCT/JP2010/004747
§ 371 (c)(1),
(2), (4) Date: Mar. 28, 2011

(87) PCT Pub. No.: WO2011/013344
PCT Pub. Date: Feb. 3, 2011

(65) Prior Publication Data
US 2011/0182109 A1 Jul. 28, 2011

(30) Foreign Application Priority Data
Jul. 28, 2009 (JP) ................................. 2009-174934

(51) Int. Cl.
*G11C 11/00* (2006.01)
*G11C 13/00* (2006.01)
(52) U.S. Cl.
CPC ........ *G11C 13/0002* (2013.01); *G11C 13/0069* (2013.01)

USPC ................ 365/148; 365/189.09; 365/189.11; 365/189.16

(58) Field of Classification Search
USPC ................. 365/148, 158, 163, 171, 173, 100, 365/189.09, 189.11, 189.16
See application file for complete search history.

(56) References Cited

U.S. PATENT DOCUMENTS

| 8,254,157 B2 * | 8/2012 | Sugibayashi ................. 365/148 |
| 2005/0174840 A1 | 8/2005 | Tsushima et al. |

(Continued)

FOREIGN PATENT DOCUMENTS

| JP | 2005-235360 | 9/2005 |
| JP | 2006-203098 | 8/2006 |

(Continued)

OTHER PUBLICATIONS

International Search Report issued Oct. 19, 2010 in International (PCT) Application No. PCT/JP2010/004747.
David R. Lide, Editor-in-chief, "*CRC Handbook of Chemistry and Physics*", 84th Edition 2003-2004, CRC Press.

*Primary Examiner* — Kretelia Graham
(74) *Attorney, Agent, or Firm* — Wenderoth, Lind & Ponack, L.L.P.

(57) ABSTRACT

A variable resistance nonvolatile memory device includes a plurality of memory cells in each of which a variable resistance element and a current steering element having two terminals are connected in series. Additionally, a current limit circuit limits a first current flowing in a direction for changing the memory cells to a low resistance state, and a boost circuit increases, when one of the memory cells changes to the low resistance state, the first current in a first period before the memory cell changes to the low resistance state.

19 Claims, 55 Drawing Sheets

(56) References Cited

U.S. PATENT DOCUMENTS

| | | |
|---|---|---|
| 2007/0165442 A1 | 7/2007 | Hosoi et al. |
| 2009/0052225 A1 | 2/2009 | Morimoto |
| 2009/0224224 A1 | 9/2009 | Fujii et al. |
| 2009/0283736 A1 | 11/2009 | Kanzawa et al. |
| 2010/0061142 A1 | 3/2010 | Arita et al. |
| 2010/0073983 A1 | 3/2010 | Hosoi |
| 2010/0118591 A1 | 5/2010 | Sugibayashi |
| 2010/0172171 A1 | 7/2010 | Azuma et al. |
| 2010/0207094 A1 | 8/2010 | Kanzawa et al. |
| 2011/0002154 A1 | 1/2011 | Mitani et al. |
| 2011/0002155 A1 | 1/2011 | Arita et al. |

FOREIGN PATENT DOCUMENTS

| | | |
|---|---|---|
| JP | 2007-188603 | 7/2007 |
| JP | 2008-123690 | 5/2008 |
| JP | 2008-198275 | 8/2008 |
| JP | 2010-021381 | 1/2010 |
| WO | 2008/059701 | 5/2008 |
| WO | 2008/117494 | 10/2008 |
| WO | 2008/120480 | 10/2008 |
| WO | 2008/149484 | 12/2008 |
| WO | 2008/149493 | 12/2008 |
| WO | 2009/050833 | 4/2009 |
| WO | 2010/004675 | 1/2010 |
| WO | 2010/004705 | 1/2010 |

\* cited by examiner

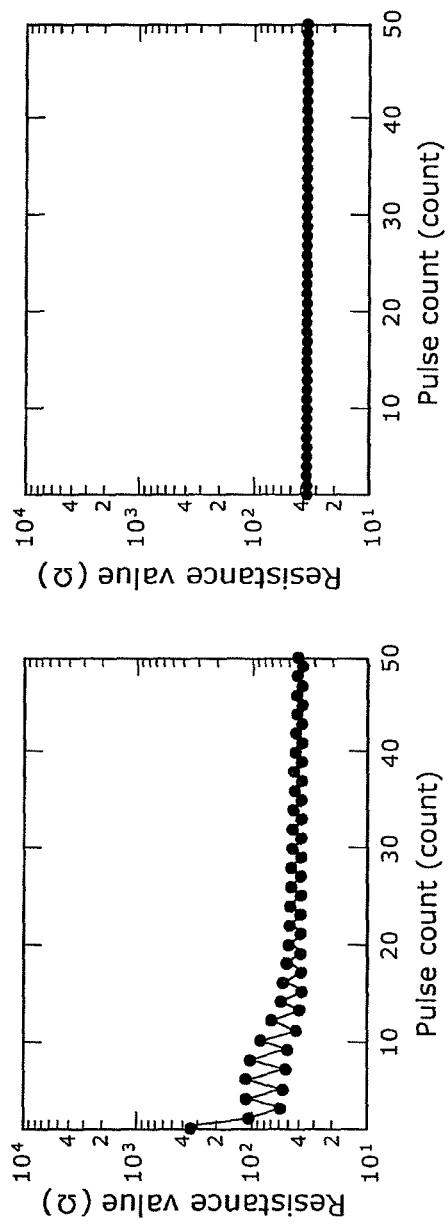

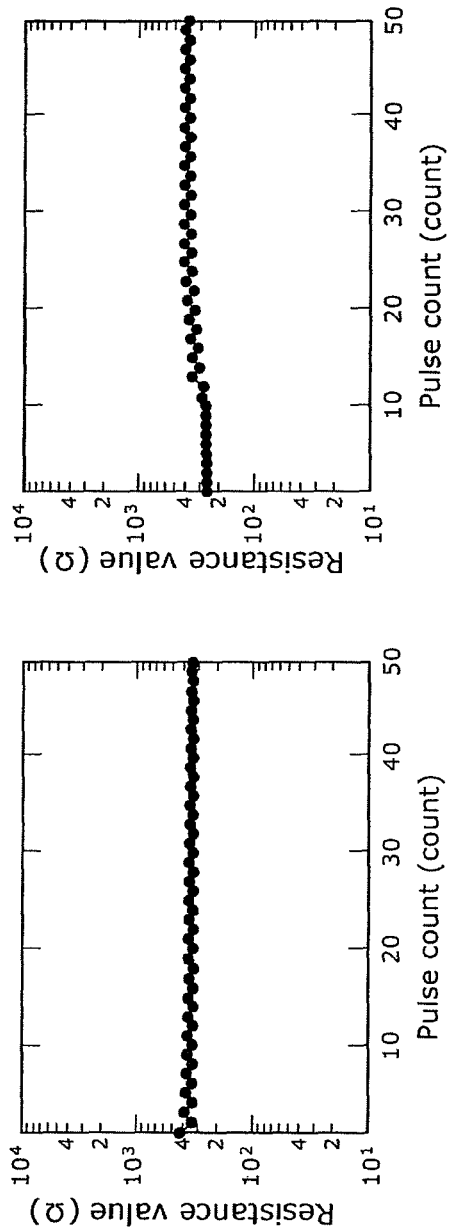

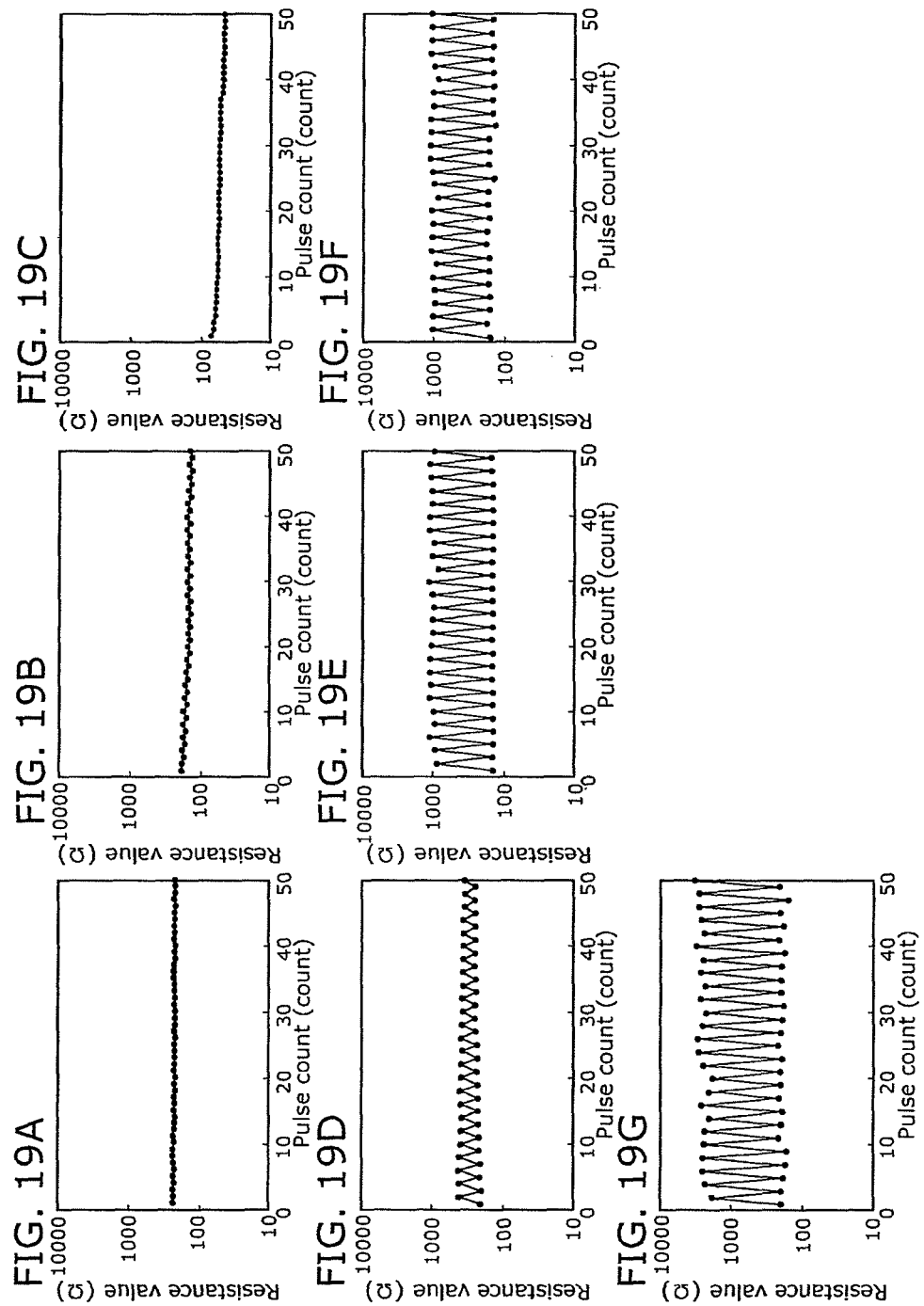

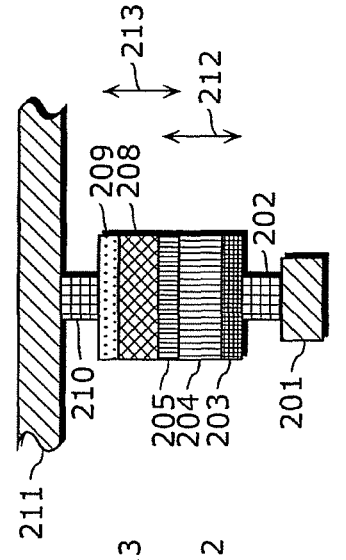
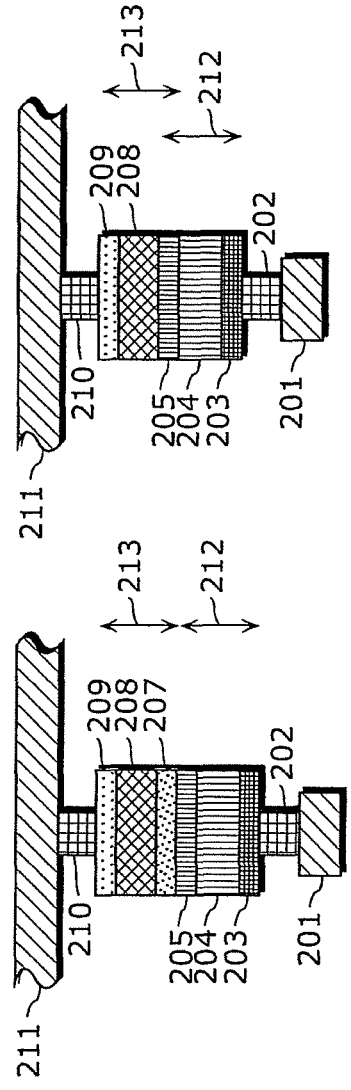
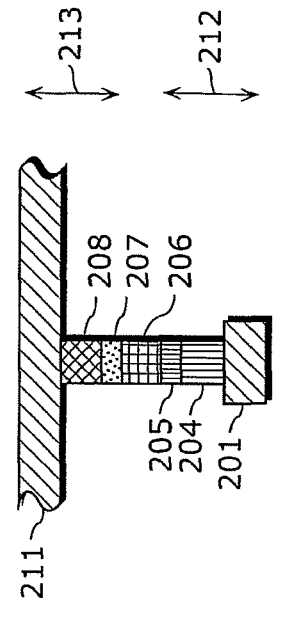
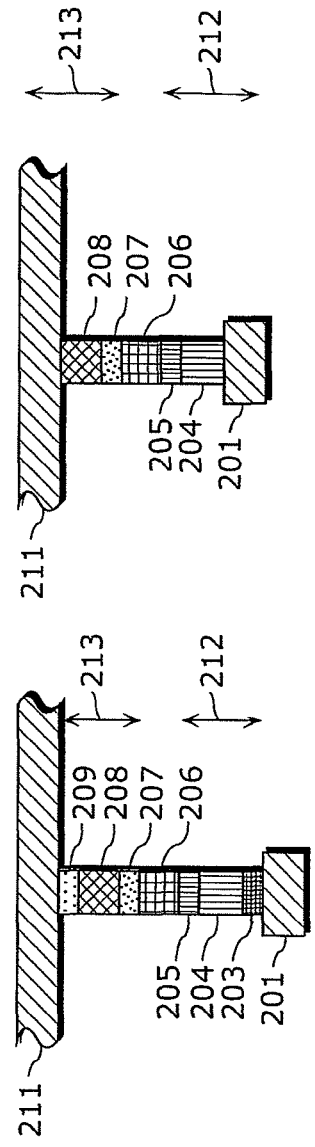
FIG. 32A
FIG. 32B
FIG. 32C
FIG. 32D

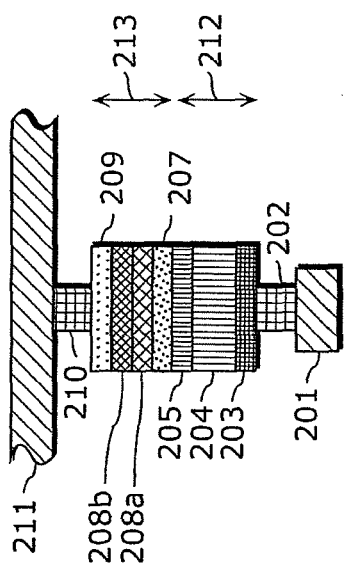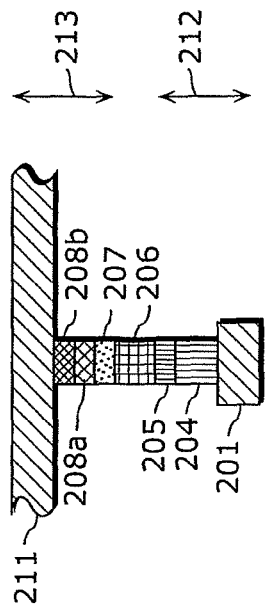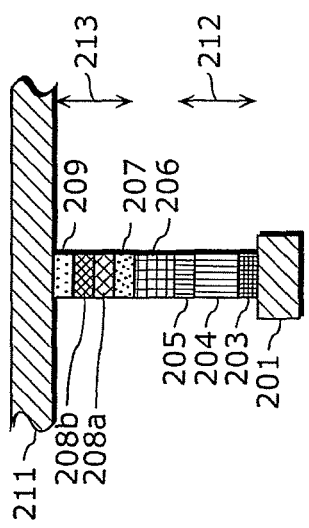

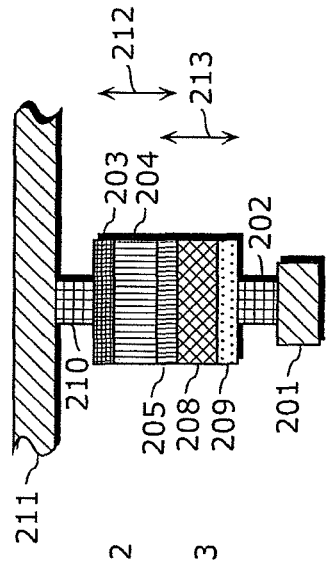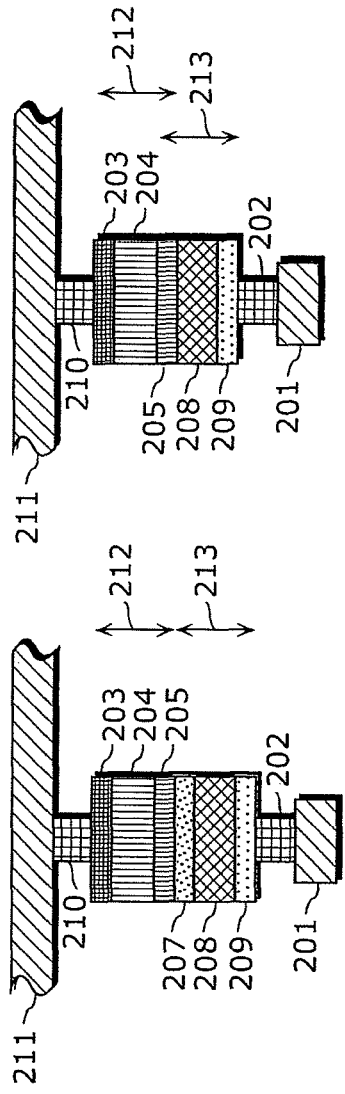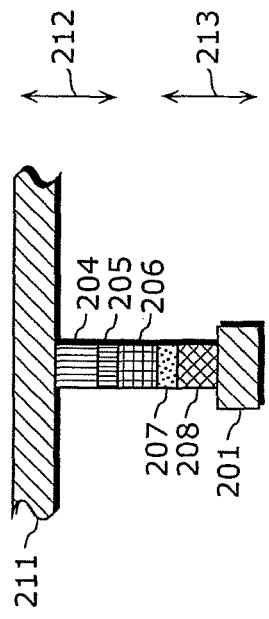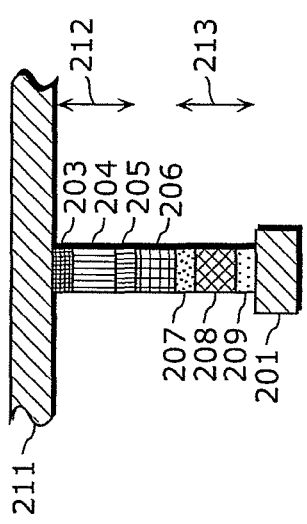

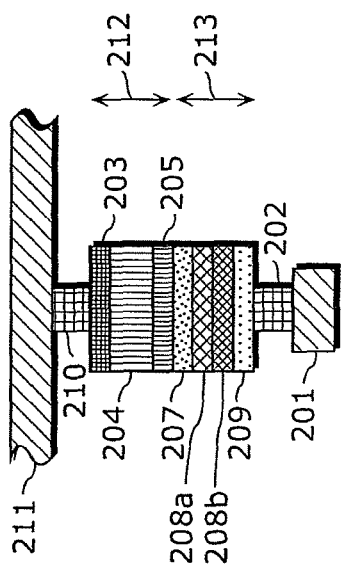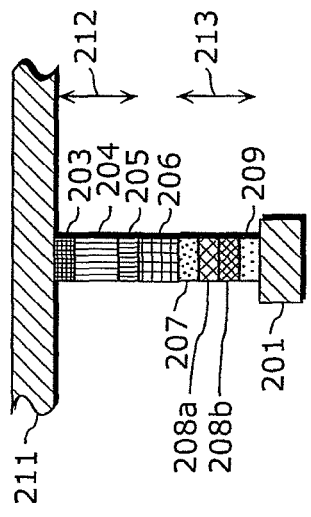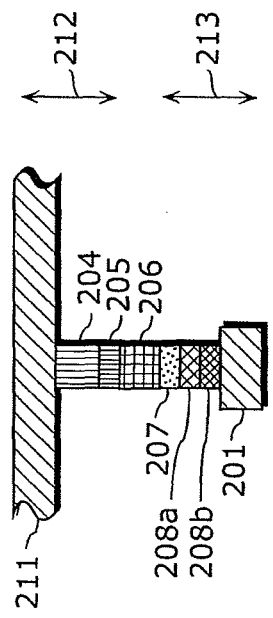

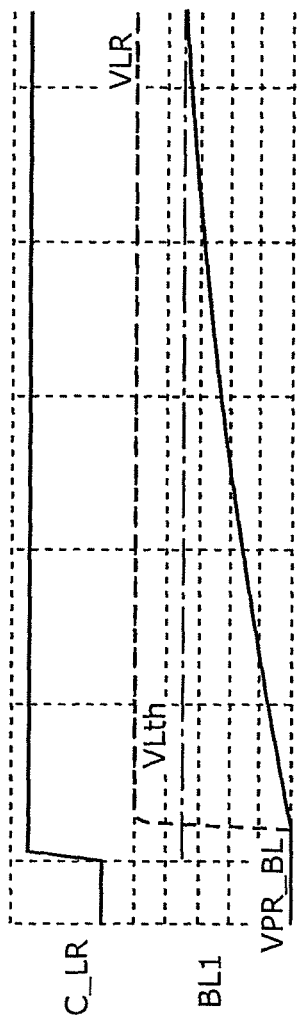
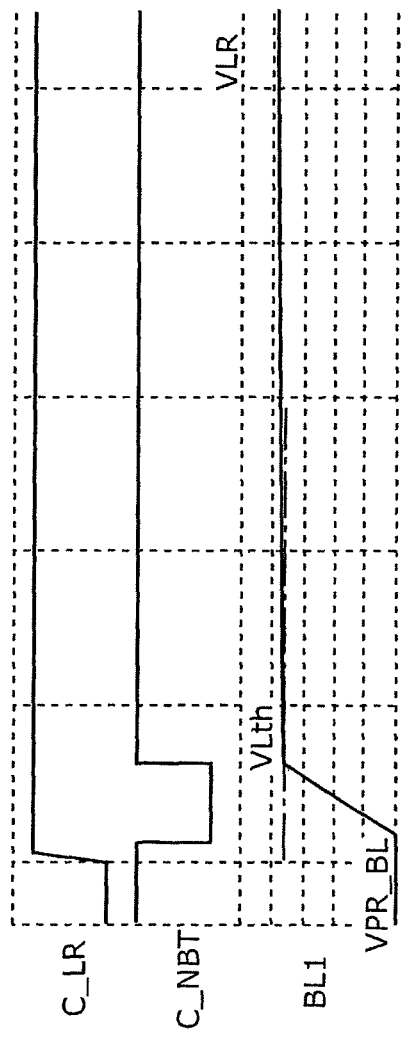
FIG. 43A
FIG. 43B

:

VARIABLE RESISTANCE NONVOLATILE MEMORY DEVICE AND PROGRAMMING METHOD FOR SAME

This application is the National Stage of International Application No. PCT/JP2010/004747, filed Jul. 26, 2010.

TECHNICAL FIELD

The present invention relates to a variable resistance nonvolatile memory device having memory cells each of which includes a current steering element and a variable resistance element in which a resistance value reversibly changes based on electrical signals, and to a programming method for the variable resistance nonvolatile memory device.

BACKGROUND ART

In recent years, research and development projects regarding nonvolatile memory devices having memory cells structured with variable resistance elements have been moved forward. A variable resistance element is an element which has a property that a resistance value reversibly changes based on electrical signals and further can store data corresponding to the resistance value in a nonvolatile manner.

Commonly known as a nonvolatile memory device including variable resistance elements is a nonvolatile memory device including memory cells, that is, so-called 1T1R memory cells each formed by connecting in series a transistor and a variable resistance element, each of which is array-arranged in, a matrix at a position where a bit line intersects a word line arranged to cross the bit line at a different level. For higher integration, also known are a nonvolatile memory device including memory cells, that is, so-called cross point 1D1R memory cells, array-arranged in a matrix, and a nonvolatile memory device including a plurality of layers of the 1D1R cross point memory cells. Each of the 1D1R cross point memory cells is formed by connecting in series a variable resistance element and a diode functioning as a current steering element, and is provided at a position where a bit line intersects a word line arranged to cross the bit line at a different level.

PTL 1 discloses a nonvolatile memory device including 1T1R memory cells in which amorphous thin films such as rare-earth oxide films are used as variable resistance elements.

FIG. 54 is a circuit diagram of the memory cell of the nonvolatile memory device disclosed by PTL 1.

A memory cell 1001 is composed of a transistor 1002 and a variable resistance element 1003 which are electrically connected in series.

PTL 1 discloses, as a material for the variable resistance element 1003, an amorphous thin film such as a rare-earth oxide film, and discloses, as a material for an electrode, copper silver, and zinc.

FIG. 55 is a graph showing a voltage-current change of the variable resistance element 1003 which is used in the memory cell of the nonvolatile memory device disclosed by PTL 1. At the time of writing, a potential difference is applied between V1 and V2 of FIG. 54 so that a voltage of +1.1X [V] or higher and a small amount of current are applied to the variable resistance element 1003 which thereby changes from a high resistance state to a low resistance state. At the time of erasing, a voltage having reverse polarity to that of writing is applied so that a voltage of −1.1X [V] and a current of −1.5Y [A] are applied to the variable resistance element 1003 which thereby changes from a low resistance state to a high resistance state.

PTL 1 discloses that at the time of writing, controlling the value of current upon the change of the variable resistance element 103 to the low resistance state according to a change in the on-resistance value of the transistor 1002 of FIG. 54 with its gate voltage controlled or in the like method allows a control on the resistance value of the variable resistance element 1003 in the low resistance state, and discloses applying this principle to multi-valued memories.

PTL 2 discloses a nonvolatile memory device which includes 1D1R cross point memory cells using, as a variable resistance element, a material having a perovskite type crystalline structure, and using a varistor as a bi-directional diode.

FIG. 56 schematically shows a memory cell array of a nonvolatile memory device 1200 disclosed by PTL 2. A memory cell 1280 is composed of a diode 1270 and a variable resistance element 1260 which are electrically connected in series. Numerals 1210 and 1220 denote a bit line and a word line, respectively.

In the variable resistance element 1260, a variable resistance layer 1230 of which resistance is changed by voltage application is held between an upper electrode 1240 and a lower electrode 1250.

FIG. 57 shows voltage-current characteristics of a diode 1270. As shown in FIG. 57, the diode is bi-directional and has symmetrical and non-linear voltage-current characteristics allowing a drastic increase in current at a voltage equal to or higher than a threshold voltage Vth.

PTL 2 discloses, as a material for the variable resistance layer 1230, manganese, titanium, zirconia, and a high-temperature superconducting material, manganese oxide obtained by combining the rare-earth metals such as La or Pr or a mixed crystal of La and Pr, the alkaline earth metals such as Ca or Sr or a mixed crystal of Ca and Sr, and $Pr_{1-x}Ca_xMnO_3$ (x=0.3, 0.5), and discloses, as a material for the upper electrode 1240 and the lower electrode 1250, a simple substance or alloy of Pt, Ir, Ph, and Pd, an oxide conductor such as Ir and Ru, SRO and YBCO. As a material or device for the diode, PTL 2 discloses a ZnO varistor prepared by sintering a metal oxide such as zinc oxide and a small amount of bismuth oxide, and a $SrTiO_3$ varistor.

Furthermore, PTL 2 discloses that at the time of writing, Vpp is applied to the selected bit lines, ½ Vpp is applied to the non-selected bit line, 0 V is applied to the selected word lines, and ½ Vpp is applied to the non-selected word lines, and at the time of erasing, Vpp is applied to the selected word lines, ½ Vpp is applied to the non-selected word lines, 0 V is applied to the selected bit lines, and ½ Vpp is applied to the non-selected bit lines.

Thus, PTL 2 discloses that by using, as the diode of the 1D1R cross point memory cell, a non-linear element such as a varistor allowing the currents to flow bi-directionally, necessary currents can be flown bi-directionally at the time of rewriting, and moreover, optimizing the threshold voltage Vth so that the voltage ½ Vpp applied to the non-selected lines is lower than the threshold voltage Vth of the non-linear element solves the problem of current leakage to the non-selected cells, with the result that the array size of the memory cell array can be made larger and a high integration can be achieved.

CITATION LIST

Patent Literature

[PTL 1]
Japanese Unexamined Patent Application Publication No. 2005-235360 (FIGS. 1 and 2)
[PTL 2]
Japanese Unexamined Patent Application Publication No. 2006-203098 (FIGS. 2 and 4)
[PTL 3]
International Publication No. WO2009/050833
[PTL 4]
International Publication No. WO2008/059701
[PTL 5]
International Publication No. WO2008/149484
[PTL 6]
International Publication No. WO2010/004705
[PTL 7]
Japanese Unexamined Patent Application Publication No. 2010-21381
[PTL 8]
International Publication No. WO2008/117494
[PTL 9]
International Publication No. WO2010/004675

Non Patent Literature

[NTL 1]
"CRC HANDBOOK of CHEMISTRY and PHYSICS, DAVID R. LIDE Editor-in-chief, 84$^{th}$ Edition 2003-2004, CRC PRESS"

Summary of Invention

Inventors of the present application have examined, as one of variable resistance nonvolatile memory devices, a variable resistance nonvolatile memory device including 1D1R cross point memory cells each having a variable resistance layer comprising an oxygen-deficient oxide of a transition metal.

Here, the oxygen-deficient oxide is an oxide whose composition is deficient of oxygen compared to its stoichiometric composition. In an example of tantalum that is one of transition metals, $Ta_2O_5$ is the oxide having the stoichiometric composition. $Ta_2O_5$ contains oxygen 2.5 times greater than the tantalum, which is 71.4% when expressed with an oxygen content atomic percentage. An oxide whose oxygen content atomic percentage is lower than the oxygen content atomic percentage 71.4%, that is, a Ta oxide having non-stoichiometric composition which is expressed as $TaO_x$ and satisfies $0<x<2.5$ is called an oxygen-deficient Ta oxide. Generally, many transition metal oxides having respective stoichiometric compositions are insulators, but oxygen-deficient oxides exhibit a semiconductive or conductive property.

The following describes properties of a variable resistance element having a variable resistance layer comprising the oxygen-deficient Ta oxide, in order to facilitate description of problems to be solved.

FIG. 1 schematically shows a basic structure of the variable resistance element used for the measurement. An oxygen-deficient Ta oxide is used for a variable resistance layer 3302 of the variable resistance element. The variable resistance element is structured to be top-and-bottom symmetry by locating the variable resistance layer 3302 between a lower electrode 3301 and an upper electrode 3303, both of which contain Pt.

Hereinafter, the nonvolatile element is called an element A. It is to be noted that Table 1 shows a relationship between names of elements and electrode materials including elements to be described in an embodiment.

TABLE 1

| Name of Element | Lower Electrode Material | Upper Electrode Material |
|---|---|---|
| A | Pt | Pt |
| B | Pt | Pt |
| C | W | W |
| D | Ta | Ta |
| E | TaN | TaN |
| F | W | Pt |
| G | W | Ir |
| H | W | Ag |
| I | W | Cu |
| J | W | Ni |
| K | W | Ta |
| L | W | Ti |
| M | W | Al |
| N | W | TaN |

FIG. 2 is a graph showing hysteretic current-voltage characteristics showing an example of a situation of a resistance change of the element A. The horizontal axis of the graph indicates a voltage of the upper electrode 3303 with reference to the lower electrode 3301, and the vertical axis of the same indicates a value of a current flowing through the element A.

In FIG. 2, it is assumed that the variable resistance element is initially on a point O with a voltage of 0 V in a low resistance state. As the upper electrode 3303 is given a positive voltage with respect to the lower electrode 3301, a current increases substantially in proportion to the voltage, but with a voltage over the positive voltage on a point A, the current decreases sharply to a point D. That is, this shows a change (an increase in resistance) from a low resistance state to a high resistance state.

On the other hand, in the point O in a high resistance state, as the upper electrode 3303 is given a negative voltage with respect to the lower electrode 3301 (which is equivalent to giving the lower electrode 3301 a positive voltage with respect to the upper electrode 3303), the current increases sharply with a voltage over the negative voltage on a point B. That is, this shows a change (a decrease in resistance) from a high resistance state to a low resistance state. In addition, a phenomenon was observed that the low resistance value on a terminal point C of FIG. 2 depended on the value of current flowing in the resistance-decreasing state (equivalent to the state on the point C of FIG. 2) as in the phenomenon disclosed by PTL 1.

Furthermore, in the resistance change characteristics shown in FIG. 2, the terminal point C of the resistance-decreasing state and the starting point A of the resistance-increasing state are located roughly symmetrically. That is, it can be seen that applying a current controlled to a predetermined level (approximately −15 mA at the point C) at the resistance-decreasing point corresponding to the point C results in a desired low resistance, while applying a current more than the above at the voltage corresponding to the point A results in an increase in resistance so that a stable resistance change operation can be achieved.

The inventors of the present application have discovered during the examination that a voltage application direction (driving polarity) stably causing a resistance change in a direction (a decrease in resistance and an increase in resistance) is not always uniform, and that variable resistance elements differ in the driving polarity, the variable resistance elements comprising the same material using Pt for the upper and lower electrodes and the oxygen-deficient Ta oxide for the variable resistance layer.

For instance, a variable resistance element has been verified to decrease in resistance by applying a pulse voltage of +2.0V amplitude and 100 ns width to an upper electrode 3303 and a lower electrode 3301, and to increase in resistance by applying a pulse voltage of −2.6V amplitude and 100 ns width thereto, with a high voltage of the upper electrode 3303 being positive with reference to the lower electrode 3301.

In addition, another variable resistance element has been verified to decrease in resistance by applying a pulse voltage of −2.0V amplitude and 100 ns width to an upper electrode 3303 and a lower electrode 3301, and to increase in resistance by applying a pulse voltage of +2.7V amplitude and 100 ns width thereto, with a high voltage of the upper electrode 3303 being positive with reference to the lower electrode 3301.

FIGS. 3A and 3B are graphs each showing a resistance value of each of these variable resistance elements every time alternate application of a pulse voltage causing a decrease in resistance and a pulse voltage causing an increase in resistance is continuously performed. The horizontal axis of the graph indicates the number of electric pulses, and the vertical axis of the same indicates the resistance value.

As shown in FIG. 3A, the variable resistance element is initially in a high resistance state of approximately 33 k$\Omega$, application of a pulse voltage of +2.0V causes the variable resistance element to be in a low resistance of approximately 500$\Omega$, and then after application of a pulse voltage of −2.6V causes the variable resistance element to be in a high resistance state of approximately 40 k$\Omega$, a decrease in resistance by applying the positive pulse voltage to the upper electrode 3303 with reference to the lower electrode 3301 and an increase in resistance by applying the negative pulse voltage to the upper electrode 3303 with reference to the lower electrode 3301 are repeated.

The relationship between a direction of the resistance change and a polarity of an applied voltage mentioned above is called A mode for descriptive purposes.

As shown in FIG. 3B, another variable resistance element is initially in a high resistance state of approximately 42 k$\Omega$, application of a pulse voltage of −2.0V causes another variable resistance element to be in a low resistance state of approximately 600$\Omega$, and then after application of a pulse voltage of +2.7V causes another variable resistance element to be in a high resistance state of approximately 40 k$\Omega$, a decrease in resistance by applying the negative pulse voltage to the upper electrode 3303 with reference to the lower electrode 3301 and an increase in resistance by applying the positive pulse voltage to upper electrode 3303 with reference to the lower electrode 3301 are repeated.

The relationship between a direction of the resistance change and a polarity of an applied voltage mentioned above is called B mode for descriptive purposes. The hysteretic current-voltage characteristics shown in FIG. 2 correspond to the B mode.

It is to be noted that the above pulse voltage value denotes a set output voltage value of a pulse generator, and that an effective voltage value applied to both end terminals of a variable resistance element is considered to be a voltage value smaller than the pulse voltage value due to a voltage drop across a measurement system.

In the element A from which such a result is obtained, the upper electrode 3303 and the lower electrode 3301 contain Pt, and the variable resistance layer 3302 which contains the oxygen-deficient Ta oxide and is located between the upper and lower electrodes has a top and bottom symmetry relationship with the electrodes electrically.

Accordingly, it is not always self-evident as to which of the A mode and the B mode appears as resistance change characteristics, and it is determined based on an empirical rule or an experimental measurement result. It is expected that these phenomena are determined by some sort of an anisotropy factor which is unexplained in a resistance change mechanism.

In the case of the programming operation of the 1D1R cross point memory including the variable resistance element of a bipolar type, the memory cell selected for programming and the other non-selected memory cells are distinguished by a difference in voltage between both ends of the memory cells, which is different from the case of the 1T1R memory including a transistor, as disclosed by the PTL 2.

Furthermore, the low resistance value set for the variable resistance element is determined according to the amount of current flowing in a low resistance state and therefore, the bit line drive circuit is a drive circuit (hereinafter referred to as "LR drive circuit") which applies a voltage in the direction in which the resistance decreases, for example, a positive voltage to the bit lines with respect to the word lines so that an amount of current corresponding to a desired setting of the low resistance value flows. Because the increase in resistance is a roughly symmetric change in voltage and current in the voltage-current characteristics of the variable resistance elements as compared to the decrease in resistance, the word line drive circuit is a drive circuit (hereinafter referred to as "HR drive circuit") capable of applying a voltage in the direction opposite to the direction in which the resistance decreases, for example, a positive voltage to the word lines with respect to the bit lines, and moreover capable of allowing current of which amount is at least more than the amount of current for decreasing the resistance. Furthermore, it is conceivable that the non-selected memory cell includes a current steering element having such a threshold voltage Vth that no current flows even when the voltage having these values is applied.

However, when the relationship of a variable resistance element between a direction of the resistance change and a polarity of an applied voltage, i.e., the A mode or the B mode, is not always uniformly fixed, there would be the following problems.

The first problem is that, when, of the A mode and the B mode, the mode appeared is opposite to the mode expected, it is impossible to set a desired resistance value for the variable resistance element.

When the mode, i.e., A or B mode, appeared is opposite to the mode expected, the resistance-decreasing programming is performed by the HR drive circuit having a higher capability of driving current than required, which results in setting of a lower resistance value than expected. Moreover, the resistance-increasing programming is performed by the LR drive circuit having a lower capability of driving current than required. It is therefore necessary to increase resistance of the variable resistance element which is set at the resistance value lower than expected, but the amount of current may not be enough for that, which causes a problem that the resistance change operation is not stable.

In such a case, it is conceivable to achieve a stable resistance change operation by applying a higher voltage and thereby allowing current to flow to increase resistance. However, because a resistance value different from a desired resistance value is programmed, the read performance will not be uniform, which causes a problem that it is not possible to provide products with stable performance. Moreover, the need of a high voltage leads to a problem of impeding a decrease in the operation voltage and the second problem which will be described hereinbelow.

Another conceivable method is, with an assumption that both of the A mode and the B mode are possible to appear, providing each of the word line drive circuit and the bit line drive circuit with both of the LR drive circuit and the HR drive circuit and switching between these circuits according to which mode appears of the A mode and the B mode, but this causes a problem of complexity in the switching of setting according to the current state and a problem of inducing an increase in chip area.

The second problem is related to reliability of the memory cell, especially the current steering element. PTL 2 discloses that a predetermined current can be supplied when a diode such as a ZnO varistor or a $SrTiO_3$ varistor is used as the current steering element of the 1D1R cross point memory. The inventors of the present application advance research on the use of later-described SiN materials as the current steering element comprising a material more compatible with a semiconductor process.

Generally, a diode element has non-linear current-voltage characteristics in which a current drastically increases with a predetermined threshold voltage Vth or higher. The controllability of setting of this threshold voltage Vth and how large amount of current can flow at a voltage equal to or higher than the threshold voltage Vth are important for higher integration and lower voltage operation. However, an increase in current density leads to performance degradation of the diode due to a thermal factor, and it is therefore important in terms of reliability to provide a configuration in which no more current than necessary will flow.

In the case where the mode, i.e., A or B mode, is opposite to the mode expected, it is possible to increase resistance by applying a higher voltage and thereby allowing a larger amount of current to flow, as described about the first problem, but there is a problem that this may deteriorate diode characteristics.

The third problem is that the programming speed decreases. The first and second problems are solved by providing a current limit circuit that limits the current flowing in a direction for changing the memory cells to the low resistance state, and performing the resistance-decreasing programming via the current limit circuit. However, in the case of performing the resistance-decreasing programming via the current limit circuit, the current in the programming is limited, which causes another problem of a decrease in the programming speed.

The present invention has been devised in view of the above circumstances, and an object of the present invention is to provide a variable resistance nonvolatile memory device including 1D1R cross point memories each using a variable resistance element, with a control technique of setting a desired resistance value of the variable resistance element to stably change resistance, by making it possible to control a mode of resistance change characteristics of the variable resistance element between an A mode and a B mode and determining relation of connection between drive circuits and memory cells, which variable resistance nonvolatile memory device is capable of increasing reliability of a current steering element and reducing a decrease in the programming speed.

In order to achieve the above object, a variable resistance nonvolatile memory device according to an aspect of the present invention includes: a plurality of memory cells in each of which a variable resistance element and a current steering element having two terminals are connected in series, the variable resistance element changing, by application of a first voltage having a predetermined first polarity, to a low resistance state with a resistance value in a first range, and changing, by application of a second voltage having a second polarity opposite to the first polarity, to a high resistance state with a resistance value in a second range higher than the first range; a plurality of first signal lines and a plurality of second signal lines crossing the first signal lines; a memory cell array in which the memory cells are arranged at cross-points of the first signal lines and the second signal lines and each of the memory cells has ends connected to a set of one of the first signal lines and one of the second signal lines which crosses the first signal line; a programming circuit which generates a bipolar voltage to be applied to the memory cells through the first signal lines and the second signal lines; a current limit circuit placed in a path of a current flowing from the programming circuit to the memory cells, the current limit circuit limiting only a first current among the first current and a second current, the first current flowing in a direction for changing the memory cells to the low resistance state, and the second current flowing in a direction for changing the memory cells to the high resistance state; and a boost circuit that is connected in parallel to the current limit circuit and increases, when one of the memory cells changes to the low resistance state, the first current by short-circuiting the path of the current and a voltage supply during a first period before the memory cell changes to the low resistance state.

With this structure, where the plurality of the first signal lines and the plurality of the second signal lines correspond to a plurality of bit lines and a plurality of word lines, respectively, each of the memory cells can be configured such that the variable resistance element changes to the low resistance state by application of a positive voltage to the bit line with respect to the word line while the variable resistance element changes to the high resistance state by application of a positive voltage to the word line with respect to the bit line.

Thus, when the direction of current for changing the plurality of memory cells to the low resistance state is fixed, and the current limit circuit limits the current flowing in the fixed direction so that an amount of current provided for the change to the low resistance state is smaller than an amount of current provided for the change to the high resistance state, it is possible to prevent more current than expected from flowing to the memory cells.

The current limit by the current limit circuit for the memory cell which is changing to the low resistance state only needs to have been performed at the time when the variable resistance element starts to change to the low resistance state. Thus, the combination use of the boost circuit that increases a current between a start of the programming to the low resistance state and a change of the variable resistance element to the low resistance state after the current for the programming to the low resistance state is limited by the current limit circuit enables an increase in the programming speed which decreases when the programming is performed using only the current limit circuit.

As a result, the variable resistance elements can have desired resistance values with small variation and moreover, it is possible to prevent the current steering elements from degraded reliability and breakage and to reduce a decrease in the programming speed.

Furthermore, it may be possible that the boost circuit includes: an output terminal connected to the path of the current; and a switch connected between the voltage supply and the output terminal, wherein the switch is in on-state during the first period.

Furthermore, it may be possible that the switch is a transistor, a source terminal of the transistor is connected to the voltage supply, a drain terminal of the transistor is connected to the output terminal, and the transistor is in on-state during the first period.

With this structure, the source of the transistor included in the boost circuit is connected to the voltage supply, so that the boost circuit can have higher capability of driving current.

Furthermore, it may be possible that the switch is turned off before the memory cell changes to the low resistance state.

With this structure, the current to be supplied to the memory cell can be limited after the memory cell changes to the low resistance state.

Furthermore, it may be possible that the boost circuit turns off the switch, using a feedback signal of a voltage of the output terminal, when the voltage of the output terminal reaches a predetermined voltage after the switch is turned on.

With this structure, the boost circuit can be automatically turned off before the memory cell changes to the low resistance state.

Furthermore, it may be possible that each of the memory cells changes to the low resistance state when the first voltage having the first polarity such that the first signal line has a higher voltage than the second signal line is applied to the memory cell through the first signal line and the second signal line connected to the memory cell, and each of the memory cells changes to the high resistance state when the second voltage having the second polarity opposite to the first polarity is applied to the memory cell through the first signal line and the second signal line connected to the memory cell, the programming circuit to includes: a first drive circuit which generates a first drive voltage equal to or higher than the first voltage; a second drive circuit which generates a second drive voltage equal to or higher than the second voltage; a third drive circuit which generates a voltage serving as a basis for the first drive voltage; and a fourth drive circuit which generates a voltage serving as a basis for the second drive voltage, the variable resistance nonvolatile memory device further includes: a first selection circuit which connects the first drive circuit and the fourth drive circuit to a selected one of the first signal lines; and a second selection circuit which connects the second drive circuit and the third drive circuit to a selected one of the second signal lines, and the current limit circuit and the boost circuit are placed between the first drive circuit and the first selection circuit.

With this structure, all the memory cells can share one current limit circuit and one boost circuit, which can reduce an increase in circuit area.

Furthermore, it may be possible that each of the memory cells changes to the low resistance state when the first voltage having the first polarity such that the first signal line has a higher voltage than the second signal line is applied to the memory cell through the first signal line and the second signal line connected to the memory cell, and each of the memory cells changes to the high resistance state when the second voltage having the second polarity opposite to the first polarity is applied to the memory cell through the first signal line and the second signal line connected to the memory cell, the programming circuit includes: a first drive circuit which generates a first drive voltage equal to or higher than the first voltage; a second drive circuit which generates a second drive voltage equal to or higher than the second voltage; a third drive circuit which generates a voltage serving as a basis for the first drive voltage; and a fourth drive circuit which generates a voltage serving as a basis for the second drive voltage, the variable resistance nonvolatile memory device further includes: a first selection circuit which connects the first drive circuit and the fourth drive circuit to a selected one of the first signal lines; and a second selection circuit which connects the third drive circuit and the second drive circuit to a selected one of the second signal lines, the current limit circuit includes a plurality of limit circuits, and each of the current limit circuits is placed between the first selection circuit and a corresponding one of the first signal lines, and the boost circuit includes a plurality of boost circuit units, and each of the boost circuit units is placed between the first selection circuit and a corresponding one of the first signal lines.

With this structure, the current limit and the boost can be controlled at positions close to the memory cells. As a result, upon resistance-decreasing programming, the load for charging and discharging via the current limit circuit and the boost circuit can be smaller, which allows the current limit and the boost to be performed according to any change.

Furthermore, it may be possible that each of the memory cells changes to the low resistance state when the first voltage having the first polarity such that the first signal line has a higher voltage than the second signal line is applied to the memory cell through the first signal line and the second signal line connected to the memory cell, and each of the memory cells changes to the high resistance state when the second voltage having the second polarity opposite to the first polarity is applied to the memory cell through the first signal line and the second signal line connected to the memory cell, the programming circuit includes: a first drive circuit which generates a first drive voltage equal to or higher than the first voltage; a second drive circuit which generates a second drive voltage equal to or higher than the second voltage; a third drive circuit which generates a voltage serving as a basis for the first drive voltage; and a fourth drive circuit which generates a voltage serving as a basis for the second drive voltage, the variable resistance nonvolatile memory device further includes: a first selection circuit which connects the first drive circuit and the fourth drive circuit to a selected one of the first signal lines; and a second selection circuit which connects the third drive circuit and the second drive circuit to a selected one of the second signal lines, and the current limit circuit and the boost circuit are placed between the third drive circuit and the second selection circuit.

With this structure, all the memory cells can share one current limit circuit and one boost circuit, which can reduce an increase in circuit area.

Furthermore, it may be possible that each of the memory cells changes to the low resistance state when the first voltage having the first polarity such that the first signal line has a higher voltage than the second signal line is applied to the memory cell through the first signal line and the second signal line connected to the memory cell, and each of the memory cells changes to the high resistance state when the second voltage having the second polarity opposite to the first polarity is applied to the memory cell through the first signal line and the second signal line connected to the memory cell, the programming circuit includes: a first drive circuit which generates a first drive voltage equal to or higher than the first voltage; a second drive circuit which generates a second drive voltage equal to or higher than the second voltage; a third drive circuit which generates a voltage serving as a basis for the first drive voltage; and a fourth drive circuit which generates a voltage serving as a basis for the second drive voltage, the variable resistance nonvolatile memory device further includes: a first selection circuit which connects the first drive circuit and the fourth drive circuit to a selected one of the first signal lines; and a second selection circuit which connects the third drive circuit and the second drive circuit to a selected one of the second signal lines, and the current limit circuit includes a plurality of limit circuits, and each of the current limit circuits is placed between the second selection circuit and a corresponding one of the second signal lines, and the boost circuit includes a plurality of boost circuit units, and each of the boost circuit units is placed between the second selection circuit and a corresponding one of the second signal lines.

With this structure, the current limit and the boost can be controlled at positions close to the memory cells. As a result, upon resistance-decreasing programming, the load for charging and discharging via the current limit circuit and the boost circuit can be smaller, which allows the current limit and the boost to be performed according to any change.

Furthermore, it may be possible that the current limit circuit comprises an N-type MOS transistor, and the boost circuit comprises a P-type MOS transistor connected in parallel to the N-type MOS transistor.

Furthermore, it may be possible that the current limit circuit comprises an N-type MOS transistor, and when the variable resistance element is set to have a resistance value which is, among resistance values in the first range, larger than a third resistance value that is set when a third voltage is applied to the memory cell, and smaller than a fourth resistance value that is set when a fourth voltage smaller than the third voltage is applied to the memory cell, a gate voltage of the N-type MOS transistor is set to be (i) larger than a value obtained by adding an absolute value of a threshold voltage of the N-type MOS transistor to the fourth voltage, (ii) smaller than a value obtained by adding the absolute value of the threshold voltage of the N-type MOS transistor to the third voltage, and (iii) equal to or lower than the first drive voltage.

Furthermore, it may be possible that the current limit circuit comprises an N-type MOS transistor, and when the variable resistance element is set to have a resistance value which is, among resistance values in the first range, larger than a third resistance value that is set when a third voltage is applied to the memory cell, and smaller than a fourth resistance value that is set when a fourth voltage smaller than the third voltage is applied to the memory cell, a gate voltage of the N-type MOS transistor is set to be (i) larger than a value obtained by subtracting the third voltage from the first drive voltage and adding up an absolute value of a threshold voltage of the N-type MOS transistor, and (ii) smaller than a value obtained by subtracting the fourth voltage from the first drive voltage and adding up the absolute value of the threshold voltage of the N-type MOS transistor.

Furthermore, it may be possible that each of the current limit circuit in the current limit circuit comprises an N-type MOS transistor, each of the boost circuit units in the boost circuit comprises a P-type MOS transistor connected in parallel to the N-type MOS transistor, and the current limit circuit and the boost circuit are used as the first selection circuit when a selection signal is provided to a gate of the N-type MOS transistor and a gate of the P-type MOS transistor.

With this structure, it is possible to provide the current limit circuit and the boost circuit with a small number of elements, which allows for a reduction in area.

Furthermore, it may be possible that the current limit circuit comprises a P-type MOS transistor, and the boost circuit comprises an N-type MOS transistor connected in parallel to the P-type MOS transistor.

Furthermore, it may be possible that the current limit circuit comprises a P-type MOS transistor, and when the variable resistance element is set to have a resistance value which is, among resistance values in the first range, larger than a third resistance value that is set when a third voltage is applied to the memory cell, and smaller than a fourth resistance value that is set when a fourth voltage smaller than the third voltage is applied to the memory cell, a gate voltage of the P-type MOS transistor is set to be (i) larger than a value obtained by subtracting an absolute value of a threshold voltage of the P-type MOS transistor from the fourth voltage, and (ii) smaller than a value obtained by subtracting the absolute value of the threshold voltage of the P-type MOS transistor from the third voltage.

Furthermore, it may be possible that the current limit circuit comprises a P-type MOS transistor, and when the variable resistance element is set to have a resistance value which is, among resistance values in the first range, larger than a third resistance value that is set when a third voltage is applied to the memory cell, and smaller than a fourth resistance value that is set when a fourth voltage smaller than the third voltage is applied to the memory cell, a gate voltage of the P-type MOS transistor is set to be (i) larger than a value obtained by subtracting the third voltage and an absolute value of a threshold voltage of the P-type MOS transistor from the first drive voltage, (ii) smaller than a value obtained by subtracting the fourth voltage and the threshold voltage of the P-type MOS transistor from the first drive voltage, and (iii) equal to or higher than a reference voltage of the first drive voltage.

Furthermore, it may be possible that each of the current limit circuit in the current limit circuit comprises a P-type MOS transistor, each of the boost circuit units in the boost circuit comprises an N-type MOS transistor connected in parallel to the P-type MOS transistor, and the current limit circuit and the boost circuit are used as the second selection circuit when a selection signal is provided to a gate of the P-type MOS transistor and a gate of the N-type MOS transistor.

With this structure, it is possible to provide the current limit circuit and the boost circuit with a small number of elements, which allows for a reduction in area.

Furthermore, it may be possible that the third resistance value is a minimum resistance value in the first range, and a current flowing to the memory cell when the variable resistance element is set at the third resistance value is equal to or less than a maximum current that the current steering element is resistant to breakage.

This method enables stable programming without breaking the current steering element.

Furthermore, it may be possible that the fourth resistance value is a maximum resistance value in the first range and is a maximum resistance value that the low resistance state and the high resistance state can be distinguished using a read circuit.

This method enables a stable read operation.

The present invention can be implemented not only as such a variable resistance nonvolatile memory device but also as a programming method for a variable resistance nonvolatile memory device, which method includes steps of the characteristic means included in the variable resistance nonvolatile memory device.

In the variable resistance nonvolatile memory device according to an aspect of the present invention, each of the memory cells includes a variable resistance element configured so as to increase in resistance by application of a positive voltage to the second electrode with respect to the first electrode and to decrease in resistance by application of a positive voltage to the first electrode with respect to the second electrode, and the low resistance (LR) drive circuit is connected on the side of the first electrode via the current limit circuit while the high resistance (HR) drive circuit is connected on the size of the second electrode.

Typically, in the case of increasing the resistance of the variable resistance element, more drive current is needed, as compared to the case of decreasing the resistance of the variable resistance element, for generating as much voltage as necessary to cause a resistance change in the variable resistance element which has a low resistance.

Accordingly, the resistance of the variable resistance element is increased by flowing current from the HR drive circuit connected on the side of the second electrode of the variable resistance element while the resistance of the variable resistance element is decreased by flowing current from the LR drive circuit connected on the side of the first electrode of the variable resistance element via the current limit circuit and controlling the current limit circuit, with result that that the supply of a smaller amount of current than an amount of current supplied for the change to the high resistance state makes it possible to prevent more current than expected from flowing to the memory cells, so that the variable resistance elements can have desired resistance values with small variation. Moreover, the prevention of current more than expected from flowing to the memory cells leads to the prevention of the current steering elements from degraded reliability and breakage.

Furthermore, the combination use of the boost circuit with the current limit circuit from a start of the resistance-decreasing programming to a change of the variable resistance element to the low resistance state enables efficient charging of the first signal line or the second signal line in advance and thereby enables an increase in the programming speed which decreases when the programming is performed using only the current limit circuit.

In addition, the resistance change phenomenon is an interaction between the variable resistance layer and the electrode material, which means that not only which variable resistance material is used but also which particular electrode material is combined is important. For example, in the case of using, as an electrode, a material whose standard electrode potential is higher than the standard electrode potential of the metal included in the variable resistance layer (such as the case of using platinum (Pt) or iridium (Ir) as an electrode material), it is desirable that the material is used for only one of the first electrode and the second electrode and the other thereof is made of a material whose standard electrode potential is lower than the standard electrode potential of the one of the first electrode material and the second electrode material (for example, tungsten (W), tantalum nitride (TaN), or the like is used for the other of the first electrode and the second electrode). In such a case, it is possible to cause a resistance change near the interface between the variable resistance layer and the electrode whose standard electrode potential is higher, out of the interfaces between the first electrode and the variable resistance layer and between the second electrode layer and the variable resistance layer, with the result that the relation of connection between the electrode and the drive circuit can be determined reliably.

As above, the present invention can provide a variable resistance nonvolatile memory device including 1D1R cross point memories each using a variable resistance element, with a control technique of setting a desired resistance value of the variable resistance element to stably change resistance, by making it possible to control a mode of resistance change characteristics of the variable resistance element between an A mode and a B mode and determining relation of connection between drive circuits and memory cells, which variable resistance nonvolatile memory device is capable of increasing reliability of a current steering element and reducing a decrease in the programming speed.

BRIEF DESCRIPTION OF DRAWINGS

FIG. 8A is a diagram showing a relationship between a resistance value of the nonvolatile memory element and the number of applied electrical pulses as basic data of the present invention.

FIG. 8B is a diagram showing a relationship between a resistance value of the nonvolatile memory element and the number of applied electrical pulses as basic data of the present invention.

FIG. 10A is a diagram showing a relationship between a resistance value of the nonvolatile memory element and the number of applied electrical pulses as basic data of the present invention.

FIG. 10B is a diagram showing a relationship between a resistance value of the nonvolatile memory element and the number of applied electrical pulses as basic data of the present invention.

FIG. 19A is a diagram showing a relationship between a resistance value of the nonvolatile memory element and the number of applied electrical pulses as basic data of the present invention.

FIG. 19B is a diagram showing a relationship between a resistance value of the nonvolatile memory element and the number of applied electrical pulses as basic data of the present invention.

FIG. 19C is a diagram showing an example of a relationship between a to resistance value of the nonvolatile memory element and the number of applied electrical pulses as basic data of the present invention.

FIG. 19D is a diagram showing an example of a relationship between a resistance value of the nonvolatile memory element and the number of applied electrical pulses as basic data of the present invention.

FIG. 19E is a diagram showing an example of a relationship between a resistance value of the nonvolatile memory element and the number of applied electrical pulses as basic data of the present invention.

FIG. 19F is a diagram showing an example of a relationship between a resistance value of the nonvolatile memory element and the number of applied electrical pulses as basic data of the present invention.

FIG. 19G is a diagram showing an example of a relationship between a resistance value of the nonvolatile memory element and the number of applied electrical pulses as basic data of the present invention.

FIG. 32A is a cross-sectional diagram showing a development example of the memory cell according to a basic configuration in an embodiment of the present invention.

FIG. 32B is a cross-sectional diagram showing a development example of the memory cell according to a basic configuration in an embodiment of the present invention.

FIG. 32C is a cross-sectional diagram showing a development example of the memory cell according to a basic configuration in an embodiment of the present invention.

FIG. 32D is a cross-sectional diagram showing a development example of the memory cell according to a basic configuration in an embodiment of the present invention.

FIG. 34A is a cross-sectional diagram showing a development example of the memory cell according to a basic configuration in an embodiment of the present invention.

FIG. 34B is a cross-sectional diagram showing a development example of the memory cell according to a basic configuration in an embodiment of the present invention.

FIG. 34C is a cross-sectional diagram showing a development example of the memory cell according to a basic configuration in an embodiment of the present invention.

FIG. 38A is a cross-sectional diagram showing a development example of the memory cell according to a basic configuration in an embodiment of the present invention.

FIG. 38B is a cross-sectional diagram showing a development example of the memory cell according to a basic configuration in an embodiment of the present invention.

FIG. 38C is a cross-sectional diagram showing a development example of the memory cell according to a basic configuration in an embodiment of the present invention.

FIG. 38D is a cross-sectional diagram showing a development example of the memory cell according to a basic configuration in an embodiment of the present invention.

FIG. 40A is a cross-sectional diagram showing a development example of the memory cell according to a basic configuration in an embodiment of the present invention.

FIG. 40B is a cross-sectional diagram showing a development example of the memory cell according to a basic configuration in an embodiment of the present invention.

FIG. 40C is a cross-sectional diagram showing a development example of the memory cell according to a basic configuration in an embodiment of the present invention.

FIG. 43A shows operations of a programming circuit according to a comparative example of the present invention.

FIG. 43B shows operations of a programming circuit according to an embodiment of the present invention.

DETAILED DESCRIPTION OF INVENTION

Figure 1:
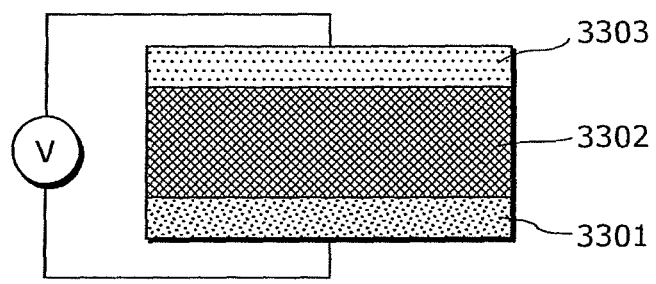
FIG. 1 schematically shows a basic structure of a nonvolatile memory element as basic data for the present invention.
Figure 2:
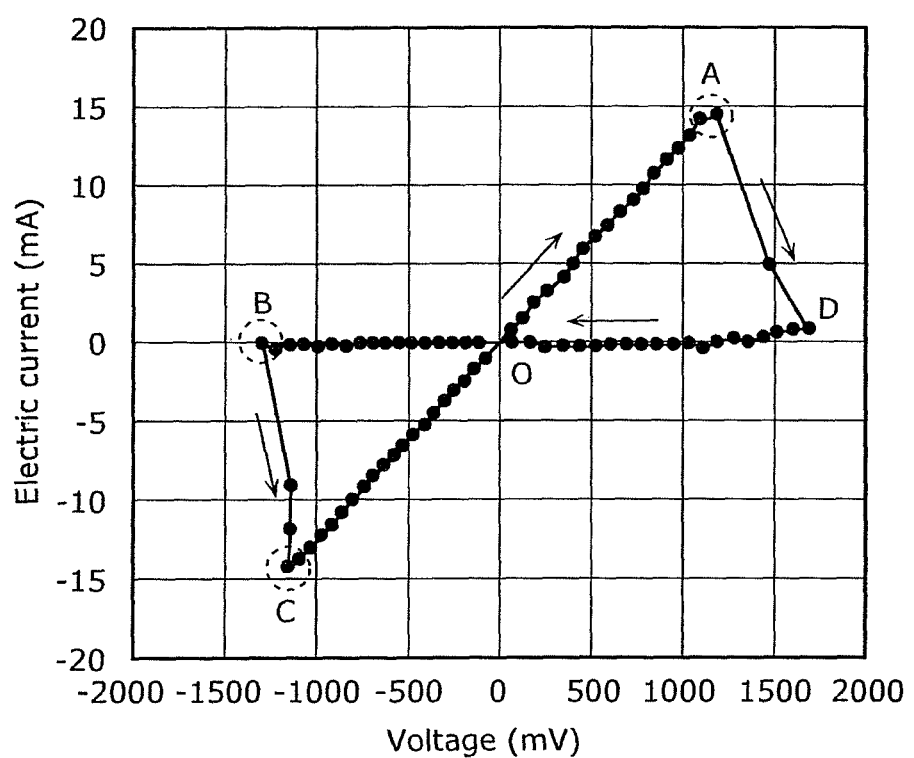
FIG. 2 is a diagram showing an example of hysteretic current-voltage characteristics in a resistance change of the nonvolatile memory element as basic data of the present invention.
Figure 3A:
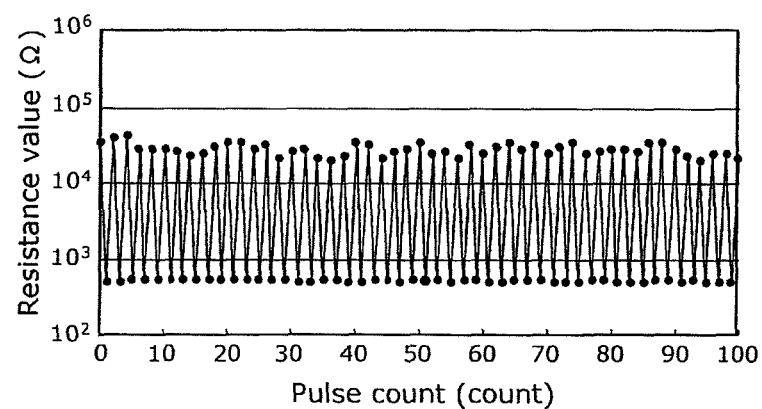
FIG. 3A is a diagram showing an example of a relationship between a resistance value of the nonvolatile memory element and the number of applied electrical pulses as basic data of the present invention.
Figure 3B:
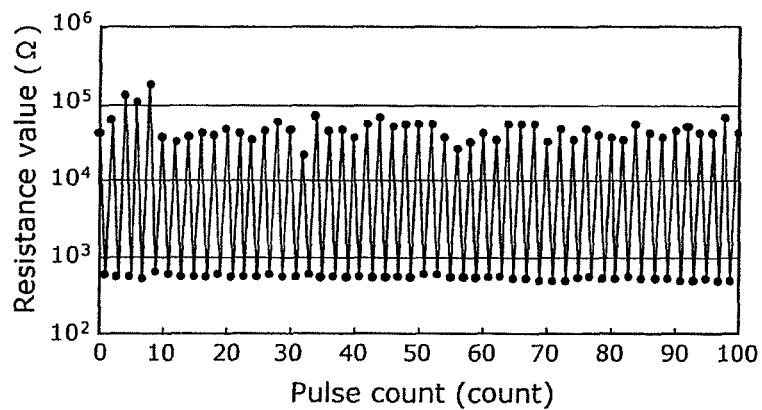
FIG. 3B is a diagram showing an example of a relationship between a resistance value of the nonvolatile memory element and the number of applied electrical pulses as basic data of the present invention.

The following describes in detail embodiments of the present invention with reference to the drawings.

A variable resistance nonvolatile memory device according to the embodiment of the present invention is a cross point nonvolatile memory device using a plurality of 1D1R memory cells each structured by connecting a variable resistance element and a current steering element in series, which device fixes a mode of resistance change characteristics of the variable resistance element and optimizes a structure of a drive circuit according to the fixed mode.

[Basic Data of the Present Invention]

The following describes, as preparation, basic data regarding two types of variable resistance materials for the variable resistance element of the variable resistance nonvolatile memory device according to an implementation of the present invention are described.

One of the variable resistance elements is structured by locating a variable resistance layer comprising an oxygen-deficient tantalum oxide ($TaO_x$ where $0<x<2.5$) between a first electrode and a second electrode that contain a different material, and the other one of the variable resistance elements is structured by locating a variable resistance layer comprising an oxygen-deficient hafnium oxide ($HfO_y$ where $0<y<2.0$) between a first electrode and a second electrode that contain a different material.

By using the first electrode and the second electrode which satisfy $V2-Vt>0$ and $V2-V1>0$ where Vt represents a standard electrode potential of a metal (i.e. Ta or Hf) included in the variable resistance layer, V1 represents a standard electrode potential of a material of the first electrode, and V2 represents a standard electrode potential of a material of the second electrode, it is possible to cause a resistance change in the variable resistance layer in the vicinity of the interface between the second electrode and the variable resistance layer, of the interfaces between the first electrode and the variable resistance layer and between the second electrode and the variable resistance layer. Such variable resistance elements have reversible and stable reprogramming characteristics. PTL 3: International Publication No. WO2009/050833 (hereinafter referred to simply as earlier related application) filed before by the Applicant of this application describes in detail that, in the case of a variable resistance layer comprising an oxygen-deficient tantalum oxide, a resistance change occurs in the variable resistance layer in the vicinity of the interface between the second electrode and the variable resistance layer when the above condition of the standard electrode potentials is satisfied. The concept described in the above earlier related application as to the condition of the standard electrode potentials can apply likewise to the case of a variable resistance layer comprising an oxygen-deficient hafnium oxide.

A feature that the resistance change characteristics held by the variable resistance elements can be fixed to either the aforementioned A mode or B mode is applied to the variable resistance nonvolatile memory device of the present invention. Hereinafter, parts of the earlier related patent application are cited for purposes of illustration.

It is to be noted that the phrase "variable resistance element" and the phrase "variable resistance nonvolatile memory element (or, briefly, nonvolatile memory element)" are used synonymously in the present description.

[Variable Resistance Element in which Oxygen-Deficient Tantalum (Ta) Oxide Is Used for Variable Resistance Layer]

First, the following describes the first experiment regarding a variable resistance element for which an oxygen-deficient Ta oxide is used and which performs a bipolar operation.

In this experiment, it is verified whether reversible and stable reprogramming characteristics are obtained by structuring the nonvolatile memory element for which the oxygen-deficient Ta oxide is used and which performs the bipolar operation, such that a resistance change easily occurs only in the vicinity of one of the upper electrode and the lower electrode.

For the verification, assuming that a tendency for the resistance change to occur varies depending on an electrode material type, a variable resistance element structured by locating an oxygen-deficient tantalum oxide between an upper electrode and a lower electrode that comprise a different material is formed, and resistance change characteristics are measured.

The following describes a result of this experiment.

It is to be noted that, before describing a result of the verification, a method for forming an oxygen-deficient tantalum oxide layer and a preferred range of an oxygen content atomic percentage are described.

Then, described is a result of forming a structure in which a $TaO_x$ layer is located between electrodes comprising platinum (Pt), tungsten (W), tantalum (Ta), or tantalum nitride (TaN) and of examining a situation of a resistance change phenomenon caused by an electrical pulse, in order to verify whether tendency for a resistance change to occur depends on the electrode materials.

Lastly, described is a measurement result of a resistance change of a variable resistance element structured by locating an oxygen-deficient Ta oxide between an influential electrode material and a non-influential electrode material.

[Relationship Between Oxygen Flow Ratio at Time of Sputtering and Oxygen Content Atomic Percentage of Ta Oxide Layer]

First, the following describes an analysis result of forming conditions and an oxygen content atomic percentage of an oxygen-deficient Ta oxide layer in this experiment.

The oxygen-deficient Ta oxide layer is formed by sputtering a Ta target in argon (Ar) gas and $O_2$ (oxygen) gas atmosphere, that is, reactive sputtering. A specific method of forming the oxygen-deficient Ta oxide in this experiment is as follows.

A substrate is initially placed in a sputtering apparatus, and inside the sputtering apparatus is vacuumed to almost $7 \times 10^{-4}$ Pa.

Sputtering is performed with Ta used as a target, power set to 250 W, a total gas pressure of the Ar gas and the oxygen gas set to 3.3 Pa, and a preset temperature of the substrate set to 30° C. Here, the flow ratio of the $O_2$ gas to the Ar gas is changed from 0.8% to 6.7%.

First, because of the purpose of examining a composition, Si on which 200 nm of $SiO_2$ is deposited is used as the substrate, and a sputtering time period is adjusted so that a film thickness of the Ta oxide layer is approximately 100 nm at a thickness of the Ta oxide layer becomes around 100 nm.

Figure 4:
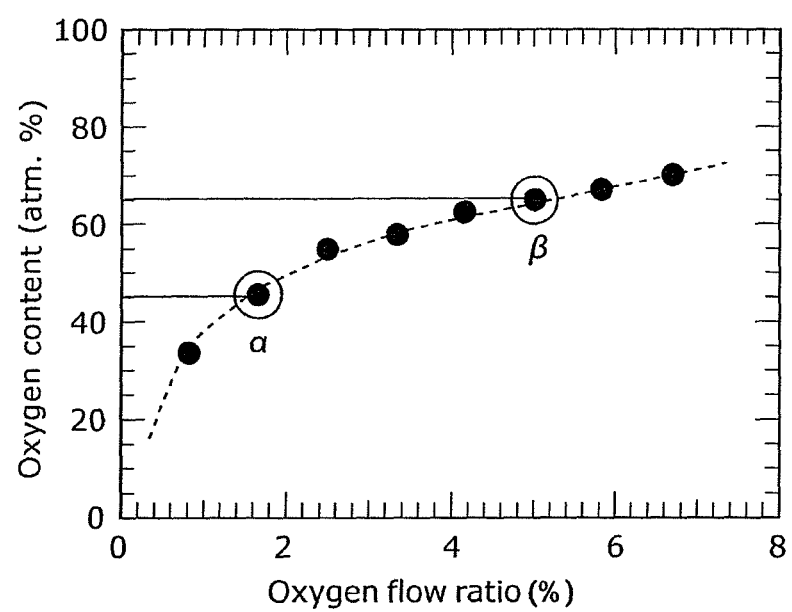
FIG. 4 is a diagram showing an analysis result of a composition of a Ta oxide layer of the nonvolatile memory element as basic data of the present invention.

FIG. 4 shows a result of analyzing, with the Rutherford Backscattering Spectrometry (RBS) and the Auger Electron Spectroscopy (AES), the composition of the Ta oxide layer formed in the above manner.

The figure shows that an oxygen content atomic percentage of the Ta oxide layer is changed from approximately 35 at. % ($TaO_{0.66}$) to approximately 70 at. % ($TaO_{2.3}$) when the oxygen flow ratio is changed from 0.8% to 6.7%.

Based on the above result, the following has been clarified: it is possible to control the oxygen content atomic percentage of the Ta oxide layer with the oxygen flow ratio; and the oxygen-deficient Ta oxide, in which oxygen is more deficient than oxygen content atomic percentage 71.4 at. % of $Ta_2O_5$ ($TaO_{2.5}$) that is a stoichiometric oxide of Ta, is formed.

It is to be noted that although the Rutherford Backscattering Spectrometry (RBS) and the Auger Electron Spectroscopy (AES) are employed in analyzing the Ta oxide layer in this experiment, it is also possible to employ an apparatus analytical method such as the X-ray Photoelectron Spectroscopy (XPS) and the Electron Probe Microanalysis (EPMA).

[Composition and Resistance Change Characteristics of Oxygen-Deficient Ta Oxide Layer]

It is examined which oxygen-deficient Ta oxide having how much oxygen content atomic percentage among the oxygen-deficient tantalum oxide formed in the above manner shows a resistance change. Here, Pt is used as an electrode material for both an upper electrode and a lower electrode between which an oxygen-deficient tantalum oxide layer is located.

Using Pt for both of the upper electrode and the lower electrode is inappropriate for a bipolar variable resistance nonvolatile element from the aspect of stable operation because there are cases where a resistance change occurs in the interface between the upper electrode and the variable resistance layer and where a resistance change occurs in the interface between the lower electrode and the variable resistance layer as stated above. However, as will be described, Pt is an electrode material which easily shows a resistance change, and is the most suitable material for determining whether or not an oxygen-deficient Ta oxide having a certain oxygen content atomic percentage shows the resistance change.

Figure 5:
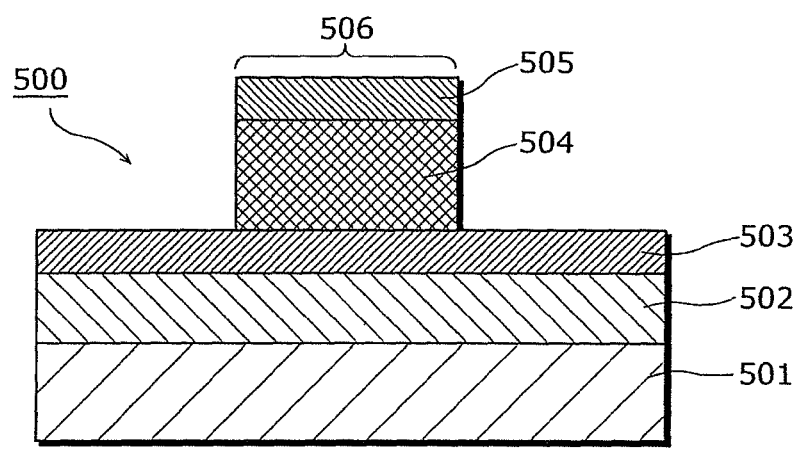
FIG. 5 is a cross-sectional diagram showing a structure of the nonvolatile memory element as basic data for the present invention.

For all of these reasons, a nonvolatile memory element 500 as shown in FIG. 5 is formed.

In other words, an oxide layer 502 having a thickness of 200 nm is formed on a single-crystal silicon substrate 501 with a thermal oxidation method, and a Pt thin film having a thickness of 100 nm is formed as a lower electrode 503 on the oxide layer 502 with a sputtering method.

Then, an oxygen-deficient Ta oxide layer 504 is formed with reactive sputtering, with Ta used as a target. In the range examined in this experiment, the nonvolatile memory element is formed by changing an oxygen gas flow ratio from 0.8% to 6.7% in the same manner as the above analysis sample. A film thickness of the oxygen-deficient Ta oxide layer 504 is 30 nm.

Then, a Pt thin film having a thickness of 150 nm is deposited as an upper electrode 505 on the oxygen-deficient Ta oxide layer 504 with the sputtering method.

Lastly, an element region 506 is formed by a photolithography process and a dry-etching process. It is to be noted that the element region 506 has a circular pattern having a diameter of 3 μm.

A resistance change phenomenon of the nonvolatile memory element formed in the above manner is measured. As a result, it is satisfactory that a high resistance value is more than five times as large as a low resistance value in the nonvolatile memory element for which a Ta oxide film represented by from point α (an oxygen flow ratio of approximately 1.7% and an oxygen content atomic percentage of approximately 45 at. %) to point β (an oxygen flow ratio of approximately 5% and an oxygen content atomic percentage of approximately 65 at. %) shown in FIG. 4 is used.

Figure 6A:
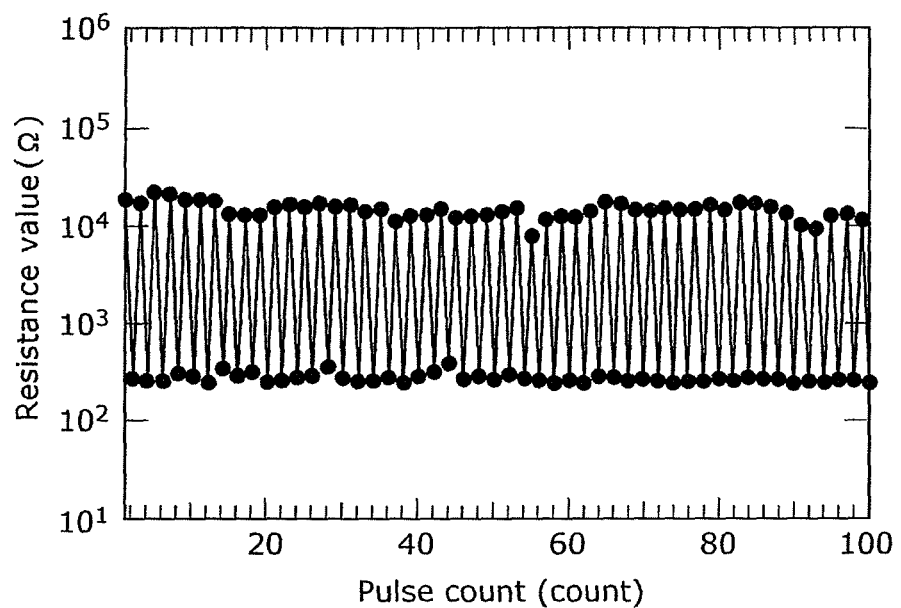
FIG. 6A is a diagram showing a relationship between a resistance value of the nonvolatile memory element and the number of applied electrical pulses as basic data of the present invention.
Figure 6B:
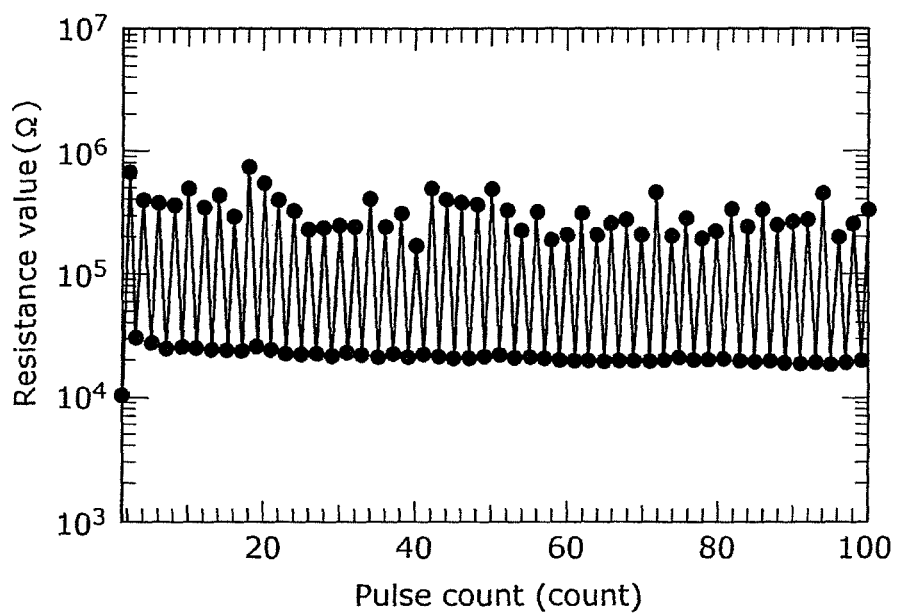
FIG. 6B is a diagram showing a relationship between a resistance value of the nonvolatile memory element and the number of applied electrical pulses as basic data of the present invention.

FIGS. 6A and 6B each show a result of measuring the resistance change characteristics of the nonvolatile memory element for which the Ta oxide layer having the oxygen content atomic percentage represented by either the point α or the point β is used with reference to the number of applied pulses.

FIGS. 6A and 6B each show that it is satisfactory that the high resistance value is more than five times as large as the low resistance value in the element for which the Ta oxide layer having the oxygen content atomic percentage represented by either the point α or the point β is used.

Thus, it can be said that a composition range in which the oxygen content atomic percentage is 45 at. % to 65 at. %, that is, a range of x, $0.8 \leq x \leq 1.9$, when the variable resistance layer is shown as $TaO_x$, is a more appropriate range of the variable resistance layer (the oxygen content atomic percentage=45 at. % and the oxygen content atomic percentage=65 at. % correspond to x=0.8 and x=1.9, respectively).

This optimum condition is described in detail in PTL4: International Publication No. WO2008/059701.

[Resistance Change Characteristics of Variable Resistance Element in Which W, Ta or TaN is Used as Material of Upper Electrode and Lower Electrode]

Next, the following describes a result of forming a structure in which the oxygen-deficient Ta oxide layer 504 is located between the lower electrode 503 and the upper electrode 505 that contain Pt, W, Ta or TaN as a material other than Pt and of examining a situation of a resistance change caused by an electrical pulse, in order to verify whether the tendency for the resistance change to occur depends on the electrode material.

It is to be noted that since an experiment is also performed to evaluate the tendency for the resistance change to occur, the material of the upper and lower electrodes is the same. In addition, an oxygen content atomic percentage of a used oxygen-deficient Ta oxide is 58 at. % ($TaO_{1.38}$) that is almost in the middle of the preferred range of the oxygen content atomic percentage. A method for forming an element is almost same as the method described above, and Pt, W, Ta or TaN is deposited by the sputtering method.

First, for comparison, the following describes resistance change characteristics of a nonvolatile memory element (hereinafter, referred to as element B) including the lower electrode 503 and the upper electrode 505 each of which is a thin film comprising Pt.

Figure 7A:
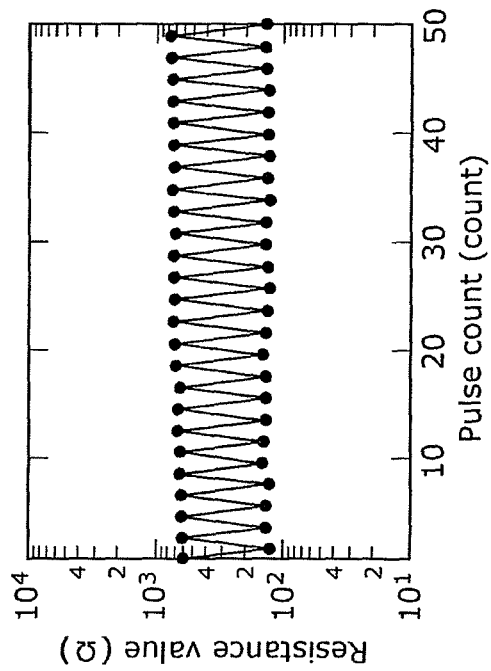
FIG. 7A is a diagram showing a relationship between a resistance value of the nonvolatile memory element and the number of applied electrical pulses as basic data of the present invention.
Figure 7B:
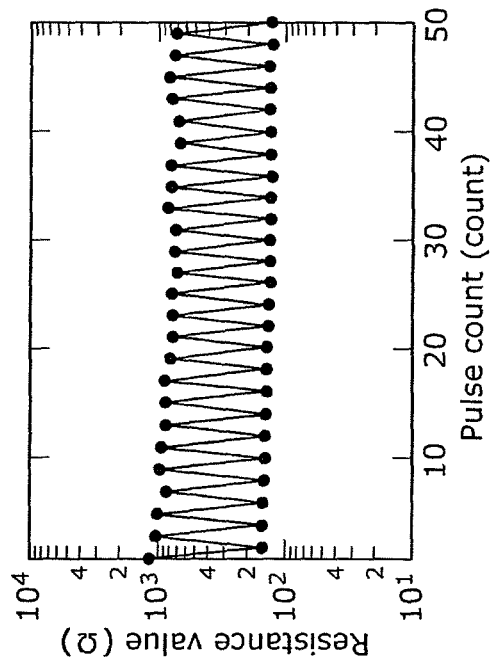
FIG. 7B is a diagram showing a relationship between a resistance value of the nonvolatile memory element and the number of applied electrical pulses as basic data of the present invention.

FIGS. 7A and 7B each show a measurement result of a resistance change caused by an electrical pulse in the element B formed in the above manner.

FIG. 7A shows a measurement result of resistance when an electrical pulse having a voltage of +3.0 V and an electrical pulse having a voltage of −1.5 V are alternately applied to the upper electrode 505 with reference to the lower electrode 503, the electrical pulses each having a pulse width of 100 ns.

In this case, a resistance value becomes approximately 800Ω to 1000Ω by the application of the electrical pulse having the voltage of +3.0 V, and when the electrical pulse having the voltage of −1.5 V is applied, the resistance value is changed to approximately 150Ω. To put it differently, when an electrical pulse having a higher voltage than a voltage at the lower electrode 503 is applied to the upper electrode 505, characteristics of the B mode with an increase in resistance were observed.

Furthermore, though details are omitted, a result of presuming that the resistance change occurs in the vicinity of the upper electrode 505 is obtained from an additional experiment.

Next, FIG. 7B shows a result of a case where a negative voltage is increased by changing a balance of a voltage to be applied. In this case, an electrical pulse having a voltage of −3.0 V and an electrical pulse having a voltage of +1.5 V are applied to the upper electrode 505 with reference to the lower electrode 503. When the electrical pulse of −3.0V is applied, an increase in resistance occurs and a resistance value is approximately 600Ω to 800Ω, and when the electrical pulse of −1.5 V is applied, a decrease in resistance occurs and the resistance value is approximately 150Ω. Stated differently, the decrease in resistance occurs when the electrical pulse having the higher voltage than the voltage at the lower electrode 503 is applied to the upper electrode 505, which exhibits characteristics of the A mode opposite to the characteristics at the time of measurement shown in FIG. 7A.

Moreover, though details are omitted, a result of presuming that the resistance change occurs in the vicinity of the lower electrode 503 is obtained from an additional experiment.

Next, the following describes resistance change characteristics of a nonvolatile memory element (hereinafter, referred to as element C) including the lower electrode 503 and the upper electrode 505 each of which is a thin film comprising W.

FIGS. 8A and 8B show a measurement result of a resistance change caused by an electrical pulse in the element C formed in the above manner.

FIG. 8A shows a change in a resistance value when +7 V and −5 V are alternately applied to the upper electrode 505 with reference to the lower electrode 503 in order to cause the B mode that attributes to a resistance change in the vicinity of the upper electrode 505 (upper electrode mode).

As shown in FIG. 8A, the resistance change, though weak, is observed in the B mode until when the number of pulses is approximately 30, an increase in resistance occurs when an electrical pulse of +7 V is applied, and a decrease in resistance occurs when an electrical pulse of −5 V is applied. However, when the number of pulses exceeds 30, the resistance change is hardly observed.

FIG. 8B shows a change in a resistance value when +5 V and −7 V are alternately applied to the upper electrode 505 in order to cause the A mode that attributes to a resistance change in the vicinity of the lower electrode 503 (lower electrode mode).

As shown in FIG. 8B, the change in the resistance value is hardly observed in this case, and the resistance value is constant at approximately 30Ω.

Here, when comparing the result of the element B whose upper and lower electrodes contain Pt in FIG. 7A and the result shown in FIG. 8A, it is clear that the resistance change clearly does not occur easily when W is used for the electrodes.

Whereas an approximately sevenfold change between the resistance value of the low resistance state, 150Ω, and the resistance value of the high resistance state, approximately 1000Ω, is shown in FIG. 7A showing the measurement result of the element B, mere occurrence of the resistance change from 50Ω to 100Ω at most even within a range of a large resistance change, that is, an approximately twofold change is shown in FIG. 8A showing the measurement result of the element C in which W is used as the electrode material.

While the applied voltages are respectively +3.0 V and −1.5 V at the time of measurement shown in FIG. 7A, the resistance change is hardly observed even though very high voltages, +7 V and −5 V, are applied in FIG. 8A.

As stated above, it is clear that the resistance change does not occur easily when W is used for the electrodes in comparison with the case where Pt is used for the electrodes.

The above results denote that the operation of the variable resistance element in which the oxygen-deficient Ta oxide is used for the variable resistance layer very strongly depends on the electrode material to be used. In other words, at least it is clear that the resistance change occurs easily when Pt is used for the electrode and that the resistance change does not occur easily when W is used for the electrode.

Moreover, though details are omitted, a variable resistance element in which Ta or TaN is used for an upper electrode and a lower electrode is formed, and the resistance change characteristics thereof are measured.

Figure 9A:
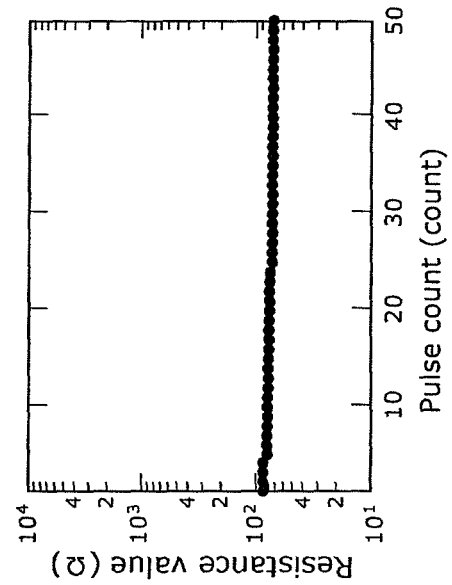
FIG. 9A is a diagram showing a relationship between a resistance value of the nonvolatile memory element and the number of applied electrical pulses as basic data of the present invention.
Figure 9B:
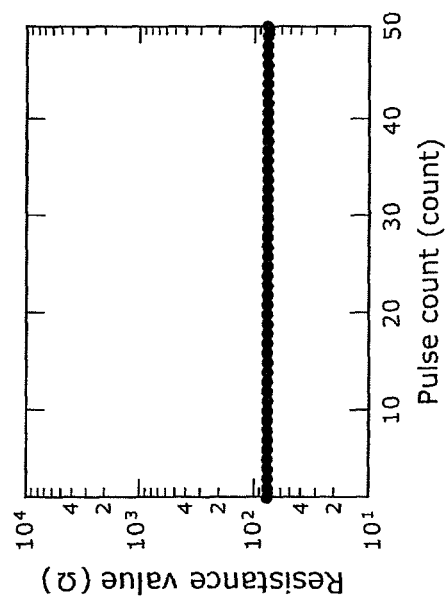
FIG. 9B is a diagram showing a relationship between a resistance value of the nonvolatile memory element and the number of applied electrical pulses as basic data of the present invention.

FIGS. 9A and 9B each show resistance change characteristics of an element D in which Ta is used for both the lower electrode 503 and the upper electrode 505.

FIG. 9A shows a measurement result when an electrical pulse of +7 V and an electrical pulse of −5 V are applied to the upper electrode 505, and FIG. 9B shows a measurement result when an electrical pulse of +5 V and an electrical pulse of −7 V are applied to the upper electrode 505. In either case, the resistance change hardly occurs.

In addition, FIG. 10A shows resistance change characteristics of an element E in which TaN is used for both the lower electrode 503 and the upper electrode 505. FIG. 10A shows a measurement result when an electrical pulse of +7 V and an electrical pulse of −5 V are applied to the upper electrode 505, and FIG. 10B shows a measurement result when an electrical pulse of +5 V and an electrical pulse of −7 V are applied to the upper electrode 505. In this case also, it may be said that the resistance change occurs to an extent that the change hardly occurs.

As stated above, there are materials that are not prone to cause a resistance change, other than W.

[Resistance Change Characteristics of Variable Resistance Element in Which W and Pt are Used for Electrode]

Next, the following describes resistance change characteristics of an element F that is a variable resistance element in which an oxygen-deficient Ta oxide is located between Pt and W, Pt being a material that is prone to cause a resistance change and W being a material that is not prone to cause the resistance change and has process stability.

The prepared element is formed by using a W thin film as the lower electrode 503 and a Pt thin film as the upper electrode 505. The W thin film and the Pt thin film each are deposited by sputtering a W target and a Pt target in an Ar gas.

Figure 11A:
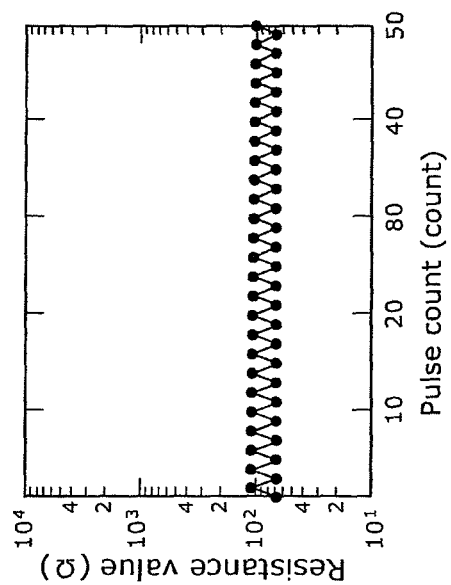
FIG. 11A is a diagram showing a relationship between a resistance value of the nonvolatile memory element and the number of applied electrical pulses as basic data of the present invention.
Figure 11B:
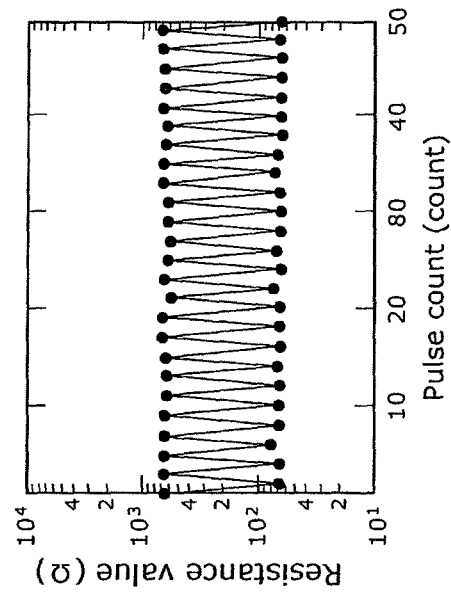
FIG. 11B is a diagram showing a relationship between a resistance value of the nonvolatile memory element and the number of applied electrical pulses as basic data of the present invention.

FIGS. 11A and 11B each show a situation of a resistance change of the element F formed in the above manner, which is caused by an electrical pulse.

FIG. 11A shows a change in a resistance value when +2.5 V and −1.5 V are alternately applied to the upper electrode 505 with reference to the lower electrode 503 in order to cause a resistance change in the vicinity of the upper electrode 505 (B mode). In this case, the resistance value is approximately 600Ω when the electric pulse of +2.5 V is applied, and stably changes to 60Ω when the electric pulse of −1.5 V is applied.

On the other hand, FIG. 11B shows a change in a resistance value when +1.5 V and −2.5 V are alternately applied to the upper electrode 505 with reference to the lower electrode 503 in order to cause a resistance change in the vicinity of the lower electrode 503 (A mode). In this case, the resistance change only occurs between 60Ω and 100Ω, and the occurring resistance change is negligible compared with the resistance change that occurs when the voltage for causing the resistance change in the B mode is applied.

The above results in FIGS. 11A and 11B show that the element F shows ideal operations of a variable resistance nonvolatile memory element which performs a bipolar operation that causes a resistance change only in the vicinity of one of the electrodes.

In addition, a phenomenon in which the A mode and the B mode are kind of blended is not observed.

Figure 12:
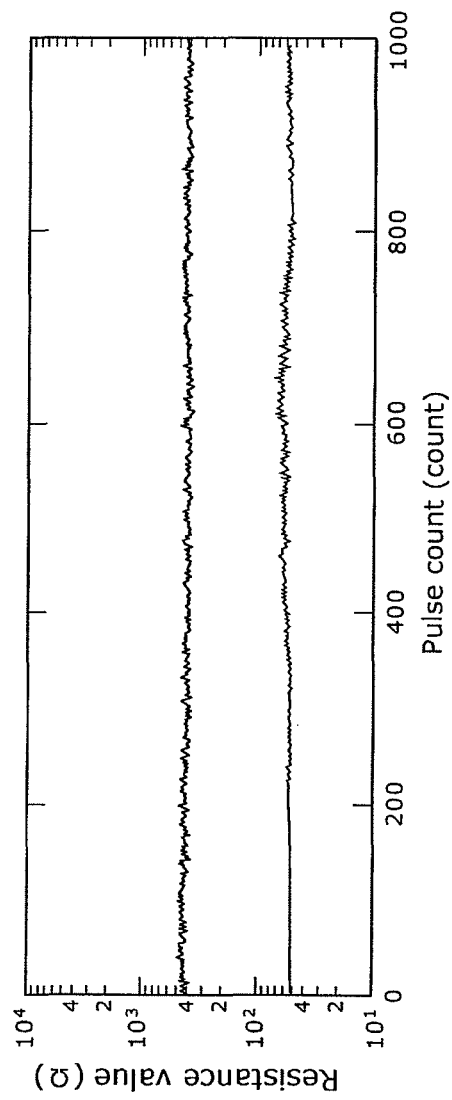
FIG. 12 is a diagram showing a relationship between a resistance value of the nonvolatile memory element and the number of applied electrical pulses as basic data of the present invention.

For instance, although FIG. 12 shows a result of applying an electrical pulse for approximately 1000 times to an element different from (but formed on the same substrate as) the element F from which the measurement results of FIGS. 11A and 11B are obtained, it is seen that the resistance change phenomenon occurs very stably.

Based on the above, it has become clear that the variable resistance nonvolatile memory element operates stably because the resistance change can be caused in the intended one of the electrodes by forming the structure of the variable resistance nonvolatile memory element in which the variable resistance layer is located between the electrode that is prone to cause the resistance change phenomenon and the electrode that is not prone to cause the same, and that the variable resistance nonvolatile memory element indicating a desirable bipolar operation can be formed.

In addition, a relationship between an applied voltage and a resistance value shows an operation in which the resistance value increases when an electrical pulse having a positive voltage is applied to The electrode that is prone to cause the resistance change and the resistance value decreases when an electrical pulse having a negative voltage is applied to the electrode.

[Resistance Change Characteristics of Variable Resistance Element According to Material Type of Upper Electrode and Lower Electrode]

Next, the following shows a result of the second experiment in which elements each having a different electrode material are evaluated for a tendency for a resistance change to occur.

The following describes, as the results of this experiment, situations of the resistance changes of the elements in each of which the lower electrode 503 is fixed to W and the upper electrode 505 contains a different material other than Pt. Here, reasons why the lower electrode 503 is fixed to W are that W is a relatively stable material and that W can be relatively easily processed.

It is to be noted that a method of forming the element is same as the method described in the first experiment, and the lower electrode 503 and the upper electrode 505 are all formed by the sputtering method. In addition, an oxygen-deficient Ta oxide, i.e., a variable resistance material, is formed by sputtering a Ta metal in $O_2$ and Ar.

Composition of the oxygen-deficient Ta oxide is set identical in order to examine resistance change characteristics according to a difference between electrodes. In other words, an oxygen content atomic percentage of the oxygen-deficient Ta oxide is fixed to approximately 58 at. % (when expressed as $TaO_x$, x is 1.38).

Furthermore, because the lower electrode 503 contains W, a non-influential material, in this experiment, a result of the A mode (the mode in which the increase in resistance occurs when the high voltage is applied to the lower electrode with reference to the upper electrode) in which a change in a resistance value hardly, occurs is omitted from a description, and only a result of the B mode (the mode in which the increase in resistance occurs when the high voltage is applied to the upper electrode with reference to the lower electrode) is shown. Although there is a slight difference depending on elements in a voltage of an electrical pulse when the resistance change is caused in the B mode, a voltage when the increase in resistance is caused ranges from +1.8 V to +2.0 V, and a voltage when the decrease in resistance is caused ranges from –1.3 V to –1.6 V, with the lower electrode being a reference of the voltage.

FIGS. 13A to 13H are summaries of the measurement results.

Figure 13:
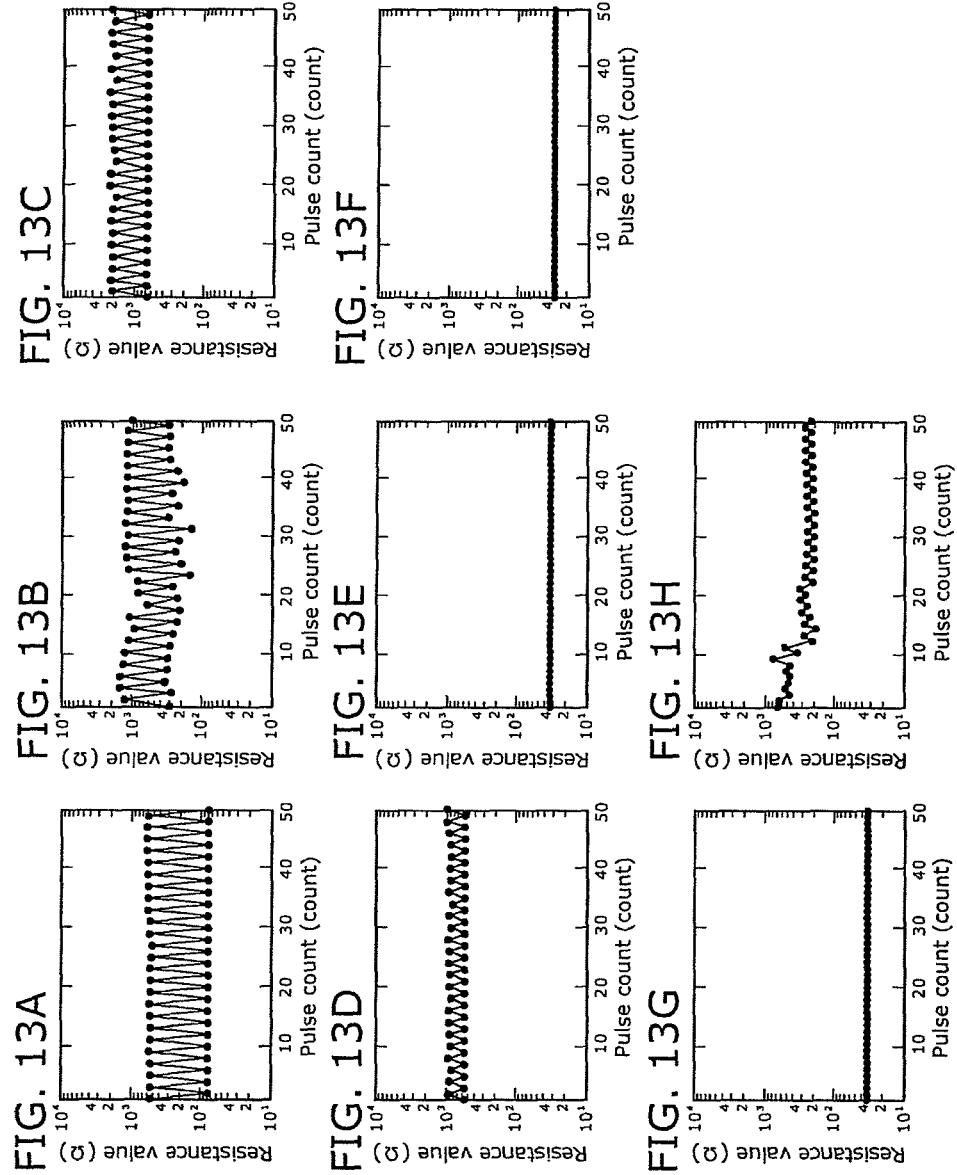
FIG. 13A is a diagram showing a relationship between a resistance value of the nonvolatile memory element and the number of applied electrical pulses as basic data of the present invention.
FIG. 13B is a diagram showing a relationship between a resistance value of the nonvolatile memory element and the number of applied electrical pulses as basic data of the present invention.
FIG. 13C is a diagram showing a relationship between a resistance value of the nonvolatile memory element and the number of applied electrical pulses as basic data of the present invention.
FIG. 13D is a diagram showing a relationship between a resistance value of the nonvolatile memory element and the number of applied electrical pulses as basic data of the present invention.
FIG. 13E is a diagram showing a relationship between a resistance value of the nonvolatile memory element and the number of applied electrical pulses as basic data of the present invention.
FIG. 13F is a diagram showing a relationship between a resistance value of the nonvolatile memory element and the number of applied electrical pulses as basic data of the present invention.
FIG. 13G is a diagram showing a relationship between a resistance value of the nonvolatile memory element and the number of applied electrical pulses as basic data of the present invention.
FIG. 13H is a diagram showing a relationship between a resistance value of the nonvolatile memory element and the number of applied electrical pulses as basic data of the present invention.

First, by looking at results of an element G of FIG. 13A in which Ir is used for an upper electrode, an element H of FIG. 13B in which Ag is used for an upper electrode, and an element I of FIG. 13C in which Cu is used for an upper electrode, it is clear that the resistance change occurs in a relatively stable and large varying degree. Next, although a slight resistance change is observed in an element J of FIG. 13D in which Ni is used for an upper electrode and an element N of FIG. 13H in which TaN is used for an upper electrode, a variation range of the resistance change is small.

Next, no resistance change phenomenon is observed in an element K of FIG. 13E in which Ta is used for an upper electrode, an element L of FIG. 13F in which Ti is used for an upper electrode, and an element M of FIG. 13G in which Al is used for an upper electrode. It is considered that these materials are not inherently prone to cause the resistance change.

As can be seen from the above results, for the nonvolatile memory element for which the oxygen-deficient Ta oxide is used, there are materials that are prone to cause the resistance change phenomenon (influential materials) and materials that are not prone to cause the resistance change phenomenon (non-influential materials). In the range of this experiment, the influential electrode materials are Pt, Ir, Ag, and Cu, and the non-influential electrode materials are W, Ni, Ta, Ti, Al, and TaN.

When a variable resistance element having a structure in which an oxygen-deficient Ta oxide is sandwiched by a combination of these materials is formed, a stable resistance change can be achieved without blending the resistance change modes. However, when FIG. 7A, FIG. 11B, and FIGS. 13D and 13H are referred to, the resistance change, though weak, is observed in the electrode comprising W, Ni or TaN. Accordingly, when any of these materials is used for one of electrodes and when, for example, Ta, Ti or Al, the electrode material with which no resistance change is observed in this experiment, is used for the other electrode, the stable yet weak resistance change can be expected.

The following describes some examinations of a mechanism in which a resistance change itself occurs and a material dependency of a tendency for the resistance change to occur.

Figure 14:
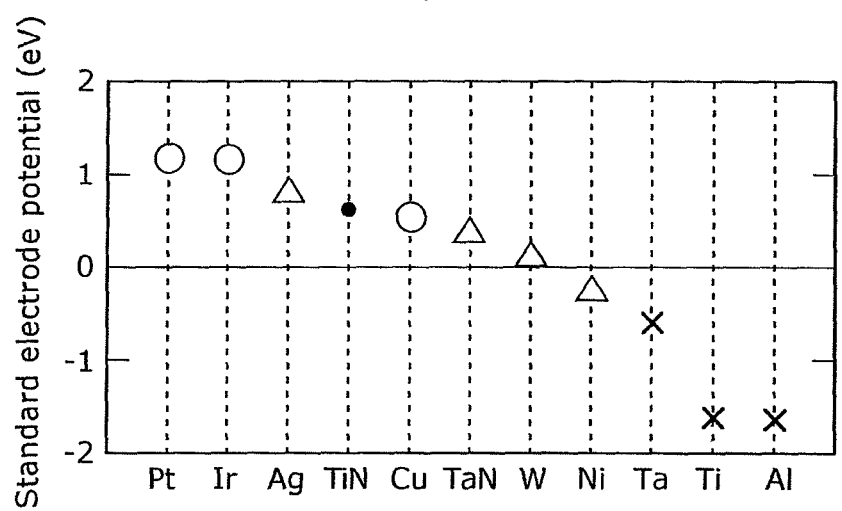
FIG. 14 is a diagram showing a relationship between an electrode material of the nonvolatile memory element and a standard electrode potential as basic data of the present invention.

FIG. 14 is a summary of the results of the first and second experiments. The horizontal axis indicates electrode materials, and the vertical axis indicates a standard electrode potential. In FIG. 14, a circle mark denotes that the resistance change occurred easily, a triangle mark denotes that the resistance change occurred though a rate of the change was small, and a cross mark denotes that the resistance change did not occur. It is to be noted that titanium nitride (TiN) is an electrode material not used in the first and second experiments, and is represented by a dot for reference.

In FIG. 14, the standard electrode potentials of the electrode materials other than TaN and TiN are the literature values disclosed by NPTL 1: "CRC HANDBOOK of CHEMISTRY and PHYSICS, DAVID R. LIDE Editor-in-chief, $84^{th}$ Edition 2003-2004, CRC PRESS", and standard electrode potentials of TaN and TiN are data measured by the inventors.

The inventors have measured standard electrode potentials of some electrode materials including TaN and TiN with a 3-electrode system potentiostat including Solartron Electrochemical Measurement System SI1280B. A measurement condition is that an electrode material to be measured is used for an action pole, a Pt electrode is used for an antipole, an Ag/AgCl electrode is used for a reference pole, and 1 wt % KCl 7 ml is used under $N_2$ bubbling for an electrolyte solution.

After a potential at a potential equilibrium point with reference to the electrode material of the Ag/AgCl electrode is measured by searching for the potential equilibrium point between the action pole and the antipole under such a condition, a value obtained by adding +0.196 V to the measured potential is set to a potential (that is, standard electrode potential) with reference to an electrode material of a standard hydrogen electrode.

According to FIG. 14, it is clear that the resistance change occurs with the material having the standard electrode potential higher than that of Ta, an constituent element of the variable resistance layer, and the resistance change does not occur easily with the material having the standard electrode potential lower than that of Ta. In addition, it is clear that the resistance change occurs more easily as a difference between the standard electrode potentials becomes greater, and the resistance change does not occur more easily as the difference becomes smaller.

Generally, the standard electrode potential is one of indices for susceptibility to oxidation, and denotes that the larger a value of the index is, the less susceptible to oxidation, and the smaller a value of the index is, the more susceptible to oxidation. Based on the above, it is speculated that the susceptibility to oxidation plays a large role in the mechanism of the resistance change phenomenon.

The mechanism of the resistance change is considered based on the above results. First, the following describes a case where an upper electrode contains a material (material having a large standard electrode potential and not susceptible to oxidation) that is prone to cause the resistance change, using FIGS. 15A and 15B.

Figure 15B:
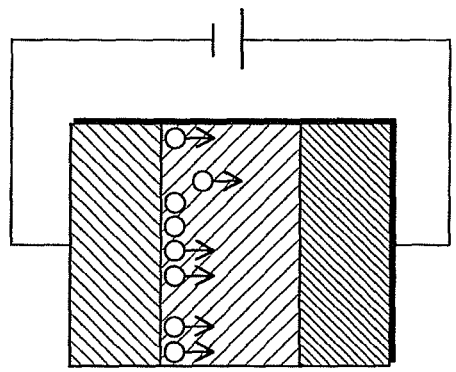
FIG. 15B is a cross-sectional schematic diagram for describing operations of the nonvolatile memory element as basic data of the present invention.
Figure 15A:
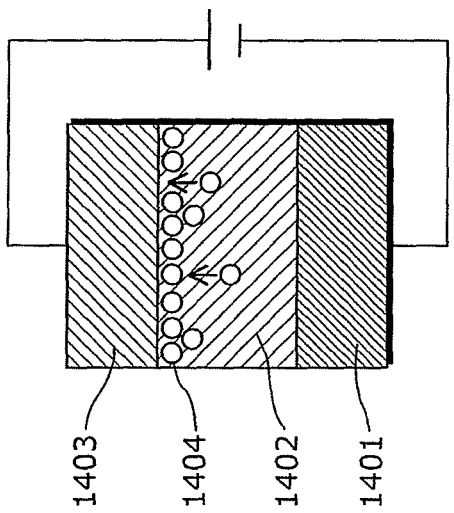
FIG. 15A is a cross-sectional schematic diagram for describing operations of the nonvolatile memory element as basic data of the present invention.

As shown in FIG. 15A, in a variable resistance element including a lower electrode 1401, an oxygen-deficient Ta oxide layer 1402, and an upper electrode 1403 comprising a material less susceptible to oxidation than Ta, when a high voltage is applied to the upper electrode 1403 with reference to the lower electrode 1401, oxygen atoms in the oxygen-deficient Ta oxide become ions, and the ions are moved by an electric field to gather in the vicinity of an interface of the upper electrode 1403.

However, since a metal comprised in the upper electrode 1403 is not susceptible to oxidation in comparison with Ta, oxygen ions 1404 are accumulated in an interface between the oxygen-deficient Ta oxide layer 1402 and the upper electrode 1403, and are combined with Ta near the interface to form an oxygen-deficient Ta oxide having a high oxygen concentration. This increases a resistance of the element.

Next, as shown in FIG. 15B, when a high voltage is applied to the lower electrode 1401, oxygen atoms become oxygen ions again, and return to the inside of the oxygen-deficient tantalum oxide layer 1402. With this, it is considered that the decrease in resistance has occurred.

Figure 16A:
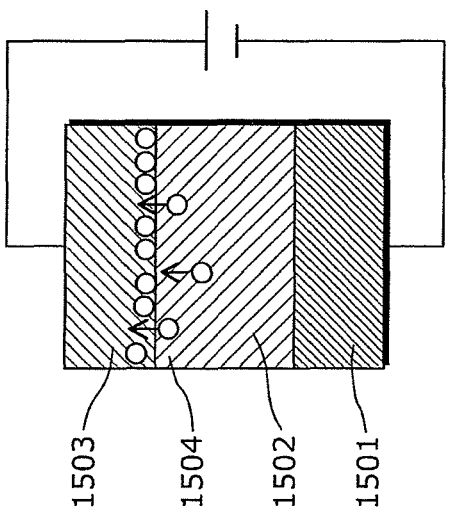
FIG. 16A is a cross-sectional schematic diagram for describing operations of the nonvolatile memory element as basic data of the present invention.

Figures describing a case where an upper electrode contains a material more susceptible to oxidation than Ta are FIGS. 16A and 16G.

As shown in FIG. 16A, in a variable resistance element including a lower electrode 1501, an oxygen-deficient Ta oxide layer 1502, and an upper electrode 1503 comprising a material more susceptible to oxidation than Ta, when the high voltage is applied to the upper electrode 1503 with reference to the lower electrode 1501, oxygen atoms in the oxygen-deficient Ta oxide become ions, and the ions are moved by an electric field to gather in the vicinity of an interface of the upper electrode 1503.

In this case, since the upper electrode 1503 is more susceptible to oxidation, oxygen ions 1504 are absorbed into the inside of the upper electrode 1503 to be bonded with the material comprised in the upper electrode 1503. In this case, unlike FIG. 15A, a high resistance layer is not formed in the interface between the oxygen-deficient Ta oxide layer 1502 and the upper electrode 1503, and further a resistance value hardly increases since the number of oxygen ions is fewer with reference to the number of elements comprised in the upper electrode 1503.

Figure 16B:
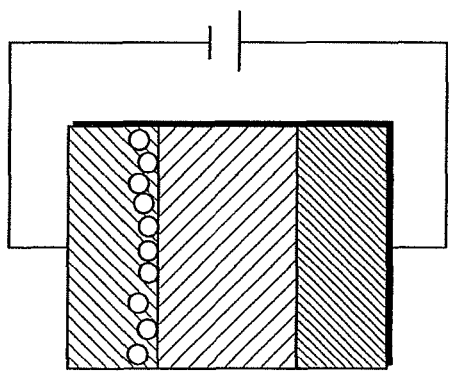
FIG. 16B is a cross-sectional schematic diagram for describing operations of the nonvolatile memory element as basic data of the present invention.

Conversely, as shown in FIG. 16B, when the high voltage is applied to the lower electrode 1501, since the oxygen absorbed by the upper electrode 1503 are stably bonded with the upper electrode material, it is considered that the oxygen atoms do not easily return into the oxygen-deficient Ta oxide layer 1502, and a resistance value does not change significantly.

When the material comprised in the upper electrode is approximately as susceptible to oxidation as Ta in FIGS. 15A, 15B, 16A, and 16B, it is considered that a change intermediate between the two above examples occurs, and a weak resistance change occurs.

As can be seen from the above results, in the nonvolatile memory element in which the oxygen-deficient Ta oxide is used for the variable resistance layer, the materials having the different standard electrode potentials may be respectively used for the upper electrode and the lower electrode.

With this, the resistance change dominantly occurs in the vicinity of one of the electrodes, which enables an ideal bipolar resistance change to be realized. Further, the resistance change modes are not blended, which enables a stable resistance change operation.

More preferably, a material having a standard electrode potential higher than that of Ta and a large difference between the standard electrode potentials may be used for one of electrodes, and a material having a standard electrode potential higher than that of Ta and a small difference between the standard electrode potentials may be used for the other electrode.

Still more preferably, a material having a standard electrode potential higher than that of Ta may be used for one of the electrodes, and a material having a standard electrode potential lower than that of Ta may be used for the other electrode.

It is to be noted that, though not being described as the result of the second experiment, a good experimental result indicating that a stable resistance change phenomenon has occurred is obtained regarding a variable resistance element in which TaN and Pt are respectively used for a lower electrode and an upper electrode.

The standard electrode potential of TaN is +0.48 eV according to the measurement of the inventors, and the standard electrode potentials of Pt and Ta are +1.18 eV and −0.6 eV, respectively, according to NPTL 1.

This example is an example where Pt, a material having a standard electrode potential higher than that of Ta and a large difference between the standard electrode potentials, is used for the upper electrode, and TaN, a material having a standard electrode potential higher than that of Ta and a small difference between the standard electrode potentials, is used for the lower electrode.

In other words, it is considered that an advantageous effect described as the results of the second experiment is obtained in this example by using, as electrode materials, TaN and Pt that satisfy a condition concerning the above standard electrode potentials.

As for another example, TiN and Pt may be used for a lower electrode and an upper electrode, respectively. The standard electrode potential of TiN is +0.55 eV according to the above measurement of the inventors. Thus, since a combination of TiN and Pt satisfies a condition concerning a standard electrode potential when a tantalum oxide is used for a variable resistance layer, the advantageous effect described as the results of the second experiment can be expected by using TiN and Pt as the electrode materials.

As for still another example, gold (Au) or palladium (Pd) may be used as the electrode material. The standard electrode potentials of Au and Pd are +1.692 eV and +0.951 eV, respectively, according to NPTL 1, and are higher than that of Ta which is −0.6 eV. Thus, when the tantalum oxide is used for the variable resistance layer, the advantageous effect described as the results of the second experiment can be expected by using one of Au and Pd as the electrode material that is prone to cause the resistance change and a material (for instance, W having a standard electrode potential of +0.1 eV) having a standard electrode potential lower than that of the other one of Au and Pd as the electrode material that is not prone to cause the resistance change.

It is to be noted that, though not being described as the result of this experiment, gold (Au) has a standard electrode potential of +1.692 eV, which is higher than −0.6 eV that is the standard electrode potential of Ta. The advantageous effect described as the results of this experiment can be expected even when Au is used as the electrode material that is prone to cause the resistance change in the case where Ta is used as the variable resistance film.

In addition, as can be seen from the above mechanism, shown is the operation in which the resistance value increases when the electrical pulse having the positive voltage is applied to the electrode that is prone to cause the resistance change and the resistance value decreases when the electrical pulse having the negative voltage is applied.

[Variable Resistance Element in which Oxygen-Deficient Hafnium (Hf) Oxide is Used for Variable Resistance Layer]

Next, the following describes, as other similar example, the third experiment regarding a nonvolatile memory element in which an oxygen-deficient hafnium (Hf) oxide is used for a variable resistance layer and which performs a bipolar operation.

In the same manner as the description of the first experiment, first, a method of forming an oxygen-deficient Hf oxide layer and a preferred range of an oxygen content atomic percentage are described.

Then, described is a result of forming a structure in which an $HfO_x$ layer is sandwiched by electrodes comprising Al, Ti, Ta, W, Cu or Pt and of examining a situation of a resistance change phenomenon caused by an electrical pulse, in order to verify whether or not a tendency for a resistance change to occur depends on electrode materials. Lastly, described is a measurement result of a resistance change of a variable resistance element structured by locating an oxygen-deficient Hf oxide between an influential electrode material and a non-influential electrode material.

[Relationship Between Oxygen Flow Ratio at Time of Sputtering and Oxygen Content Atomic Percentage of Hf Oxide Layer]

First, the following describes an analysis result of forming conditions and an oxygen content atomic percentage of an oxygen-deficient Hf oxide layer in this experiment.

The oxygen-deficient Hf oxide layer is formed by sputtering an Hf target in argon (Ar) gas and $O_2$ gas atmosphere, that is, reactive sputtering. A specific method of forming the oxygen-deficient Hf oxide in this experiment is as follows.

A substrate is initially placed in a sputtering apparatus, and inside the sputtering apparatus is vacuumed to almost $3\times10^{-5}$ Pa. Sputtering is performed with Hf used as a target, power set to 300 W, a total gas pressure of the argon gas and the oxygen gas set to 0.9 Pa, and a preset temperature of the substrate set to 30° C. Here, the flow ratio of the $O_2$ gas to the Ar gas is changed from 2% to 4.2%.

First, because of the purpose of examining a composition, Si on which 200 nm of $SiO_2$ is deposited is used as the substrate, and a sputtering time period is adjusted so that a film thickness of the Hf oxide layer is approximately 50 nm.

Figure 17:
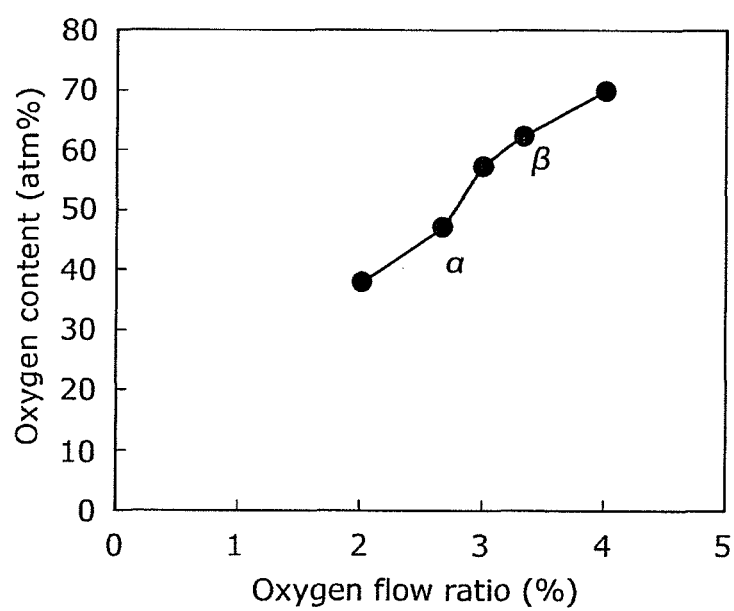
FIG. 17 is a diagram showing an analysis result of a composition of a Hf oxide layer of the nonvolatile memory element as basic data of the present invention.

FIG. 17 shows a result of analyzing, with the Rutherford Backscattering Spectrometry (RBS), the composition of the Hf oxide layer formed in the above manner.

The figure shows that an oxygen content atomic percentage of the Hf oxide layer is changed from approximately 37.7 at. % ($HfO_{0.6}$) to approximately 69.4 at. % ($HfO_{2.3}$) when an oxygen flow ratio is changed from 2% to 4.2%.

Based on the above result, the following has been clarified: it is possible to control the oxygen content atomic percentage of the Hf oxide layer with the oxygen flow ratio; and from the oxygen-deficient Hf oxide layer, in which oxygen is more deficient than oxygen content atomic percentage 66.7 at. % of $HfO_2$ that is a stoichiometric oxide of Hf, to even a Hf oxide layer considered to include excessive oxygen are formed.

It is to be noted that although the Rutherford Backscattering Spectrometry (RBS) is employed in analyzing the Hf oxide layer in this experiment, it is also possible to employ an apparatus analytical method such as the Auger Electron Spectroscopy (AES), the X-ray Photoelectron Spectroscopy (XPS), and the Electron Probe Microanalysis (EPMA).

[Resistance Change Characteristics of Oxygen-Deficient Hf Oxide Layer]

It is examined which oxygen-deficient Hf oxide layer having how much oxygen content atomic percentage among the oxygen-deficient Hf oxide layers formed in the above manner shows a resistance change. Here, Pt is used as an electrode material for both an upper electrode and a lower electrode between which an oxygen-deficient Hf oxide layer is located.

Using Pt is for the upper electrode and the lower electrode, as stated above, is inappropriate for a bipolar variable resistance nonvolatile element. However, as will be described, Pt is an electrode material which easily shows a resistance change, and is the most suitable material for determining whether or not an oxygen-deficient Hf oxide layer having a certain oxygen content atomic percentage shows the resistance change.

For all of these reasons, the nonvolatile memory element as shown in FIG. 5 is formed.

In other words, the oxide layer 502 having the thickness of 200 nm is formed on the single-crystal silicon substrate 501 with the thermal oxidation method, and the Pt thin film having the thickness of 100 nm is formed as the lower electrode 503 on the oxide layer 502 with the sputtering method.

Then, an oxygen-deficient Hf oxide layer 504 is formed with reactive sputtering, with Hf used as a target. In the range examined in this experiment, the nonvolatile memory element is formed by changing an oxygen gas flow ratio from 2% to 4.2% in the same manner as the above analysis sample. A film thickness of the oxygen-deficient Hf oxide layer 504 is 30 nm.

Then, a Pt thin film having a thickness of 150 nm is deposited as the upper electrode 505 on the oxygen-deficient Hf oxide layer 504 with the sputtering method.

Lastly, the element region 506 is formed by a photolithography process and a dry-etching process. It is to be noted that the element region 506 has a circular pattern having a diameter of 3 μm.

A resistance change phenomenon of the nonvolatile memory element formed in the above manner is measured. As a result, it is satisfactory that a high resistance value is more than four times as large as a low resistance value in the nonvolatile memory element for which a Hf oxide film represented by from point α (an oxygen flow ratio of approximately 2.7% and an oxygen content atomic percentage of approximately 46.6 at. %) to point β (an oxygen flow ratio of approximately 3.3% and an oxygen content atomic percentage of approximately 62 at. %) shown in FIG. 17 is used.

Figure 18A:
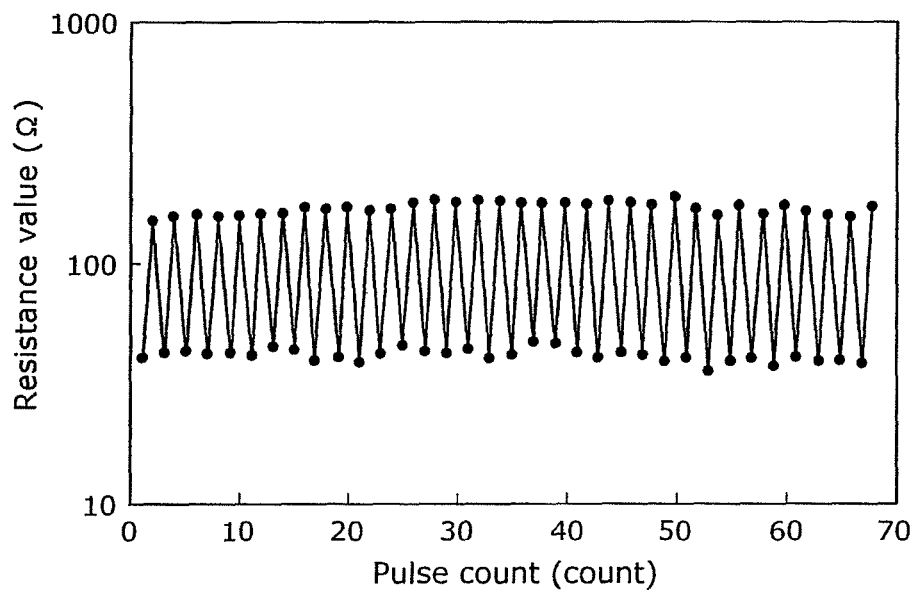
FIG. 18A is a diagram showing a relationship between a resistance value of the nonvolatile memory element and the number of applied electrical pulses as basic data of the present invention.
Figure 18B:
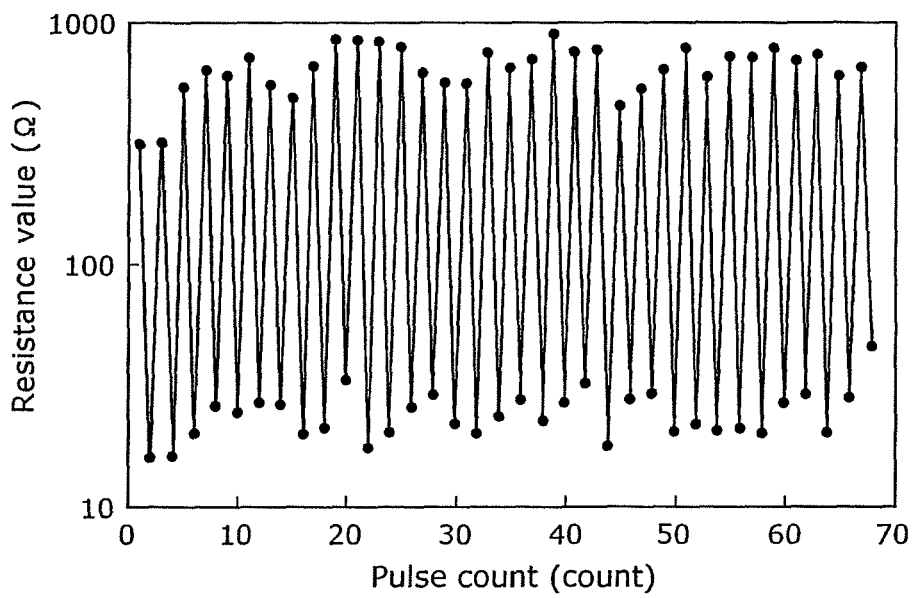
FIG. 18B is a diagram showing a relationship between a resistance value of the nonvolatile memory element and the number of applied electrical pulses as basic data of the present invention.

FIGS. 18A and 18B each show a result of measuring the resistance change characteristics of the nonvolatile memory element for which the Hf oxide layer having the oxygen content atomic percentage represented by either the point α or the point β in FIG. 17 is used with reference to the number of applied pulses.

FIGS. 18A and 18B each show that it is satisfactory that the high resistance value is more than four times as large as the low resistance value in the element for which the Hf oxide layer having the oxygen content atomic percentage represented by either the point α or the point β is used.

[Resistance Change Characteristics of Variable Resistance Element According to Material Type of Upper Electrode and Lower Electrode]

Next, the following describes a result of forming different types of elements in each of which the oxygen-deficient Hf oxide layer 504 is located between the lower electrode 503 comprising W and the upper electrode 505 comprising one of Al, Ti, Hf, Ta, W, Cu, and Pt, and of examining a situation of a resistance change caused by an electrical pulse, in order to verify whether or not a tendency for the resistance change to occur depends on electrode materials.

The oxygen content atomic percentage of the used oxygen-deficient Hf oxide is 61 at. % ($HfO_{1.56}$) that is close to the upper limit of the preferred range of the oxygen content atomic percentage. Although the method of forming an element is almost the same as a method of depositing a Hf oxide, Al, Ti, Hf, Ta, W, Cu, and Pt are released into an atmosphere after the Hf oxide is formed and are then deposited by another sputtering apparatus with the sputtering method.

Table 2 shows materials of the lower electrode and the upper electrode used for formed elements O to U.

TABLE 2

| Name of Element | Lower Electrode Material | Upper Electrode Material |
|---|---|---|
| O | W | Al |
| P | W | Ti |
| Q | W | Hf |
| R | W | Ta |
| S | W | W |
| T | W | Cu |
| U | W | Pt |

A resistance of each of the above elements O to U is changed by giving an electrical pulse having a pulse width of 100 ns at a predetermined amplitude.

In this experiment, because the lower electrode 503 contains W, a non-influential material, a result of the A mode (the mode in which the increase in resistance occurs when the high voltage is applied to the lower electrode with reference to the upper electrode) is omitted from a description, and only a result of the B mode (the mode in which the increase in resistance occurs when the high voltage is applied to the upper electrode with reference to the lower electrode) is shown.

Although there is a slight difference in a voltage of the electrical pulse when the resistance change is caused in the upper electrode mode depending on the elements, a voltage when the increase in resistance is caused ranges from +1.1 V to +1.9 V, and a voltage when the decrease in resistance is caused ranges from −1.1 V to −1.5 V, with the lower electrode being a reference of the voltage.

FIGS. 19A to 19G are summaries of the measurement results.

First, by looking at results of the element O of FIG. 19A in which. Al is used for the upper electrode, the element P of FIG. 19B in which Ti is used for the upper electrode, and the element Q of FIG. 19C in which Hf is used for the upper electrode, it is clear that the resistance change hardly occurs or does not occur at all. Next, the resistance change, though slight, is initially observed in the element R of FIG. 19D in which Ta is used for the upper electrode, but a variation range of the resistance change decreases as the number of pulses decreases, and then the resistance change is hardly observed. It is considered that these materials are not inherently prone to the resistance change.

Next, a relatively stable resistance change has occurred in the element S of FIG. 19E in which W is used for the upper electrode, the element T of FIG. 19F in which Cu is used for the upper electrode, and the element U of FIG. 19G in which Pt is used for the upper electrode.

As can be seen from the above results, for the nonvolatile memory element for which the oxygen-deficient Hf oxide is used, there are (influential) materials that are prone to cause the resistance change phenomenon and (non-influential) materials that are not prone to cause the resistance change phenomenon. In the range of this experiment, the influential electrode materials are Pt, Cu, and W, and the non-influential electrode materials are Ta, Hf, Ti, and Al.

When a variable resistance element having a structure in which an oxygen-deficient Hf oxide is sandwiched by a combination of these materials is formed, a stable resistance change can be achieved without blending the resistance change modes. However, when FIG. 19D is referred to, the resistance change, though weak, is observed in the electrode comprising Ta. Accordingly, when this material is used for one of electrodes and when, for example, Ti or Hf, the electrode material with which no resistance change is observed in the this experiment, is used for the other electrode, the stable yet weak resistance change can be expected.

The following describes some examinations of a mechanism in which a resistance change itself occurs and a material dependency of a tendency for the resistance change to occur.

Figure 20:
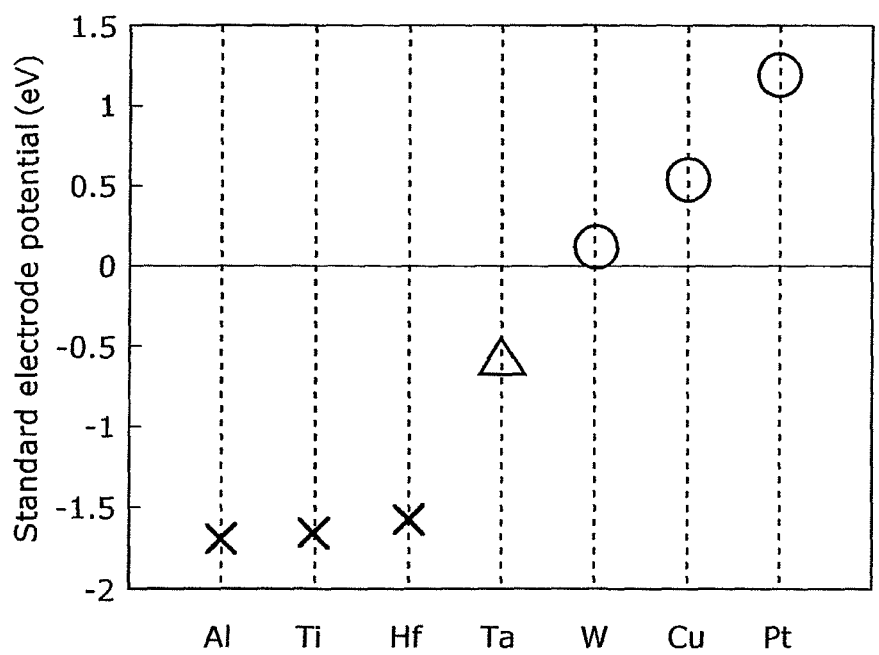
FIG. 20 is a diagram showing a relationship between an electrode material of the nonvolatile memory element and a standard electrode potential as basic data of the present invention.

FIG. 20 is a summary of results associated with the nonvolatile memory element for which the oxygen-deficient Hf oxide is used. The horizontal axis indicates electrode materials, and the vertical axis indicates a standard electrode potential. In FIG. 20, a circle mark denotes that the resistance change occurred easily, a triangle mark denotes that the resistance change occurred though a rate of the change was small, and a cross mark denotes that the resistance change did not occur.

According to FIG. 20, it is clear that the resistance change occurs with the materials each having a standard electrode potential higher than that of Hf, a constituent element of the variable resistance layer, and the resistance change does not occur easily with the materials each having a standard electrode potential lower than that of Hf. In addition, it is clear that the resistance change occurs more easily as a difference between the standard electrode potentials becomes greater, and the resistance change does not occur more easily as the difference becomes smaller.

This result indicates the same tendency as in the result which is described with reference to the second experiment and associated with the nonvolatile memory element for which the oxygen-deficient Ta oxide is used. To put it differently, it is considered that the resistance change mechanism (refer to FIGS. 15A, 15B, 16A and 16B), which is described regarding the nonvolatile memory element for which the oxygen-deficient Ta oxide is used, functions, in the same manner, in the nonvolatile memory element for which the oxygen-deficient Hf oxide is used.

As can be seen from the above results, in the nonvolatile memory element in which the oxygen-deficient Hf oxide is used for the variable resistance layer, the materials each having the different standard electrode potential may be used for the upper electrode and the lower electrode, respectively.

With this, the resistance change dominantly occurs in the vicinity of one of the electrodes, which enables an ideal bipolar resistance change to be realized. Further, the resistance change modes are not blended, which enables a stable resistance change operation.

More preferably, a material having a standard electrode potential higher than that of Hf and a large difference between the standard electrode potentials may be used for one of electrodes, and a material having a standard electrode potential higher than that of Hf and a small difference between the standard electrode potentials may be used for the other electrode.

It is to be noted that, though not being described as the result of this experiment, a good experimental result indicating that a stable resistance change phenomenon has occurred is obtained regarding a variable resistance element in which TaN and Pt are respectively used for a lower electrode and an upper electrode.

The standard electrode potential of TaN is +0.48 eV, and Pt and Hf have standard electrode potentials of +1.18 eV and −1.55 eV.

This example is an example where Pt, a material having a standard electrode potential higher than that of Hf and a large difference between the standard electrode potentials, is used for the upper electrode, and TaN, a material having a standard electrode potential higher than that of Hf and a small difference between the standard electrode potentials, is used for the lower electrode.

In other words, it is considered that an advantageous effect described as the results of this experiment is obtained in this example by using, as electrode materials, TaN and Pt that satisfy a condition concerning the above standard electrode potentials.

As for another example, TiN and Pt may be used for a lower electrode and an upper electrode, respectively. The standard electrode potential of TiN is +0.55 eV. Thus, since a combination of TiN and Pt satisfies a condition concerning a standard electrode potential when a hafnium oxide is used for a variable resistance layer, the advantageous effect described as the results of this experiment can be expected by using TiN and Pt as the electrode materials.

Still more preferably, a material having a standard electrode potential higher than that of Hf may be used for one of the electrodes, and a material having a standard electrode potential lower than that of Hf may be used for the other electrode.

It is to be noted that, though not being described as the result of this experiment, gold (Au) has a standard electrode potential of +1.692 eV, which is higher than −1.55 eV that is the standard electrode potential of Hf. The advantageous effect described as the results of this experiment can be expected even when Au is used as the electrode material that is prone to cause the resistance change in the case where Hf is used as the variable resistance film.

In addition, as can be seen from the above mechanism, shown is the operation in which the resistance value increases when the electrical pulse having the positive voltage is applied to the electrode that is prone to cause the resistance change and the resistance value decreases when the electrical pulse having the negative voltage is applied.

It is to be noted that although the examples where the oxygen-deficient Ta oxide or the Hf oxide is used as the variable resistance layer are described in the first, second, and third experiments, the present invention is not limited to the examples, and since it is considered that an electric field applied to an electrode causes movement of oxygen ions as described above, the present invention can be applied to a nonvolatile memory element in which an oxygen-deficient oxide film of another transition metal is used for a variable resistance layer. In this case, a nonvolatile memory element which operates predominantly with one of electrodes can be formed by selecting an electrode material based on a standard electrode potential of the transition metal material to be used. In addition, a slight amount of dopant may be added to the tantalum oxide or the hafnium oxide which is the variable resistance layer, to an extent that resistance change characteristics are not significantly changed.

[Variable Resistance Element Including Oxygen-Deficient Transition Metal Oxide Stacked on Variable Resistance Layer]

The variable resistance element can also be provided with a structure including two variable resistance layers each of which contains one of an oxygen-deficient tantalum oxide, an oxygen-deficient hafnium oxide, and an oxygen-deficient zirconium oxide and which have different oxygen content atomic percentages and are each held between two electrodes.

These variable resistance elements have been devised by the inventors of the present application in order to obtain a nonvolatile memory element having reversible and stable reprogramming characteristics and using a variable resistance phenomenon, and are respectively described in detail by the international publications of related applications PTL5: WO2008/149484, PTL6: WO2010/004705, and PTL7: WO2010/21381.

The feature that the resistance change characteristics held by the variable resistance elements can be fixed to either the aforementioned A mode or B mode is applicable to the nonvolatile variable resistance device according to an implementation of the present invention, as in the case of the above variable resistance element including upper and lower electrodes comprising a different material.

The above-mentioned PTL5: International Publication No. WO2008/149484 discloses in detail the optimum condition of the thickness and composition of each of the two variable resistance layers in the variable resistance element including the oxygen-deficient tantalum oxide.

[Current Steering Element in which $SiN_x$ is Used for Current Steering Layer]

The following describes a current steering element of 1D1R cross point memory device according to an implementation of the present invention.

The international publication of a related application PTL8: No. WO2008/117494 of the related applications describes in detail that when a current steering layer is made of silicon nitride $SiN_x$ ($0 \leq x \leq 0.85$), a current steering element has bidirectional diode properties that exhibit current-voltage characteristics which are electrically non-linear and substantially symmetric to polarity of an applied voltage.

The international publication of a related application PTL9: No. WO2010/004675 describes in detail that when at least one of the first electrode and the second electrode of a current steering element is made of a-tungsten (a-W) having a body-centered cubic lattice (bcc) structure, an MSM diode capable of stably supplying a current of 30,000 A/cm$^2$ or more can be obtained.

These bidirectional diode elements having symmetric current-voltage characteristics and high withstand current characteristics of 30,000 A/cm$^2$ or more are applicable as the current steering element of the 1D1R cross point memory according to an implementation of the present invention.

[Variable Resistance Nonvolatile Memory Device According to Basic Configuration in Embodiment of the Present Invention]

The following describes, as a variable resistance nonvolatile memory device according to an embodiment of the present invention, a 1D1R cross point memory device including the above-described variable resistance element and a current steering element. A specific and detailed structure according to the embodiment of the present invention will be described with reference to FIG. 41 and the following figures, but, first, a basic configuration thereof is described.

Figure 21:
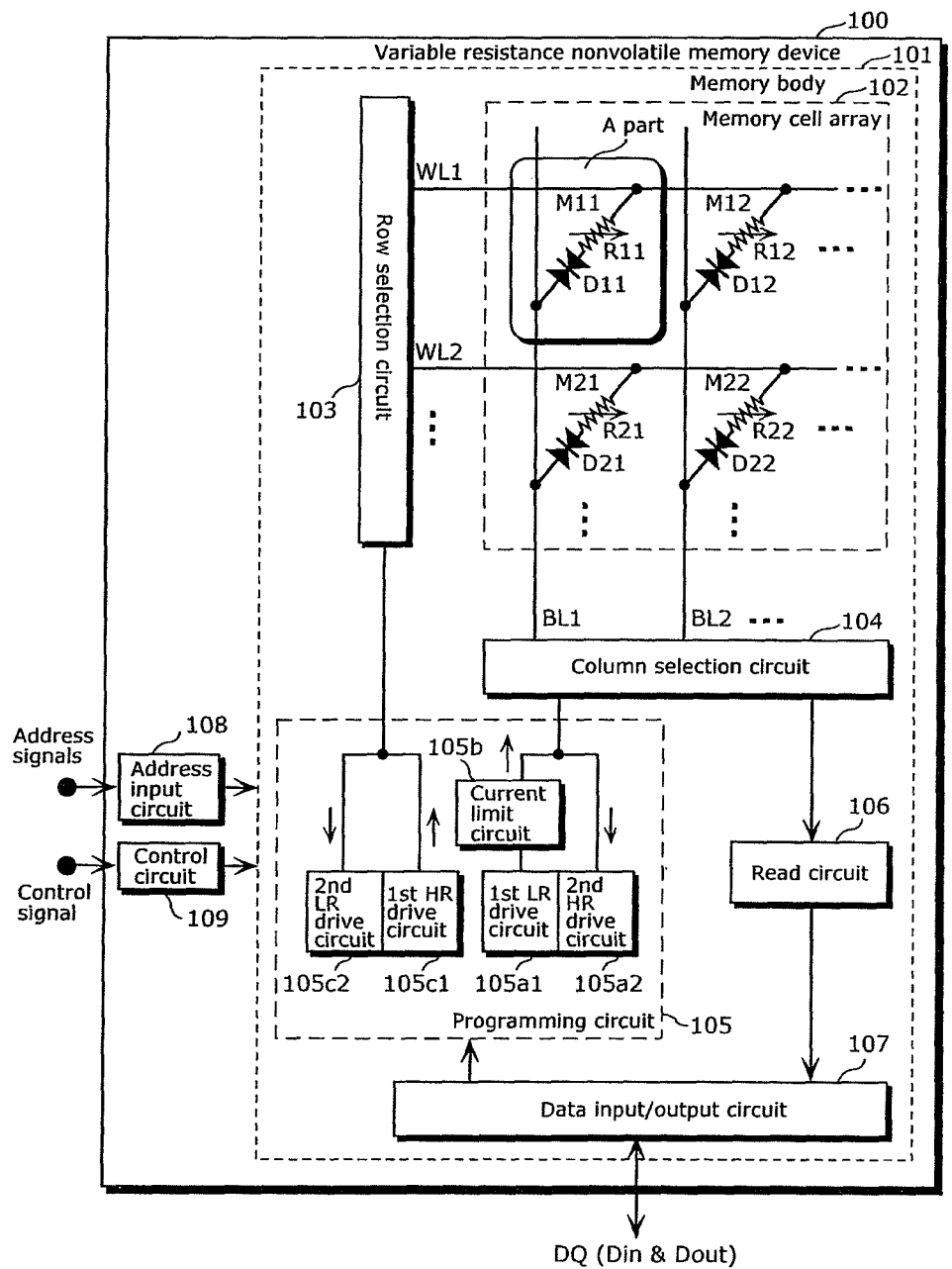
FIG. 21 is a configuration diagram of a variable resistance nonvolatile memory device according to a basic configuration in an embodiment of the present invention.

FIG. 21 is a block diagram showing the basic configuration of the nonvolatile memory device according to the embodiment of the present invention. It shows, as this embodiment, a configuration of a memory cell that operates in the B mode in which the variable resistance phenomenon occurs presumably in the vicinity of the upper electrode, and an optimum control circuit for the configuration.

In FIG. 21, a variable resistance nonvolatile memory device 100 includes a memory body 101 on a semiconductor substrate, and the memory body 101 includes a memory array 102, a row selection circuit 103, a column selection circuit 104, a programming circuit 105, a read circuit 106 which detects an amount of current flowing to a selected bit line and determines whether stored data is "1" or "0", and a data input/output circuit 107 which inputs/outputs data via a terminal DQ.

An operation of the memory body 101 is controlled by output supplied thereto from an address input circuit 108 to which address signals are input from outside of the variable resistance nonvolatile memory device 100 and which selects and indicates a predetermined address, and a control circuit 109 to which a control signal is input.

The memory array 102 includes memory cells Mij (i and j are natural numbers satisfying i≤M and j≤N. The same applies to descriptions below.) arranged in M rows and N columns (M and N are natural numbers.). In the memory cell Mij, one terminal of a variable resistance element Rij and one terminal of a current steering element Dij having both positive and negative threshold voltages are connected to each other in series. The other terminal of the variable resistance element Rij is connected to a word line WLi, and the other terminal of the current steering element Dij is connected to a bit line BLj. It is to be noted that FIG. 21 shows only memory cells M11, M12, M21, and M22 for four bits of 2 rows×2 columns (variable resistance elements R11, R12, R21, and R22, current steering elements D11, D12, D21, and D22, bit lines BL1 and BL2, and word lines WL1 and WL2).

In the present configuration, the bit lines BLj are composed of lines of a lower layer and arranged in the vertical direction of the sheet of drawing, and the word lines WLi are composed of lines of an upper layer and arranged in the horizontal direction of the sheet of drawing. The variable resistance element Rij is configured so as to have characteristics of the B mode in which the variable resistance phenomenon occurs in the vicinity of the upper electrode of the variable resistance element, which will be hereinafter described in detail.

The word lines WLi are connected to the row selection circuit 103, and in a read or programming mode, one row is selected. The bit lines BLj are connected to the column selection circuit 104, and in a read or programming mode, one column is selected.

In the programming mode, the data input/output circuit 107 programs data in the variable resistance element Rij of the selected memory cell Mij so as to increase or decrease resistance, according to a programming instruction of the data "0" or the data "1" of the data input signal Din. In the present embodiment, writing the data "0" corresponds to resistance-decreasing programming while writing the data "1" corresponds to resistance-increasing programming.

The programming circuit 105 is connected to the data input/output circuit 107. The programming circuit 105 includes: the first LR drive circuit 105*a*1 for high voltage level driving in the writing of the data "0", i.e., the resistance-decreasing programming; a current limit circuit 105*b* to which an output of the first LR drive circuit 105*a*1 is input; and the second LR drive circuit 105*c*2 for low voltage level driving in the writing of the data "0", i.e., the resistance-decreasing programming. The programming circuit 105 further includes: the first HR drive circuit 105*c*1 for high voltage level driving in the writing of the data "1", i.e., the resistance-increasing programming; and the second HR drive circuit 105*a*2 for low voltage level driving in the writing of the data "1", i.e., the resistance-increasing programming.

Upon resistance-decreasing programming, a programming pulse having current limited by the current limit circuit 105*b* is provided to the selected bit line BLj via the column selection circuit 104. On the other hand, upon resistance-increasing programming, the first HR drive circuit 105*c*1 having no current limiting function provides a programming pulse to the selected word line WLi via the row selection circuit 103, which is one of the features.

In the variable resistance nonvolatile memory device 100 thus configured, the bit line BLj and the word line WLi are an example of the first signal line and the second signal line, respectively, according to an implementation of the present invention. The first LR drive circuit 105*a*1, the first HR drive circuit 105*c*1, the second LR drive circuit 105*c*2, and the second HR drive circuit 105*a*2 are an example of the first drive circuit, the second drive circuit, the third drive circuit, and the fourth drive circuit, respectively, according to an implementation of the present invention. The current limit circuit 105*b* is an example of the current limit circuit according to an implementation of the present invention. The column selection circuit 104 and the row selection circuit 103 are the examples of the first selection circuit and the second selection circuit according to an implementation of the present invention.

Figure 22:
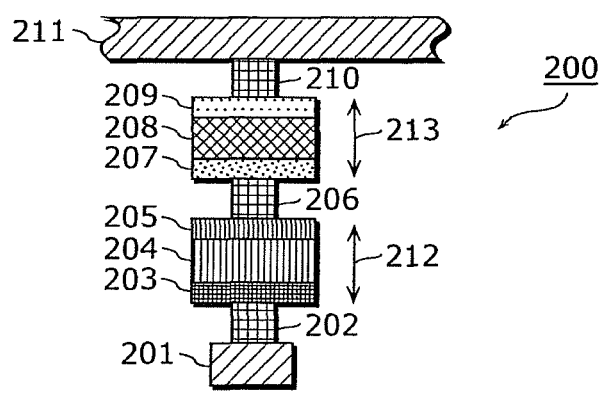
FIG. 22 is a cross-sectional diagram showing a configuration of a memory cell according to a basic configuration in an embodiment of the present invention.

FIG. 22 is a cross-sectional diagram showing a configuration of a memory cell M11 shown as an A part in FIG. 21.

A current steering element 212 and a variable resistance element 213 correspond respectively to the current steering element Dij and the variable resistance element Rij (where i and j are positive integers) shown in FIG. 21.

The memory cell 200 includes, in the following order: a first-layer line 201 comprising Al; a first via 202; a third electrode 203 comprising TaN, a current steering layer 204 comprising nitrogen-deficient silicon nitride, and the fourth electrode 205 comprising TaN, in the current steering element 212; a second via 206; a first electrode 207 comprising TaN, a variable resistance layer 208 comprising oxygen-deficient tantalum oxide, and a second electrode 209 comprising Pt, in the variable resistance element 213; a third via 210; and a second-layer line 211 comprising Al.

As another feature, the second electrode 209 located in an upper layer and connected on the side of the word line WLi contains Pt having a higher standard electrode potential than the first electrode 207 connected on the side of the bit line BLj.

In the structure of this memory cell, as described above in the basic data of the present invention, the resistance change occurs in the vicinity of the interface between the variable resistance layer 208 and the second electrode comprising Pt having a higher standard electrode potential than TaN comprised in the first electrode, and this variation corresponds to the B mode.

As the first-layer line 201 of FIG. 22 corresponds to the bit line BL1 and the second-layer line 211 of FIG. 22 corresponds to the word line WL1, the variable resistance element 213 changes to the low resistance state when a voltage of the first-layer line 201 relative to a voltage of the second-layer line 211 becomes a predetermined voltage VLth or higher, and the variable resistance element 213 changes to the high resistance state when a voltage of the second-layer line 211 relative to a voltage of the first-layer line 201 becomes a predetermined voltage VHth or higher.

It is to be noted that in FIG. 22, the positions of the current steering element 212 and the variable resistance element 213 may turn upside down, and the positions of the first electrode 207 and the second electrode 209 in the variable resistance element 213 may be opposite.

Figure 23A:
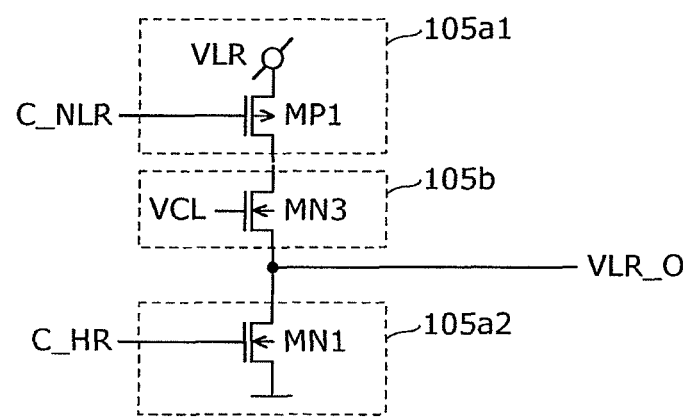
FIG. 23A is a circuit diagram showing an implementation of a first LR drive circuit, a second HR drive circuit, and a current limit circuit according to a basic configuration in an embodiment of the present invention.
Figure 23B:
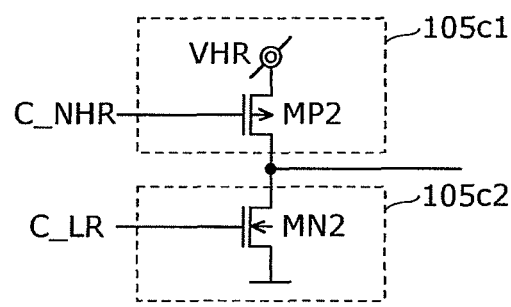
FIG. 23B is a circuit diagram showing an implementation of a first HR drive circuit and a second LR drive circuit according to a basic configuration in an embodiment of the present invention.

FIGS. 23A and 23B show one example of a specific circuitry layout of the programming circuit 105 of FIG. 21.

FIG. 23A shows one example of the first LR drive circuit 105a1, the second HR drive circuit 105a2, and the current limit circuit 105b.

The first LR drive circuit 105a1 includes a P-type MOS transistor MP1, the second HR drive circuit 105a2 includes an N-type MOS transistor MN1, and the current limit circuit 105b includes an N-type MOS transistor MN3.

C_NLR indicates a programming control signal which is at low voltage level with pulses for resistance-decreasing programming, and C_HR indicates a programming control signal which is at high voltage level with pulses for resistance-increasing programming. VCL is a gate voltage for steering current in decreasing resistance and is at a predetermined constant level.

Furthermore, the source terminal of the P-type MOS transistor MP1 is supplied with a resistance-decreasing programming power supply voltage VLR so that the P-type MOS transistor MP1 is capable of supplying voltage and current enough to drive the variable resistance element 213 to decrease its resistance.

FIG. 23B shows one example of the first HR drive circuit 105c1 and the second HR drive circuit 105c2.

The first HR drive circuit 105c1 includes a P-type MOS transistor MP2, and the second LR drive circuit 105c2 includes an N-type MOS transistor MN2.

C_NHR indicates a programming control signal which is at low voltage level with pulses for resistance-increasing programming, and C_LR indicates a programming control signal which is at high voltage level with pulses for resistance-decreasing programming.

Furthermore, the source terminal of the P-type MOS transistor MP2 is supplied with a resistance-increasing programming power supply voltage VHR so that the P-type MOS transistor MP2 is capable of supplying voltage and current enough to drive the variable resistance element 213 to increase its resistance.

In the programming mode, when an instruction is issued to write the data "0", that is, when the resistance-decreasing programming is instructed, C_NLR is set at low voltage level and C_LR is set at high voltage level so that the P-type MOS transistor MP1 of the first LR drive circuit 105a1 and the N-type MOS transistor MN2 of the second LR drive circuit 105c2 turn on, which form a current path for a current output from the first LR drive circuit 105a1, to flow into the second LR drive circuit 105c2 by way of a main path including the current limit circuit 105b, the bit line BLj, the memory cell Mij, and the word line WLi.

As to the output of the current limit circuit 105b, the current is limited by the N-type MOS transistor MN3, and the output voltage VLR_O has an upper limit determined by VCL-Vth_MN3 where Vth_MN3 represents a threshold voltage of MN3. The transistor MN3 has the source follower characteristics as well and therefore operates as a constant power supply so that the current is constant, when the resistance-decreasing programming power supply voltage VLR is set to a predetermined level or higher.

In the programming mode, when an instruction is issued to write the data "1", that is, when the resistance-increasing programming is instructed, C_NHR is set at low voltage level and C_HR is set at high voltage level so that the P-type MOS transistor MP2 of the first HR drive circuit 105a1 and the N-type MOS transistor MN1 of the second HR drive circuit 105a2 turn on, which form a current path for a current output from the first HR drive circuit 105c1, to flow into the second HR drive circuit 105a2 by way of a main path including the word line WLi, the memory cell Mij, and the bit line BLj. This current path includes no current limit circuit, with the result that the current increases monotonically as the resistance-increasing programming power-supply VHR increases.

[Operation of Variable Resistance Nonvolatile Memory Device According To Basic Configuration in Embodiment of the Present Invention]

An operation of the variable resistance nonvolatile memory device 100 configured as above is described.

Figure 24:
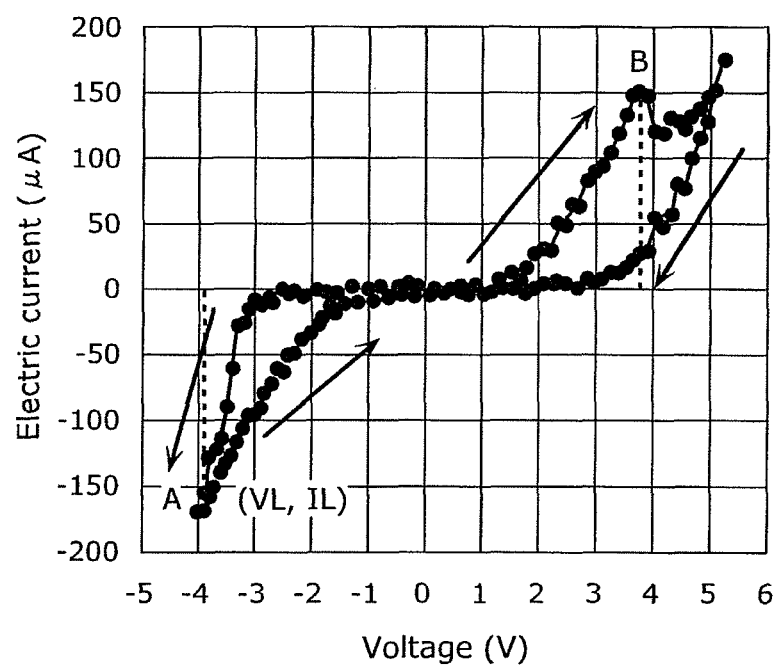
FIG. 24 shows observed data indicating current-voltage characteristics of the memory cell according to a basic configuration in an embodiment of the present invention.

First, an operation of the memory cell is described. FIG. 24 shows a voltage-current relation of a memory cell having the structure of FIG. 22, observed when a voltage is applied under the assumption that the polarity of the voltage is positive when the second-layer line 211 has a higher voltage than the first-layer line 201.

When a voltage having negative polarity by which the first-layer line 201 has a higher voltage than the second-layer line 211 is applied to the memory cell 200, the variable resistance element starts to change from the high resistance state to the low resistance state at a voltage around −3.2 V. As the voltage is applied up to −3.9 V (Point A), the resistance gradually decreases according to the applied voltage.

On the other hand, when a voltage having positive polarity by which the second-layer line 211 has a higher voltage than the first-layer line 201 is applied to the memory cell 200, the variable resistance element starts to change from the low resistance state to the high resistance state at a voltage around 3.8 V (Point B), of which position is roughly symmetrical to the voltage for the change to the low resistance state. When the voltage is further applied up to 5.1 V, an increase in current is observed, and it can be seen that a decrease in the applied voltage after this causes a change to the high resistance state because the current is smaller than that with an increase in the applied voltage.

In summary, the observed data of FIG. 24 shows that the memory cell 200 having the structure of FIG. 22 exhibits the B mode in which it changes to the low resistance state when the voltage of the first-layer line 201 is equal to or higher than the predetermined voltage VLth with respect to the voltage of the second-layer line 211 while it changes to the high resistance state when the voltage of the second-layer line 211 is equal to or higher than the predetermined voltage VHth with respect to the voltage of the first-layer line 201, and also shows that the voltage (Point A) to be applied for the low resistance state and the voltage (Point B) at which the change to the high resistance state starts are roughly symmetrical.

Next, an operation of the variable resistance nonvolatile memory device configured as above is described.

First, characteristics of the programming circuit 105 are described.

Figure 25A:
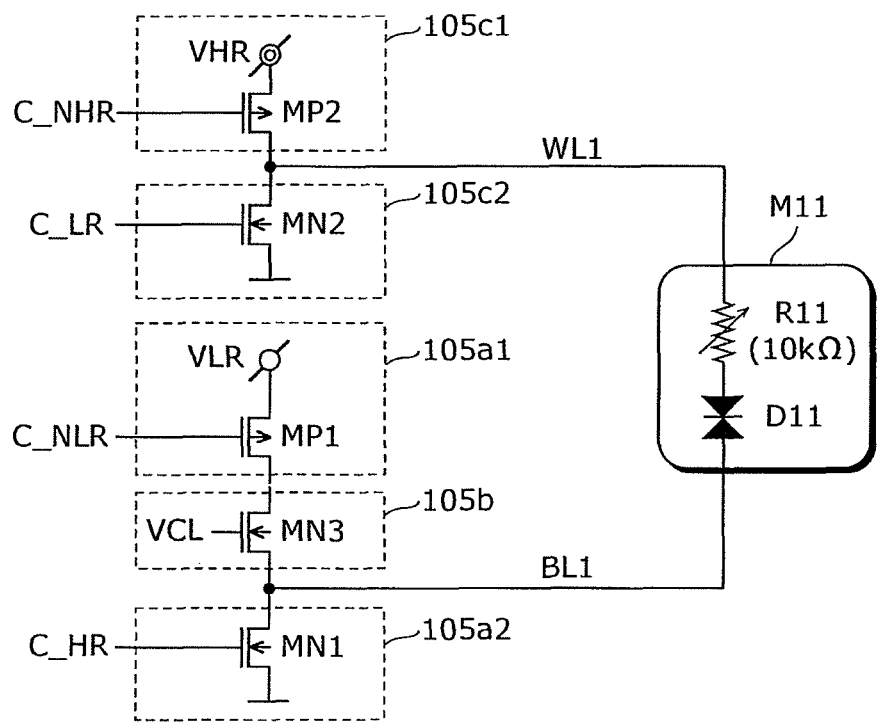
FIG. 25A shows an equivalent circuit diagram of a current path for programming, according to a basic configuration in an embodiment of the present invention.
Figure 25B:
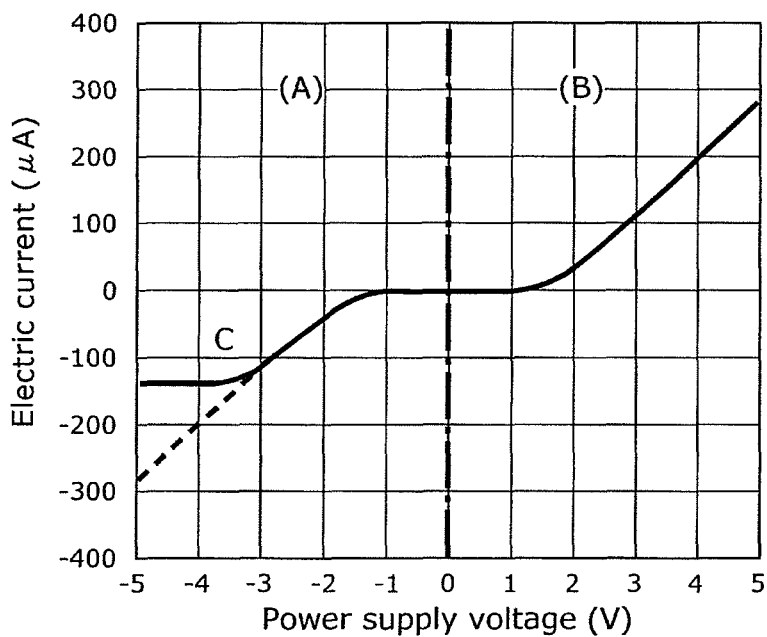
FIG. 25B shows characteristics of a current path for programming, according to a basic configuration in an embodiment of the present invention.

FIG. 25A shows an equivalent circuit diagram of only a current path involved in programming, cut out in order to explain the operation of the variable resistance nonvolatile memory device 100 shown in FIG. 21 with use of the first specific programming circuit shown in FIGS. 23A and 23B. FIG. 25B shows characteristics of the equivalent circuit which are a relation between a voltage given from the programming circuit 105 and a current flowing through the memory cell M11 observed in a simulation, in a state where the variable resistance element R11 of the memory cell M11 has a fixed resistance of 10 kΩ for the low resistance state, for example, and is connected in series to the bi-directional current steering element.

In FIG. 25B, a negative voltage region (A) indicates characteristics for driving, by the first LR drive circuit 105a1, the memory cell in the low resistance state at, for example, 10 kΩ, changed from the high resistance state (For example, −3 V means driving with 3 V given to VLR). A positive voltage region (B) indicates characteristics for driving, by the first HR drive circuit 105c1, the memory cell in the low resistance state at, for example, 10 kg, for the high resistance state. It is to be noted that the voltage of the drive circuit corresponds to the resistance-decreasing programming power supply voltage VLR when the voltage is in the negative voltage region (A) while the voltage of the drive circuit corresponds to the resistance-increasing programming power supply voltage VHR when the voltage is in the positive voltage region (B). A broken line in the negative voltage region (A) indicates, for comparison, characteristics in the case where no current limit circuit 105b is placed.

Referring to FIG. 25B, it is found that, when the resistance of the memory cell decreases, the current flowing to the memory cell increases as the low-resistance power supply voltage VLR increases, and with no current limit circuit 105b placed, the current increases monotonically as indicated by the broken line, while, with the current limit circuit 105b, its current limiting effect results in an inflection point C, and from approximately 3.5 V, the current is limited to a constant current of 130 μA.

On the other hand, it is found that, when the resistance of the memory cell increases, the application of the high-resistance power supply voltage VHR of 3.5 V causes a flow of current of 150 μA, that is, a current larger than that for decreasing the resistance, because there is no current limit circuit.

Now, settings of the N-type MOS transistor MN3 of the current limit circuit 105b in this circuit layout are discussed. As described above, in the case where the voltage applied in this low resistance state is low and a smaller amount of current flows, the low resistance state is set to be close to the high resistance, while, in the case where the voltage is high and a larger amount of current flows, the resistance decreases to a further extent. For formulation, the voltage at the point A is denoted by VL and the current at the point A is denoted by IL. In the discussion, suppose that no voltage drop occurs in diodes.

Referring to FIG. 25A, the voltage at the inflection point C shown in FIG. 25B is approximate to VCL-Vth_MN3 when VLR≥VCL where Vth_MN3 represents a threshold voltage of the N-type MOS transistor MN3 in the current limit circuit 105b, VCL represents a gate voltage of the N-type MOS transistor MN3 in the current limit circuit 105b, and VLR represents a voltage of the LR power supply voltage.

When the voltage (VL=VLth) at the low resistance point of the memory cell, indicated as the point A in FIG. 24, and the voltage VCL-Vth_MN3 at the inflection point C of the current limit circuit 105b in FIG. 25B are set to be equal to each other, the memory cell may be set at the supposed low resistance state at the inflection point C of the current limit circuit 105b. Thus, VCL is set so as to satisfy the following:

VLth=VCL−Vth_MN3 and VLR≥VCL

That is,

VCL=VLth+Vth_MN3 and VLR≥VCL            (Expression 1)

In this case, it is assumed that a voltage drop in the N-type MOS transistor MN2 is negligible. Furthermore, in this setting, a gate width and a gate length of the N-type MOS transistor MN3 in the current limit circuit 105b are adjusted so that the current IL at the point A can be supplied.

With this setting, it is possible to set the resistance value in the low resistance state to a constant value in a stabilized manner, because the current is constant with a voltage over the inflection point C even when the low-resistance power supply voltage VLR is set to be relatively high in response to concerns about voltage fluctuation and speed degradation.

[First Variation of Variable Resistance Nonvolatile Memory Device According to Basic Configuration in Embodiment of the Present Invention]

Figure 26:
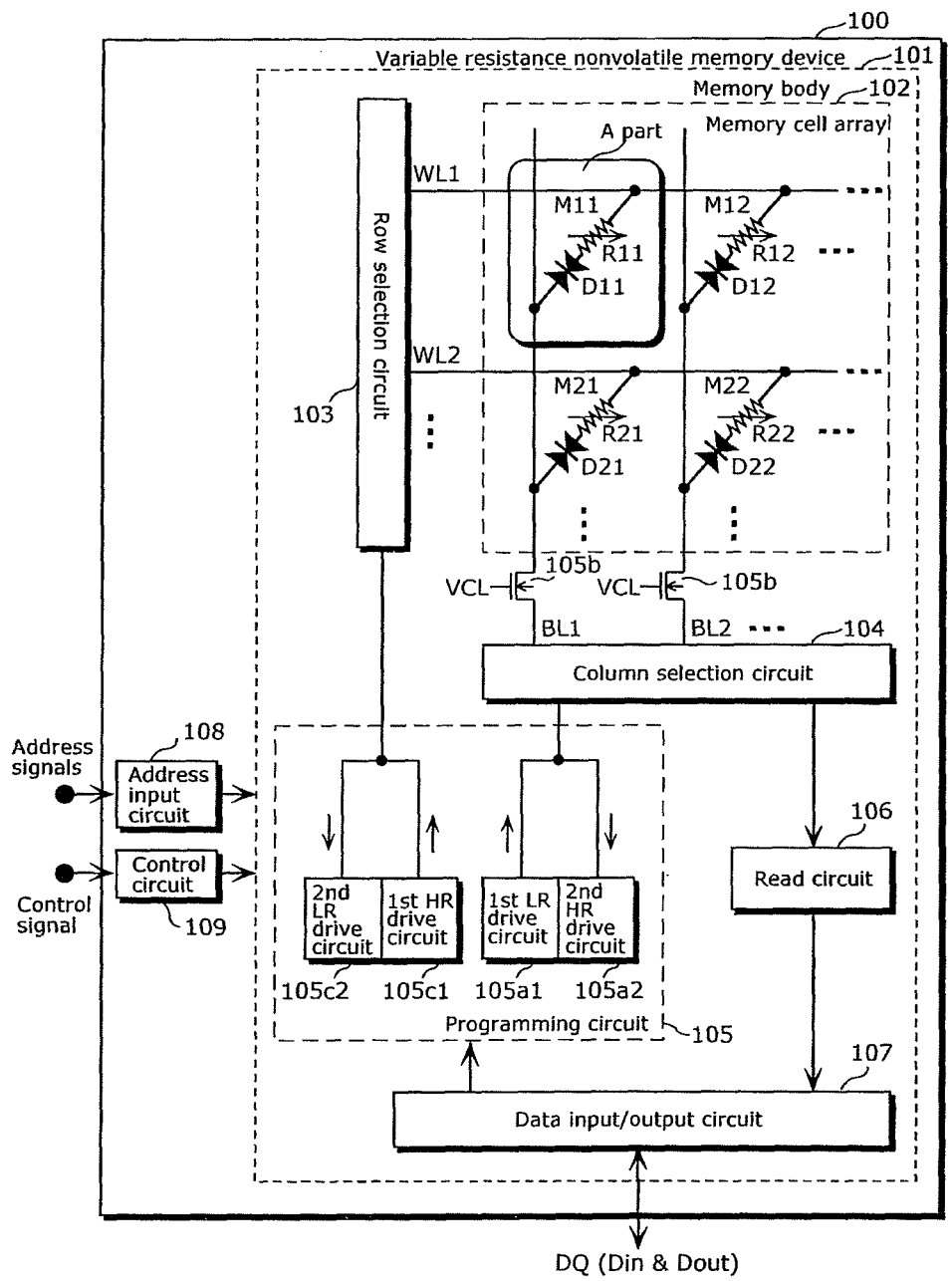
FIG. 26 is another configuration diagram of the variable resistance nonvolatile memory device according to a basic configuration in an embodiment of the present invention.

FIG. 26 shows the first variation which is different from FIG. 21, in which variation the current limit circuit 105b in the basic configuration of the embodiment includes the N-type MOS transistor. This configuration is characterized in that the current limit circuit 105b is positioned between the first electrode of the variable resistance element and the programming circuit. In the configuration of FIG. 26, the current limit circuit 105b is positioned close to the memory cell array, which makes it possible to limit the current at a position closer to the memory cell as compared to the case of FIG. 21. As a result, upon resistance-decreasing programming, the load for charging and discharging via the current limit circuit 105b can be smaller, and the current can be limited according to the change of the memory cell toward the low resistance state, which allow for more accurate setting of the supposed resistance value.

When the LR drive circuit performs programming, the current limit circuit 105b becomes a source follower and thus exhibits constant-current characteristics, thereby being capable of setting the resistance value in the low resistance state to a constant value in a stabilized manner, and when the HR drive circuit performs programming, the current limit circuit 105b does not become the source follower and therefore is capable of supplying a larger amount of current than the case of decreasing the resistance.

The column selection circuit 104 generally includes a P-type MOS transistor, an N-type MOS transistor, and a decoder circuit, and one bit line corresponding to a selected memory cell is selected. As including only the N-type MOS transistor, the column selection circuit 104 becomes a source follower when the LR drive circuit performs programming, which means that the column selection circuit 104 can be provided with not only a function of selecting a column but also a function of limiting the current. In this case, it is no longer necessary to provide the current limit circuit 105b, allowing for a reduction in area.

[Second Variation of Variable Resistance Nonvolatile Memory Device According to Basic Configuration in Embodiment of the Present Invention]

Figure 27:
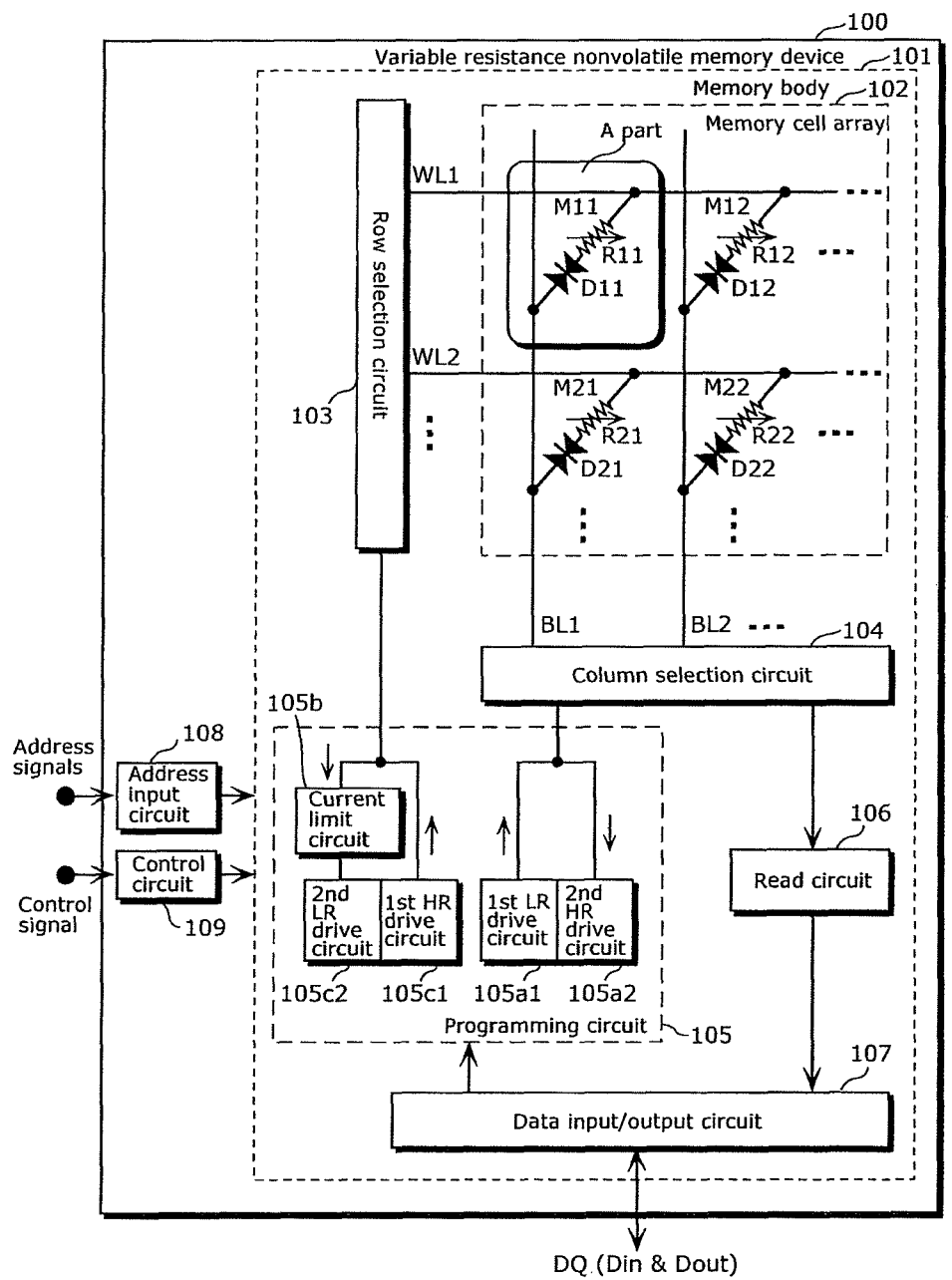
FIG. 27 is yet another configuration diagram of the variable resistance nonvolatile memory device according to a basic configuration in an embodiment of the present invention.
Figure 28A:
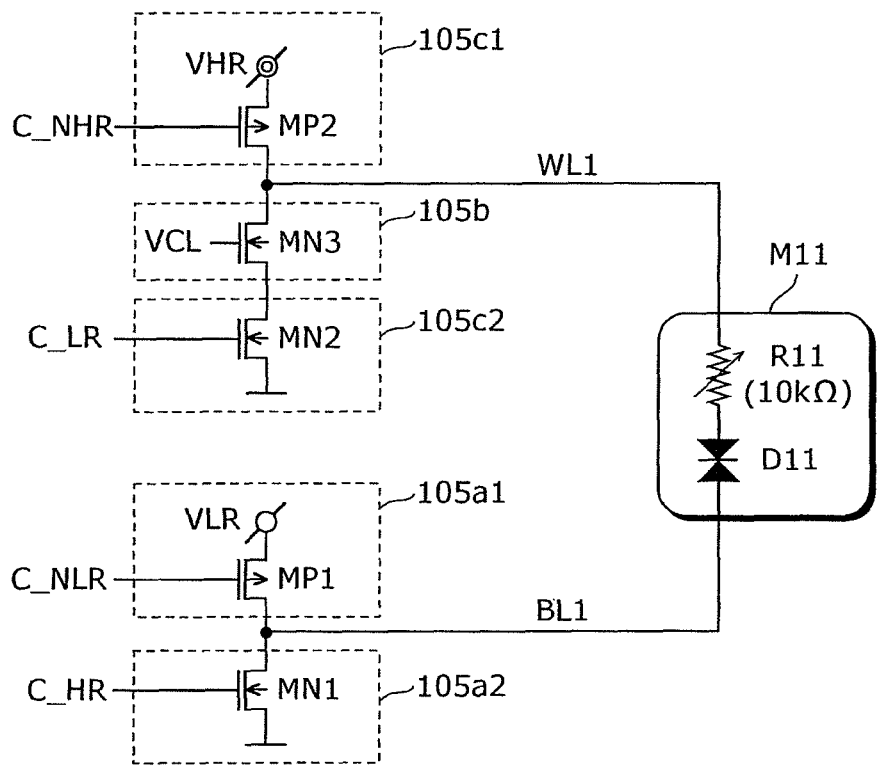
FIG. 28A shows another equivalent circuit diagram of a current path for programming, according to a basic configuration in an embodiment of the present invention.
Figure 28B:
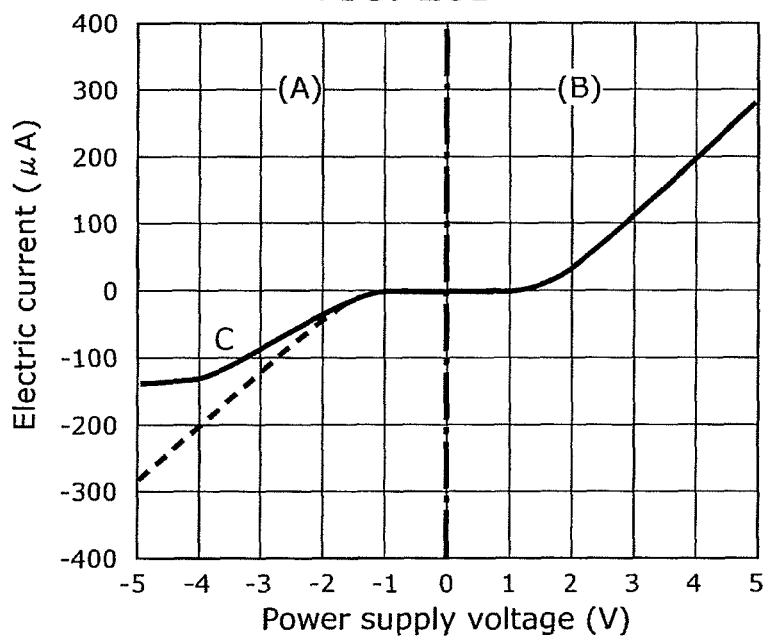
FIG. 28B shows characteristics of another current path for programming, according to a basic configuration in an embodiment of the present invention.

The current limit circuit 105b may be provided on the side of the second LR drive circuit 105c2 instead of the first LR drive circuit 105a1 as shown in FIG. 21. FIG. 27 shows the second variation of the basic configuration in the embodiment. FIG. 28A shows one example of the first specific circuitry layout of the programming circuit 105 of FIG. 27, in which the current limit circuit 105b including an N-type MOS transistor is provided. FIG. 28B shows, as in the case of FIG. 25B, characteristics of the example which are a relation between a voltage given from the programming circuit 105 and a current flowing through the memory cell 200 observed in a simulation, in a state where the variable resistance element of the memory cell 200 has a fixed resistance of 10 kΩ for the low resistance state, for example, and is connected in series to the bi-directional current steering element.

In FIG. 28B, a negative voltage region (A) indicates characteristics for driving, by the first LR drive circuit 105a1, the memory cell in the low resistance state at, for example, 10 kΩ, changed from the high resistance state (For example, −3 V means driving with 3 V given to VLR), and a positive voltage region (B) indicates characteristics for driving, by the first HR drive circuit 105c1, the memory cell in the low resistance state at, for example, 10 kΩ, for the high resistance state. A broken line in the negative voltage region (A) indicates, for comparison, characteristics in the case where no current limit circuit 105b is placed.

Referring to FIG. 28B, it is found that, when the resistance of the memory cell decreases, the current flowing to the memory cell increases as the low-resistance power supply voltage VLR increases, and with no current limit circuit 105b placed, the current increases monotonically as indicated by the broken line, while, with the current limit circuit 105b, its current limiting effect results in an inflection point C, and from approximately −3.9 V, the current is limited to a constant current of −130 μA.

On the other hand, it is found that, when the resistance of the memory cell increases, the application of the high-resistance power supply voltage VHR of 3.5 V causes a flow of current of 150 μA, that is, a current larger than that for decreasing resistance, because there is no current limit circuit.

Referring to FIG. 28A, the voltage at the inflection point C shown in FIG. 28B is approximate to VCL−Vth_MN3+VL where Vth_MN3 represents a threshold voltage of the N-type MOS transistor MN3 in the current limit circuit 105b, VCL represents a gate voltage of the N-type MOS transistor MN3 in the current limit circuit 105b, VLR represents a voltage of the LR power supply voltage, and VL=VLth represents a voltage at a low-resistance point of the memory cell. By setting VCL so as to satisfy the following:

$$VLR = VCL - \text{Vth\_MN3} + VL \quad \text{(Expression 2)}$$
$$= VCL - \text{Vth\_MN3} + VLth$$

That is, $$VCL = VLR - VLth + \text{Vth\_MN3}$$

so that the voltage VCL−Vth_MN3+VLth at the inflection point C is equal to the voltage VLR of the LR power supply, it is possible to decrease the resistance of the memory cell at the inflection point C of the current limit circuit 105b, that is, to set the memory cell in the supposed low resistance state, when VLR is given as a voltage of the LR power supply. In this case, it is assumed that a voltage drop in the P-type MOS transistor MP1 is negligible. Furthermore, in this setting, a gate width and a gate length of the N-type MOS transistor MN3 in the current limit circuit 105b are adjusted so that the current IL at the point A of FIG. 24 can be supplied.

Moreover, when the current limit circuit 105b is made as a constant current circuit using a current mirror circuit or the like, instead of the N-type MOS transistor, and thus, the current is controlled to a constant level, it is possible to set the supposed resistance value with more accuracy.

With this setting, it is possible to set the resistance value in the low resistance state to a constant value in a stabilized manner, because the current is constant with a voltage over the inflection point C even when the low-resistance power supply voltage VLR is set to be relatively high in response to concerns about voltage fluctuation and speed degradation.

In the above, the threshold voltage of the N-type MOS transistor MN3 is set at Vth_MN3, which indicates the threshold voltage in the state where the source voltage is higher than the substrate voltage, that is, in the state where the substrate bias effect is obtained. Setting not only VCL but also the threshold voltage Vth_MN3 so as to satisfy the relations of (Expression 1) and (Expression 2) is effective in reducing operating voltage.

Characteristics of the memory cells, for example, current values at the low resistance points of the memory cells, indicated by the point A in FIG. 24, have intrinsic variation among respective memory cells. This variation causes variation of the inflection point C, which needs to be taken into account upon setting of VCL. Specific description is given below.

First, as to a lower limit, the read circuit 106 generally needs a read current equal to or more than a certain level, to read the memory cell in the low resistance state. It is therefore necessary to set VCL such that even the memory cell having the minimum read current, that is, the memory cell having the highest resistance among the memory cells in the low resistance state, has resistance lower than a certain level, in order to keep the read current.

As to an upper limit, in the case where a current more than the certain level repeatedly flows to the memory cell 200, undesirable results may be obtained in terms of reliability of the memory cell, especially, the current steering element 212. In such a case, VCL is set so that no current more than a withstand current (the maximum current which does not break the current steering element) flows to the current steering element, that is, the variable resistance element remains in the low resistance state with resistance higher than the certain level.

In setting of the lower limit, as means generally used in a nonvolatile memory device, the resistance values may be verified to perform additional programming on the memory cell which is in an insufficient low resistance state, for example. In such a case, the memory cell on which the additional programming is performed may be given a higher VCL so as to promote a decrease in resistance.

Figure 29A:
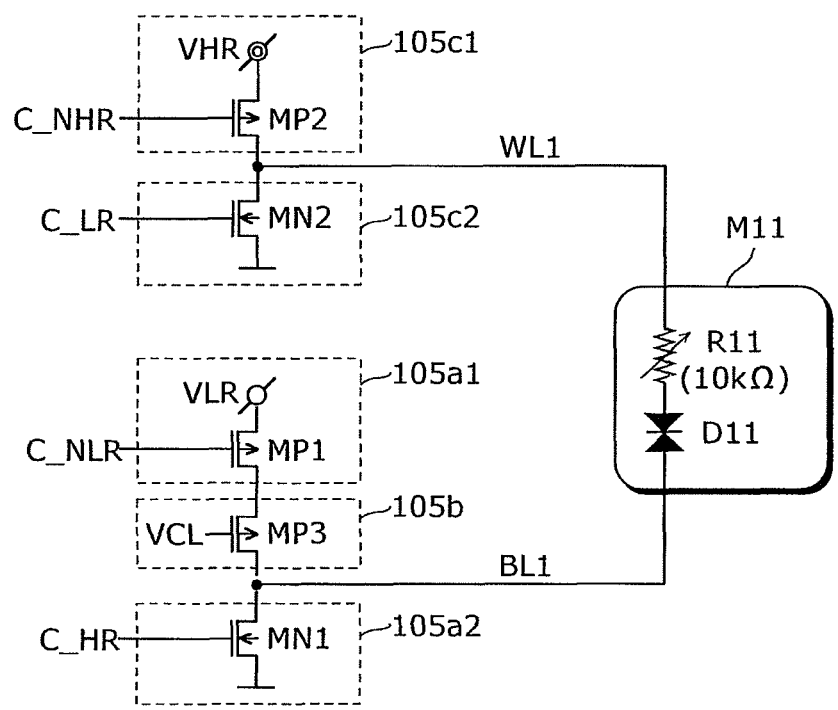
FIG. 29A shows yet another equivalent circuit diagram of a current path for programming, according to a basic configuration in an embodiment of the present invention.
Figure 29B:
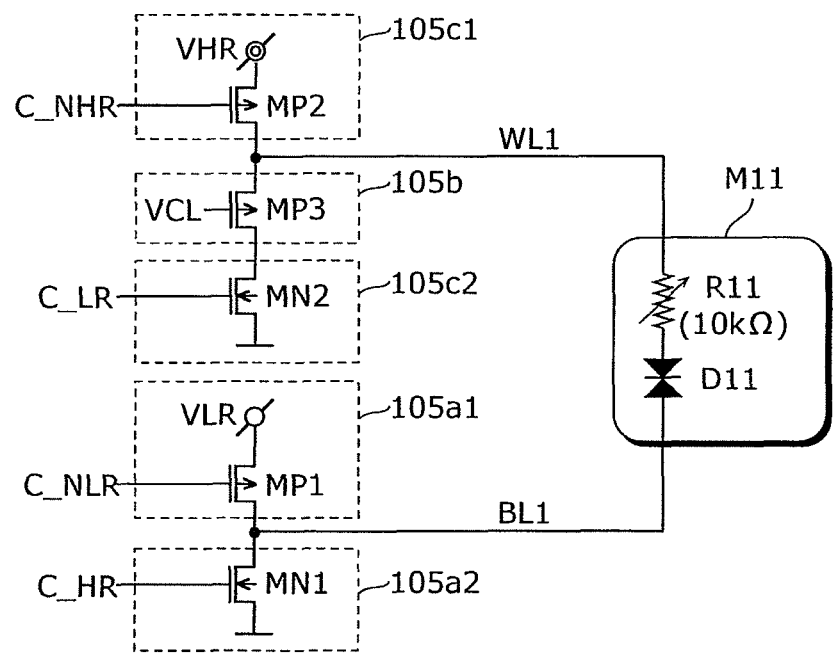
FIG. 29B shows yet another equivalent circuit diagram of a current path for programming, according to a basic configuration in an embodiment of the present invention.

The current limit circuit 105b, which includes the N-type MOS transistor in the above description, may include a P-type MOS transistor. FIG. 29A shows an example of the second specific circuitry layout of the programming circuit 105 of FIG. 21, in the case where the current limit circuit 105b including the P-type MOS transistor is provided on the side of the first LR drive circuit 105a1, and FIG. 29B shows an example of the second specific circuitry layout of the programming circuit 105 of FIG. 27, in the case where the current limit circuit 105b including the P-type MOS transistor is provided on the side of the second LR drive circuit 105c2.

In the case of FIG. 29A, the setting of the P-type MOS transistor in the current limit circuit 105b can be determined in the same manner as the case of FIG. 28A in which the current limit circuit 105b includes the N-type MOS transistor. In FIG. 29A, the voltage at the inflection point C of the current limit circuit 105b is approximate to VCL+Vth_MP3 where Vth_MP3 (Vth_MP3 is positive) represents a threshold voltage of the P-type MOS transistor MP3 in the current limit circuit 105b, VCL represents a gate voltage of the P-type MOS transistor MP3 in the current limit circuit 105b, VLR represents a voltage of the LR power supply voltage, and VL represents a voltage applied to the memory cell. When the voltage (VL=VLth) at the low resistance point of the memory cell is equal to the voltage (=VCL+Vth_MP3) at the inflection point C of this current limit circuit 105b, it is possible to set the memory cell in the supposed low resistance state at the inflection point C of the current limit circuit 105b. Therefore, VCL is set so as to satisfy the following:

VL=VLth=VCL+Vth_MP3

That is,

VCL=VLth−Vth_MP3    (Expression 3)

In this case, it is assumed that a voltage drop, in the N-type MOS transistor MN 2 is negligible. Furthermore, in this setting, a gate width and a gate length of the P-type MOS transistor MP3 in the current limit circuit 105b are adjusted so that the current IL at the point A can be supplied.

Moreover, when the current limit circuit 105b is made as a constant current circuit using a current mirror circuit or the like, instead of the P-type MOS transistor, and thus, the current is controlled to a constant level, it is possible to set the supposed resistance value with more accuracy.

With this setting, it is possible to set the resistance value in the low resistance state to a constant value in a stabilized manner, because the current is constant with a voltage over the inflection point C even when the low-resistance power supply voltage VLR is set to be relatively high in response to concerns about voltage fluctuation and speed degradation.

In the case of FIG. 29B, the setting can be determined in the same manner as the case of FIG. 25A. That is, in FIG. 29B, the voltage at the inflection point C of the current limit circuit 105b is approximate to VCL+Vth_MP3+VL when VCL≥0 where Vth_MP3 represents a threshold voltage of the P-type MOS transistor MP3 in the current limit circuit 105b, VCL represents a gate voltage of the P-type MOS transistor MP3 in the current limit circuit 105b, VLR represents a voltage of the LR power supply voltage, VL represents a voltage applied to the memory cell, and VL=VLth represents a voltage at the low resistance point of the memory cell. By setting VCL so as to satisfy the following:

$$VLR = VCL + \text{Vth\_MP3} + VL \quad \text{(Expression 4)}$$
$$= VCL + \text{Vth\_MP3} + VLth$$
and $VCL \geq 0$ That is, $VCL = VLR - VLth - \text{Vth\_MP3}$ and $VCL \geq 0$ so that the voltage at the inflection point C is equal to the voltage VLR (=VCL+Vth_MP3+VL) of the LR power supply, it is possible to decrease the resistance of the memory cell at the inflection point C of the current limit circuit 105b, that is, to set the memory cell in the supposed low resistance state, when VLR is given as a voltage of the LR power supply. In this case, it is assumed that a voltage drop in the P-type MOS transistor MP2 is negligible. Furthermore, in this setting, a gate width and a gate length of the P-type MOS transistor MP3 in the current limit circuit 105b are adjusted so that the current IL at the point A of FIG. 24 can be supplied.

With this setting, it is possible to set the resistance value in the low resistance state to a constant value in a stabilized manner, because the current is constant with a voltage over the inflection point C even when the low-resistance power supply voltage VLR is set to be relatively high in response to concerns about voltage fluctuation and speed degradation.

[Third Variation of Variable Resistance Nonvolatile Memory Device According to Basic Configuration in Embodiment of the Present Invention]

Figure 30:
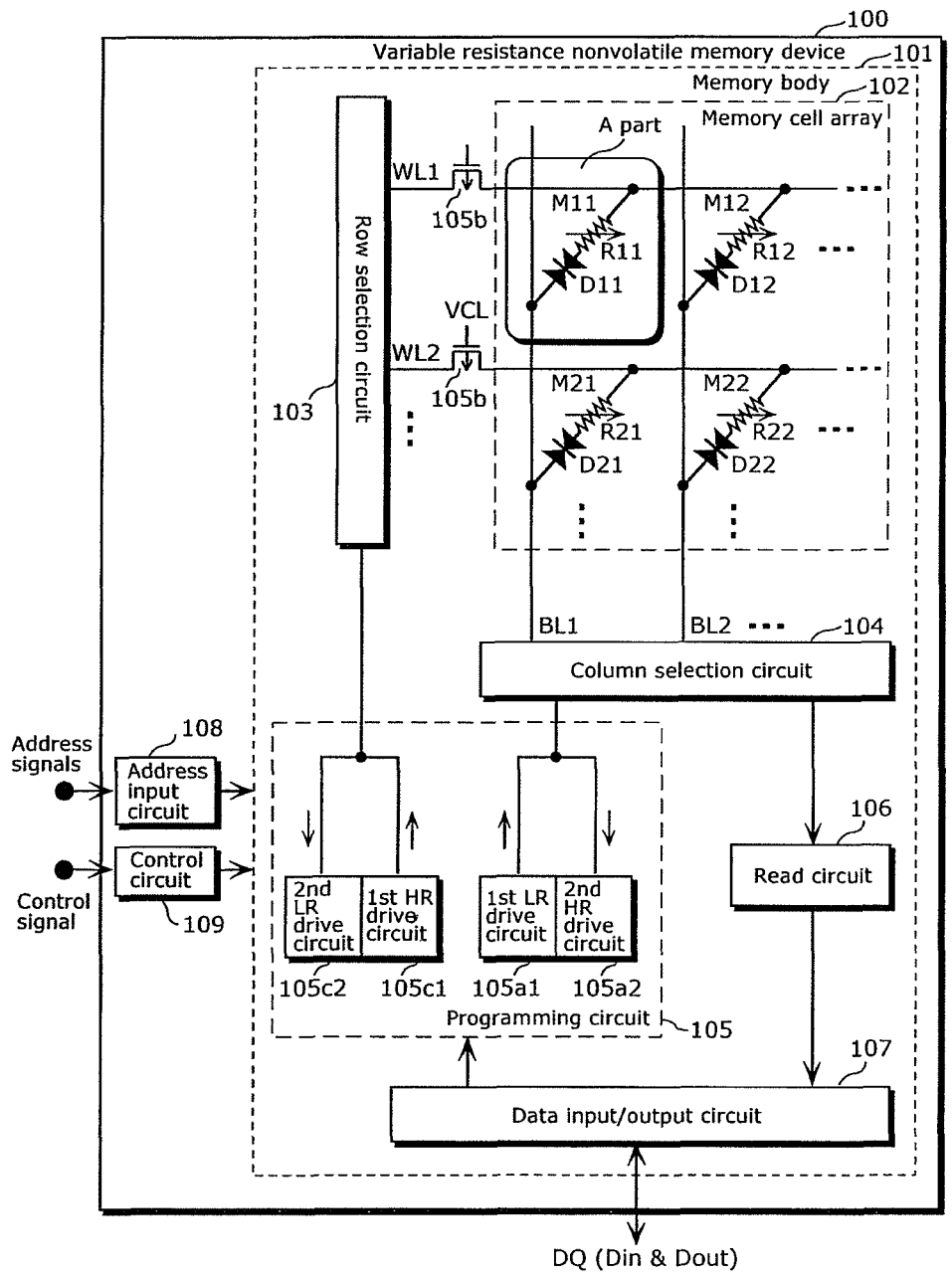
FIG. 30 is yet another configuration diagram of the variable resistance nonvolatile memory device according to a basic configuration in an embodiment of the present invention.

FIG. 30 shows a case where the current limit circuit 105b includes the P-type MOS transistor, and it is characteristic that the current limit circuit 105b is positioned between the second electrode of the variable resistance element and the programming circuit. In FIG. 30, the current limit circuit 105b is positioned close to the memory cell array, which makes it possible to limit the current at a position closer to the memory cell as compared to the case of FIG. 27. As a result, upon resistance-decreasing programming, the load for charging and discharging via the current limit circuit 105b can be smaller, and the current can be limited according to the change of the memory cell toward the low resistance state, which allow for more accurate setting of the supposed resistance value.

When the second LR drive circuit 105c2 performs programming, the current limit circuit 105b becomes a source follower and thus exhibits constant-current characteristics, thereby being capable of setting the resistance value in the low resistance state to a constant value in a stabilized manner, and when the first HR drive circuit 105c1 performs programming, the current limit circuit 105b does not become the source follower and therefore is capable of supplying a larger amount of current than the case of decreasing the resistance.

The row selection circuit 103 generally includes a P-type MOS transistor, an N-type MOS transistor, and a decoder circuit, and one bit line corresponding to a selected memory cell is selected. As including only the P-type MOS transistor, the row selection circuit 103 becomes a source follower when the second LR drive circuit 105c2 performs programming, which means that the row selection circuit 103 can be provided with not only a function of selecting a column but also a function of limiting the current. In this case, it is no longer necessary to provide the current limit circuit 105b, allowing for a reduction in area.

In the above, the threshold voltage of the P-type MOS transistor MP3 of FIGS. 29A and 29B is set at Vth_MP3, which indicates the threshold voltage in the state where the source voltage is lower than the substrate voltage, that is, in the state where the substrate bias effect is obtained. Setting not only VCL but also the threshold voltage Vth_MP3 to be lower than another transistor, so as to satisfy the relations of (Expression 3) and (Expression 4) is effective in reducing operating voltage.

In the case where the current limit circuit is provided as shown in FIGS. 25A, 28A, 29A, and 29B, it is possible to limit the current more simply and easily by appropriately selecting, upon designing the circuit, a size of the MOS transistor included in the current limit circuit.

Specifically, the current capability of the drive circuit for increasing resistance of the variable resistance element is defined by a smaller one of W2/L2 and W4/L4, where W2 represents a gate width of the P-type MOS transistor included in the first HR drive circuit 105c1, L2 represents a gate length of the P-type MOS transistor included in the first HR drive circuit 105c1, W4 represents a gate width of the N-type MOS transistor included in the second HR drive circuit 105a2, and L4 represents a gate length of the N-type MOS transistor included in the second HR drive circuit 105a2.

The current capability of the current limit circuit 105b is defined by WC/LC where WC and LC represent a gate width and a gate length, respectively, of the MOS transistor included in the current limit circuit 105b which is used to decrease the resistance of the variable resistance element, and by designing the transistor of the current limit circuit 105b to have such a size that the current capability of the current limit circuit 105b is smaller than the current capability of the drive circuit for increasing resistance of the variable resistance element, that is, so as to satisfy W2/L2>WC/LC and W4/L4>WC/LC          (Expression 5), the current capability of the drive circuit for decreasing resistance of the variable resistance element can be smaller than the current capability of the drive circuit for increasing variable resistance element.

Furthermore, needless to say, it is possible to set a resistance value of the variable resistance element with more accuracy by designing the MOS transistor included in the current limit circuit 105b so as to have a size satisfying (Expression 5), and in addition, by controlling a gate voltage of the MOS transistor included in the current limit circuit 105b so that the current capacity of the drive circuit for decreasing resistance is smaller than the current capacity of the drive circuit for increasing resistance.

Next, a behavior example, in a programming cycle, of the variable resistance nonvolatile memory device 100 according to the basic configuration of the embodiment in the case where data is programmed in the device is described with reference to the timing chart shown in FIGS. 31A and 31B.

Figure 31A:
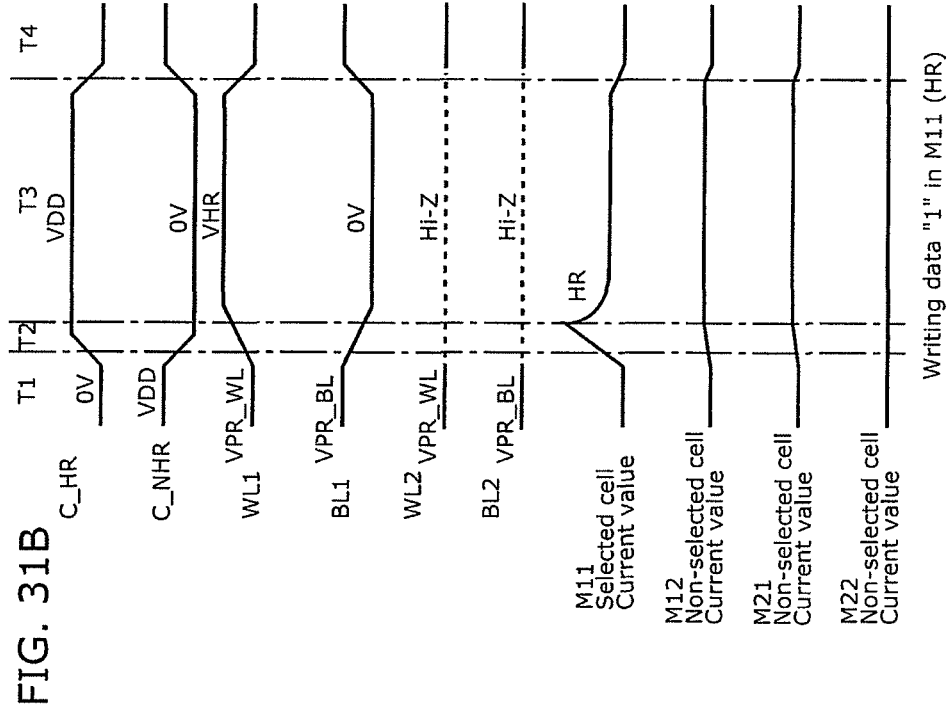
FIG. 31A shows a timing chart of the variable resistance nonvolatile memory device according to a basic configuration in an embodiment of the present invention.
Figure 31B:
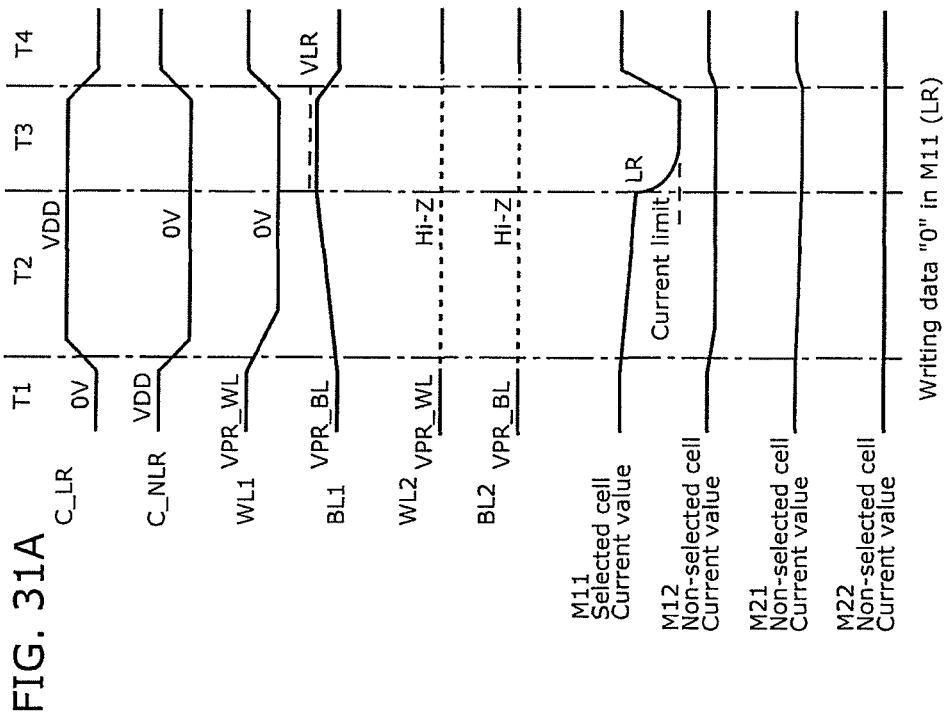
FIG. 31B shows a timing chart of the variable resistance nonvolatile memory device according to a basic configuration in an embodiment of the present invention.

FIGS. 31A and 31B are timing charts showing a behavior example of the nonvolatile memory device according to the basic configuration in the embodiment of the present invention. FIG. 31A shows the case where data "0", i.e., low resistance (LR) state, is written, and FIG. 31B shows the case where data "1", i.e., high resistance (HR), is written.

The following describes only the case where the memory cell M11 is selected and the programming and reading of data are performed. When the memory cell M11 is a selected cell, the memory cell M12 is a non-selected cell with a selected voltage in the word line and a non-selected voltage in the bit line, the memory cell M21 is a non-selected cell with a non-selected voltage in the word line and a selected voltage in the bit line, and the memory cell M22 is a non-selected cell with non-selected voltages in both of the word line and the bit line.

FIGS. 31A and 31B show also current which flows to the non-selected cells M12, M21 and M22 according to current flowing to the selected memory cell M11. In the current waveform, the current flowing in the direction from the word line to the bit line, that is, in the direction from the second electrode to the first electrode of the variable resistance element has positive polarity.

The following describes the behavior divided into periods T1 to T4, with reference to FIGS. 31A and 31B. In FIGS. 31A and 31B, VDD corresponds to the power supply voltage supplied to the variable resistance nonvolatile memory device 100.

In the cycle of writing data "0" in the memory cell M11 shown in FIG. 31A, all the word lines (WL1 and WL2) are previously charged to voltage VPR_WL, and all the bit lines (BL1 and BL2) are previously charged to voltage VPR_BL. The voltage previously charged is voltage approximately intermediate of the maximum amplitude of each of the word lines and the bit lines.

The period T2 following the period T1 is a period in which the variable resistance element R11 is still in the high resistance state, and the row selection circuit 103 selects the word line WL1 and the column selection circuit 104 selects the bit line BL1, and the selected bit line BL1 is driven to VLR with use of the first LR drive circuit 105a1 and the selected word line WL1 is driven to 0 V with use of the second LR drive circuit 105c2. Over time, the voltage of BL1 increases and the voltage of the word line WL1 decreases, and while the voltage of the word line WL1 drops in a relatively high speed, the voltage of the bit line BL1 which is driven via the current limit circuit 105b increases gradually. The voltage of the bit line BL1 does not increase to VLR because the current limit circuit 105b is placed.

The period T3 is a period in which programming or a change in resistance occurs, causing a change to the low resistance state. In the period T3, the value of current flowing to the selected memory cell M11, increases, and the programming is performed from the high resistance value to the low resistance value at a point of application, to the variable resistance element R11 (the variable resistance element 213 in FIG. 22), of a voltage having such an absolute value that the first electrode 207 has a low resistance voltage VLth of the variable resistance element with respect to the second electrode 209. As the resistance decreases, the current flowing to the memory cell M11 increases, but the value of current will not increase over a certain value because of the current limit circuit 105b. The decrease in resistance therefore stops with the certain resistance value. In FIG. 31A, the downward direction indicates an increase in the current.

After that, in the period T4, the selection of the word line WL1 and the bit line BL1 was released, and all the word lines are previously charged to voltage VPR_WL while all the bit lines are previously charged to voltage VPR_BL, thus completing the writing of the data "0".

In the cycle of writing the data "1" in the memory cell M11 shown in FIG. 31B, all the word lines are previously charged to voltage VPR_WL while all the bit lines are previously charged to voltage VPR_BL in the period T1. The voltage previously charged is voltage approximately intermediate of the maximum amplitude of each of the word lines and the bit lines.

The period T2 following the period T1 is a period in which the variable resistance element R11 is still in the low resistance state, and the row selection circuit 103 selects the word line WL1 and the column selection circuit 104 selects the bit line BL1, and the selected word line WL1 is driven to VHR with use of the first HR drive circuit 105c1 and the selected bit line BL1 is driven to 0 V with use of the second HR drive circuit 105a2. Over time, the voltage of the word line WL1 increases and the voltage of the bit line BL1 decreases, and because of no current limit circuit placed, the voltage of both the word line WL1 and the bit line BL1 changes in relatively high speed.

The period T3 is a period in which programming or a change in resistance occurs, causing a change to the high resistance state. In the period T3, the value of current flowing to the selected cell M11 increases, and the programming is performed on the variable resistance element R11 (the variable resistance element 213 in FIG. 22) from the low resistance value to the high resistance value at a point of application, to the second electrode 209, of a voltage having an absolute value which exceeds a high resistance voltage VHth of the variable resistance element with respect to the first electrode 207.

After that, in the period T4, the selection of the word line WL1 and the bit line BL1 was released, and all the word lines are previously charged to voltage VPR_WL while all the bit lines are previously charged to VPR_BL, thus completing the writing of the data "1".

It is to be noted that the structure of the memory cell Mij is not limited to the structure shown in FIG. 22 and may be one as follows which exhibits the B mode characteristics.

FIGS. 32A to 32D all show development examples of a memory cell operating in the B mode, each of which has a structure holding a variable resistance layer between an upper electrode and a lower electrode as in the case of FIG. 22 and in each of which the electrodes contains mutually different materials and the material of the upper electrode has a higher standard electrode potential than that of the lower electrode.

FIG. 32A shows a memory cell in which the variable resistance element 213 and the current steering element 212 are provided in contact without the second via 206.

As compared to FIG. 32A, FIG. 32B shows a memory cell in which the fourth electrode 205 comprising TaN of the current steering element 212 and the first electrode comprising TaN of the variable resistance element 213 are shared. This memory cell is easy to manufacture because of the shared electrode.

FIG. 32C shows a memory cell in which the variable resistance element 213 and the current steering element 212 each have the same diameter as the second via 206. With the same diameter as the second via 206, this memory cell can be disposed in the minimum interval of lines, allowing for a reduction in area. This memory cell is one example in which a size of section (including the above diameter as an example), orthogonal to the stacking direction, of the variable resistance element 213 and the current steering element 212 is set to be equal to or smaller than that of the via.

As compared to FIG. 32C, FIG. 32D shows a memory cell in which the second-layer line 211 contains Pt so that the second-layer line is used as the second electrode of the variable resistance element 213, and the first-layer line 201 contains TaN so that the first-layer line is used as the third electrode of the current steering element 212. In this case, it is no longer necessary to provide the second electrode of the variable resistance element 213 and the third electrode of the current steering element 212, which allows for a reduction in area. While FIG. 32D shows an example in which both of the second-layer line 211 and the first-layer line 201 are shared by respective ends of the memory cell, it may also be possible that only one of these is shared.

While the above describes configuration examples in which the current steering element 212, the variable resistance element 213, and the second-layer line 211 are positioned in this order on the first-layer line 201, it may also be possible in the cases of FIGS. 22, 32A, 32C, and 32D that the variable resistance element 213, the current steering element 212, and the second-layer line 211 are positioned in this order on the first-layer line 201. In such a configuration, the first electrode 207, the variable resistance layer 208, and the second electrode 209, of the variable resistance element 213, and the third electrode 203, the current steering layer 204, and the fourth electrode 205, of the current steering element 212, and the second-layer line 211 are formed in this order on the first-layer line 201.

Figure 33:
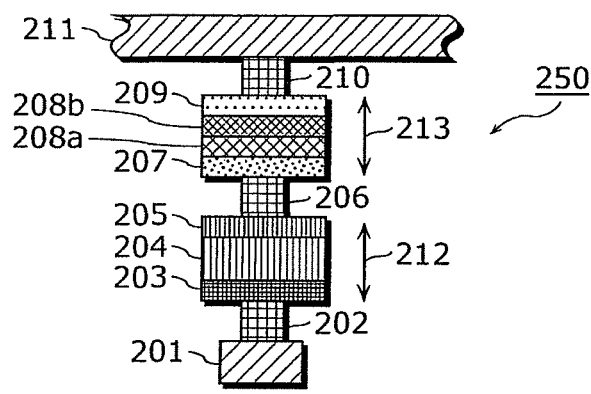
FIG. 33 is a cross-section diagram showing another configuration of the memory cell according to a basic configuration in an embodiment of the present invention.

FIG. 33 shows one example of a memory cell 250 which operates in the B mode with another structure. Parts common with FIG. 22 have the same numeric identifiers.

As shown in FIG. 33, the memory cell 250 includes, in this order, the first-layer line 201 comprising Al, the first via 202, the third electrode 203 comprising TaN, the current steering layer 204 comprising nitrogen-deficient silicon nitride, the fourth electrode 205 comprising TaN, the second via 206, the first electrode 207 comprising Pt, the first tantalum oxide layer 208a having a low oxygen content atomic percentage, the second tantalum oxide layer 208b having a high oxygen content atomic percentage, the second electrode 209 comprising Pt, the third via 210, and the second-layer line 211 comprising Al, and is characterized in that the second tantalum oxide layer 208b is formed in contact with the second electrode 209 that is the upper electrode of the variable resistance element.

In this configuration, as disclosed in the related application of the present invention cited in the basic data for the present invention, a change in resistance occurs in the vicinity of the interface between the second electrode 209 that is the upper electrode and the second tantalum oxide layer 208b, and this behavior corresponds to the B mode.

As the first-layer line 201 of FIG. 33 corresponds to the bit line BL1 and the second-layer line 211 of FIG. 33 corresponds to the word line WL1, the variable resistance element 213 changes to the low resistance state when a voltage of the first-layer line 201 relative to a voltage of the second-layer line 211 becomes a predetermined voltage VLth or higher, and the variable resistance element 213 changes to the high resistance state when a voltage of the second-layer line 211 relative to a voltage of the first-layer line 201 becomes a predetermined voltage VHth or higher.

FIGS. 34A to 34C all show the other examples of a memory cell operating in the B mode, each of which has a structure holding a variable resistance layer between an upper electrode and a lower electrode as in the case of FIG. 33 and in each of which the second tantalum oxide layer having a high oxygen content atomic percentage is provided in contact with the upper electrode.

FIG. 34A shows a memory cell in which the variable resistance element 213 and the current steering element 212 are provided in contact without the second via 206.

FIG. 34B shows a memory cell in which the variable resistance element 213 and the current steering element 212 each have the same diameter as the second via 206. With the same diameter as the second via 206, this memory cell can be disposed in the minimum interval of lines, allowing for a reduction in area. This memory cell is one example in which a size of section (including the above diameter as an example), orthogonal to the stacking direction, of the variable resistance element 213 and the current steering element 212 is set to be equal to or smaller than that of the via.

As compared to FIG. 34B, FIG. 34C shows a memory cell in which the second-layer line 211 contains Pt so that the second-layer line is used as the second electrode of the variable resistance element 213, and the first-layer line 201 contains TaN so that the first-layer line is used as the third electrode of the current steering element 212. In this case, it is no longer necessary to provide the second electrode of the variable resistance element 213 and the third electrode of the current steering element 212, which allows for a reduction in area. While FIG. 34C shows an example in which both of the second-layer line 211 and the first-layer line 201 are shared by respective ends of the memory cell, it may also be possible that only one of these is shared.

While the above describes configuration examples in which the current steering element 212, the variable resistance element 213, and the second-layer line 211 are positioned in this order on the first-layer line 201, it may also be possible in the cases of FIGS. 22, 32A to 32D, 33 and 34A to 34C that the variable resistance element 213, the current steering element 212, and the second-layer line 211 are positioned in this order on the first-layer line 201. In such a configuration, the first electrode 207, the variable resistance layer 208, and the second electrode 209, of the variable resistance element 213, and the third electrode 203, the current steering layer 204, and the fourth electrode 205, of the current steering element 212, and the second-layer line 211 are formed in this order on the first-layer line 201.

Needless to say, it is also possible to provide a configuration which combines different electrodes and a tantalum oxide layer having a different concentration, such as a configuration in which the upper electrode contains a material having a higher standard electrode potential, like the electrode configuration of FIGS. 22 and 32A to 32D, and the second tantalum oxide layer having a high oxygen content atomic percentage shown in FIGS. 33 and 34A to 34C is provided in contact with the upper electrode.

Furthermore, the third electrode 203 or the third electrode 203 and the current steering layer 204 may be formed in the same wiring pattern on the first-layer line 201. The second electrode 209 may also be formed in the same wiring pattern under the second-layer line 211.

[Forth Variation of Variable Resistance Nonvolatile Memory Device According to Basic Configuration in Embodiment of the Present Invention]

Next, the fourth variation according to the basic configuration in the embodiment of the present invention is described. While the memory cell is in the B mode in the basic configuration according to an implementation of the present invention and the first to third variations thereof described so far, the memory cell is in the A mode in the fourth variation. Descriptions on circuits and operations which are the same as those described above will be accordingly omitted hereinbelow.

Figure 35:
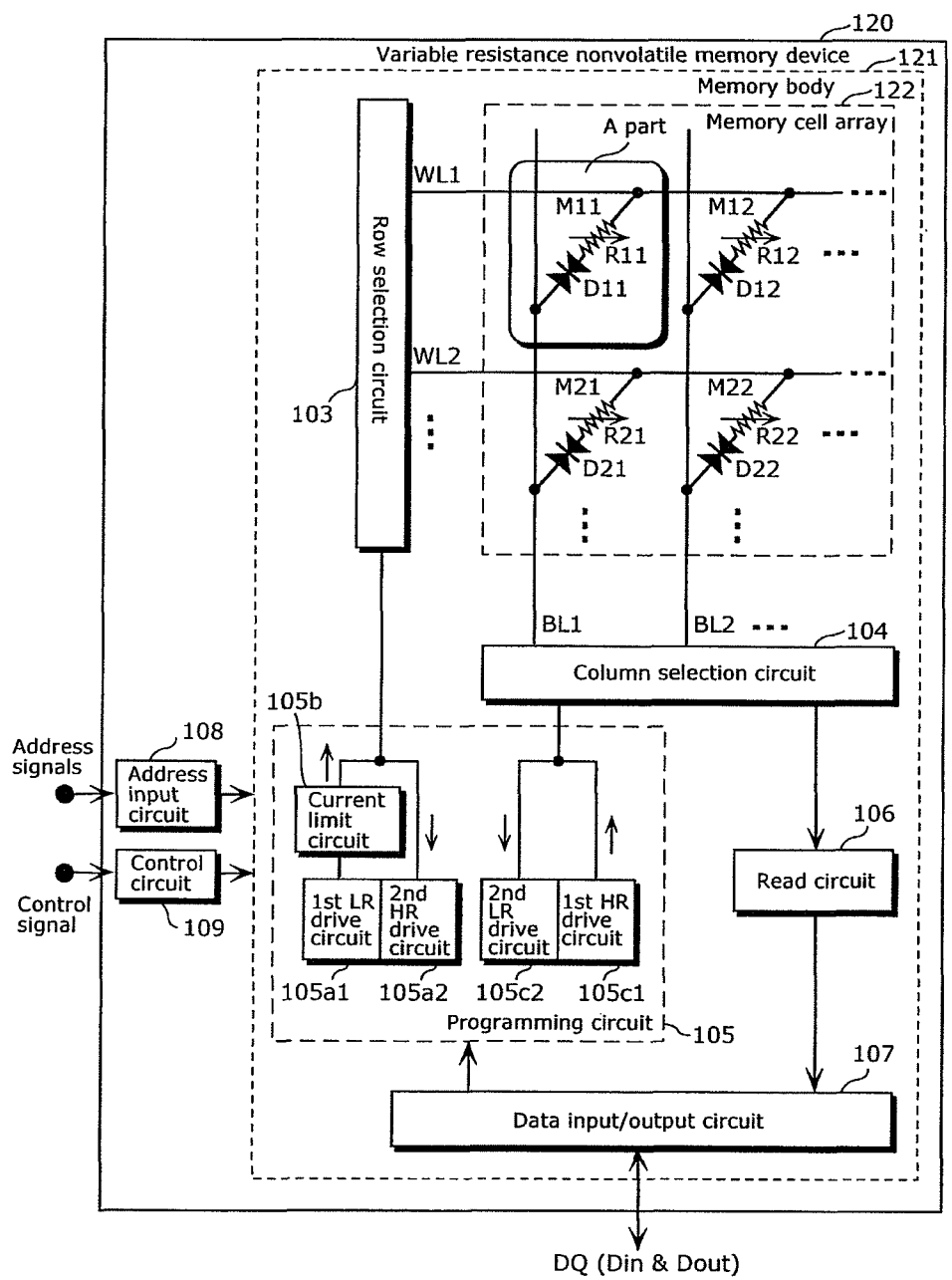
FIG. 35 is a configuration diagram of a variable resistance nonvolatile memory device according to a basic configuration in an embodiment of the present invention.

FIG. 35 is a block diagram showing a configuration of the variable resistance nonvolatile memory device according to the forth variation. It shows, as the fourth variation, a configuration of a memory cell that operates in the A mode in which the variable resistance phenomenon occurs presumably in the vicinity of the lower electrode, and an optimum control circuit for the configuration.

In FIG. 35, a variable resistance nonvolatile memory device 120 includes a memory body 121 on a semiconductor substrate, and the memory body 121 includes a memory array 122, a row selection circuit 103, a column selection circuit 104, a programming circuit 105, a read circuit 106 which detects an amount of current flowing to a selected bit line and determines whether stored data is "1" or "0", and a data input/output circuit 107 which inputs/outputs data via a terminal DQ.

An operation of the memory body 121 is controlled by output supplied thereto from an address input circuit 108 to which address signals are input from outside of the variable resistance nonvolatile memory device 120 and which selects and indicates a predetermined address, and a control circuit 109 to which a control signal is input.

The memory array 122 includes memory cells Mij (i and j are natural numbers satisfying i≤M and W≤N. The same applies to descriptions below.) arranged in a matrix of M rows and N columns (M and N are natural numbers.). In the memory cell Mij, one terminal of a variable resistance element Rij and one terminal of a current steering element Dij having both positive and negative threshold voltages are connected to each other in series. The other terminal of the variable resistance element Rij is connected to a bit line BLj, and the other terminal of the current steering element Dij is connected to a word line WLi. In FIG. 35, only the memory cells M11, M12, M21, and M22 for four bits of 2 rows×2 columns (the variable resistance elements R11, R12, R21, and R22, the current steering elements D11, D12, D21, and D22, the bit lines BL1 and BL2, and the word lines WL1 and WL2) are shown.

In the present configuration, the bit lines BLj are composed of lines in a lower layer and arranged in the vertical direction of the sheet of drawing, and the word lines WLi are composed of lines in an upper layer and arranged in the horizontal direction of the sheet of drawing. The variable resistance element Rij is configured so as to have characteristics of the A mode in which the variable resistance phenomenon occurs in the vicinity of the lower electrode of the variable resistance element.

The word lines WLi are connected to the row selection circuit 103, and in a read or programming mode, one row is selected.

The bit lines BLj are connected to the column selection circuit 104, and in a read or programming mode, one column is selected.

In the programming mode, the data input/output circuit 107 programs data in the variable resistance element Rij of the selected memory cell Mij so as to increase or decrease resistance, according to a programming instruction of the data "0" or the data "1" of the data input signal Din. In the present embodiment, writing the data "0" corresponds to resistance-decreasing programming while writing the data "1" corresponds to resistance-increasing programming.

The programming circuit 105 is connected to the data input/output circuit 107 and includes: the first LR drive circuit 105a1 for high voltage level driving in the writing of the data "0", i.e., the resistance-decreasing programming; a current limit circuit 105b to which an output of the first LR drive circuit 105a1 is input; and the second LR drive circuit 105c2 for low voltage level driving in the writing of the data "0", i.e., the resistance-decreasing programming. The programming circuit 105 further includes: the first HR drive circuit 105c1 for driving at high voltage level in the writing of the data "1", i.e., the resistance-increasing programming; and the second HR drive circuit 105a2 for driving at low voltage level in the writing of the data "1", i.e., the resistance-increasing programming.

Upon resistance-decreasing programming, a signal having current limited by the current limit circuit 105b is provided to the selection word line WLi via the row selection circuit 103. On the other hand, upon resistance-increasing programming, the first HR drive circuit 105c1 having no current limiting function provides a signal to the selected bit line BLj via the column selection circuit 104, which is one of the features.

In the variable resistance nonvolatile memory device 120 thus configured, the word line WLi and the bit line BLj are an example of the first signal line and the second signal line, respectively, according to an implementation of the present invention. The first LR drive circuit 105a1, the first HR drive circuit 105c1, the second LR drive circuit 105c2, and the second HR drive circuit 105a2 are an example of the first drive circuit, the second drive circuit, the third drive circuit, and the fourth drive circuit, respectively, according to an implementation of the present invention. The current limit circuit 105b is an example of the current limit circuit according to an implementation of the present invention. The row selection circuit 103 and the column selection circuit 104 are an example of the first selection circuit and the second selection circuit according to an implementation of the present invention.

Figure 36:
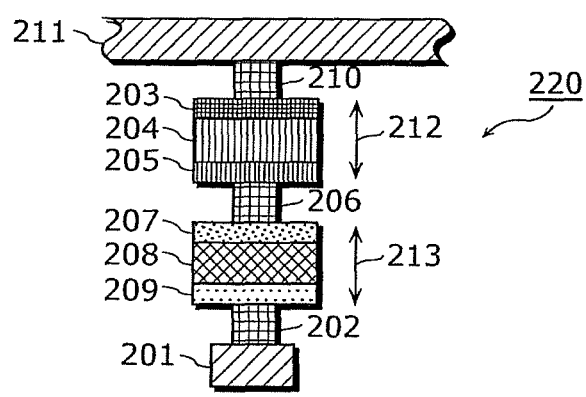
FIG. 36 is a cross-sectional diagram showing a configuration of a memory cell according to a basic configuration in an embodiment of the present invention.

FIG. 36 is a cross-sectional diagram showing a configuration of a memory cell M11 shown as an A part in FIG. 35.

A current steering element 212 and a variable resistance element 213 correspond respectively to a current steering element D11 and a variable resistance element R11 shown in FIG. 35.

As shown in FIG. 36, the memory cell 220 includes, in the following order: a first-layer line 201 comprising Al; a first via 202; a second electrode 209 of the variable resistance element comprising Pt, a variable resistance layer 208 comprising oxygen-deficient tantalum oxide, and a first electrode 207 of the variable resistance element comprising TaN; a second via 206; a fourth electrode 205 of the current steering element comprising TaN, a current steering layer 204 comprising nitrogen-deficient silicon nitride, and a third electrode 203 of the current steering element comprising TaN; a third via 210; and a second-layer line 211 comprising Al, and the first electrode 207 and the second electrode 209 in the variable resistance element contain different materials.

As another feature, the second electrode 209 located in a lower layer and connected on the side of the bit line BLj contains Pt having a higher standard electrode potential than the first, electrode 207 connected on the side of the word line WLi.

In the structure of this memory cell, as described above in the basic data of the present invention, the change in resistance occurs in the vicinity of the interface between the variable resistance layer 208 and the second electrode comprising Pt having a higher standard electrode potential than TaN comprised in the first electrode, and this behavior corresponds to the A mode.

As the first-layer line 201 of FIG. 36 corresponds to the bit line BL1 and the second-layer line 211 of FIG. 36 corresponds to the word line WL1, the variable resistance element 213 changes to the low resistance state when a voltage of the second-layer line 211 relative to a voltage of the first-layer line 201 becomes a predetermined voltage VLth or higher, and the variable resistance element 213 changes to the high resistance state when a voltage of the first-layer line 201 relative to a voltage of the second-layer line 211 becomes a predetermined voltage VHth or higher.

The specific circuitry layout of the programming circuit 105 is the same as that shown in FIGS. 23A and 23B.

In the programming mode, when an instruction is issued to write the data "0", that is, when the resistance-decreasing programming is instructed, C_NLR is set at low voltage level and C_LR is set at high voltage level so that the P-type MOS transistor MP1 of the first LR drive circuit 105a1 and the N-type MOS transistor MN2 of the second LR drive circuit 105c2 turn on, which form a current path for a current output from the first LR drive circuit 105a1, to flow into the second LR drive circuit 105c2 by way of a main path including the word line WLi, the memory cell Mij, and the bit line BLj.

As to the output of the current limit circuit 105b, the current is limited by the N-type MOS transistor MN3, and the output voltage VLR_O has an upper limit determined by VCL-Vth_MN3 where Vth_MN3 represents a threshold voltage of MN3. The current limit circuit 105b has the source follower characteristics as well and therefore operates as a constant power supply when the resistance-decreasing programming power supply voltage VLR is set to a predetermined level or higher.

In the programming mode, when an instruction is issued to write the data "1", that is, when the resistance-increasing programming is instructed, C_NHR is set at low voltage level and C_HR is set at high voltage level so that the P-type MOS transistor MP2 of the first HR drive circuit 105a1 and the N-type MOS transistor MN1 of the second HR drive circuit 105a2 turn on, which form a current path for a current output from the first HR drive circuit 105c1, to flow into the second HR drive circuit 105a2 by way of a main path including the bit line BLj, the memory cell Mij, and the word line WLi. This current path includes no current limit circuit, with the result that the current increases monotonically as the resistance-increasing programming power-supply VHR increases.

[Operation in Fourth Variation of Variable Resistance Nonvolatile Memory Device According to Basic Configuration in Embodiment of the Present Invention]

An operation of the variable resistance nonvolatile memory device 120 configured as above is described.

The voltage-current relation observed when a voltage is applied to the memory cell M11 of FIG. 35 is the same as that in the above-described basic configuration of the embodiment, that is, as shown in FIG. 24. In this case, however, the memory cell M11 (which is 220 in FIG. 36) operates in the A mode, which means that the polarity with which the first-layer line 201 has a high potential with respect to the second-layer line 211 in FIG. 36 is positive.

Characteristics of the programming circuit 105 in the fourth variation are the same as those in the basic configuration of the embodiment, that is, as shown in FIG. 25A, and the setting of the N-type MOS transistor MN3 in the current limit circuit 105b can be determined likewise from FIGS. 24 and 25B, which therefore will not be described again.

In addition, as described for the basic configuration (FIG. 21) of the embodiment, the current limit circuit 105b may be provided on the side of the second LR drive circuit 105c2. Likewise, it may also be possible that the current limit circuit 105b is disposed between the first electrode of the variable resistance element and the programming circuit 105 (refer to FIG. 26), that the current limit circuit 105b includes a P-type MOS transistor (refer to FIGS. 29A and 29B), and that the current limit circuit 105b is disposed between the second electrode of the variable resistance element and the programming circuit 105 (refer to FIG. 30).

Next, a behavior example, in a programming cycle, of the variable resistance nonvolatile memory device 120 according to the fourth variation of the basic configuration in the embodiment in the case where data is programmed in the device is described with reference to the timing chart shown in FIGS. 37A and 37B.

Figure 37B:
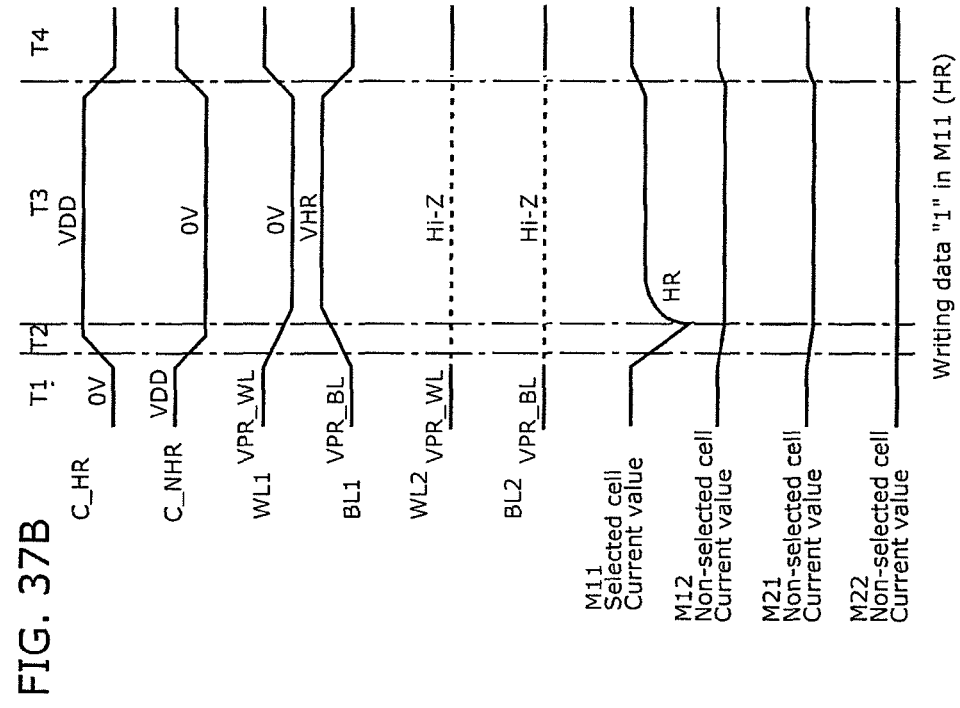
FIG. 37B shows a timing chart of the variable resistance nonvolatile memory device according to a basic configuration in an embodiment of the present invention.
Figure 37A:
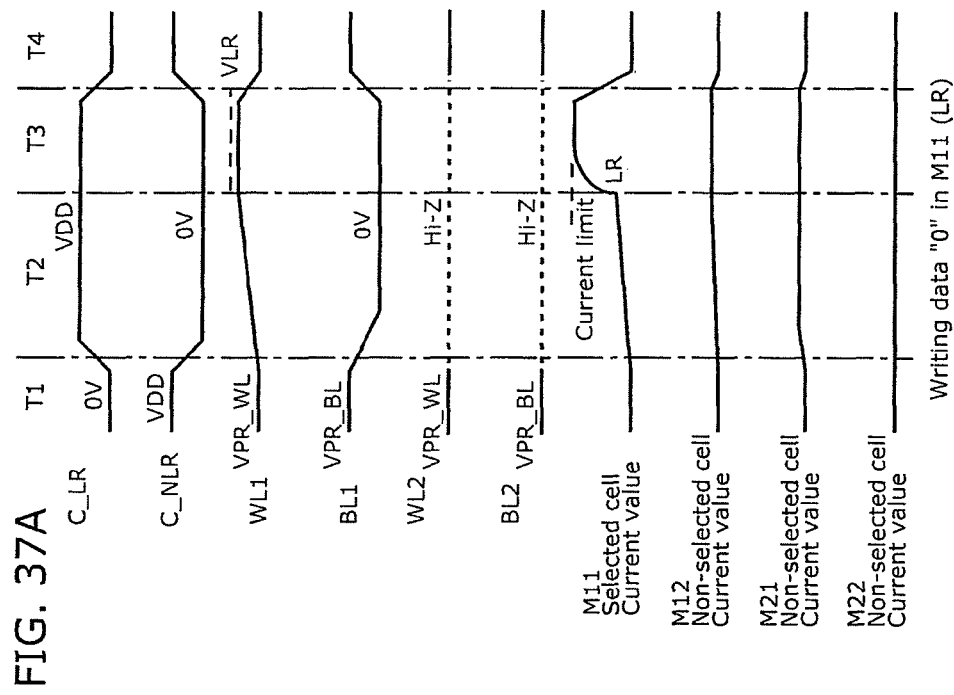
FIG. 37A shows a timing chart of the variable resistance nonvolatile memory device according to a basic configuration in an embodiment of the present invention.

FIGS. 37A and 37B are timing charts showing a behavior example of the nonvolatile memory device according to the fourth variation of the basic configuration in the embodiment of the present invention. FIG. 37A shows the case where data "0", i.e., low resistance state, is written, and FIG. 37B shows the case where data "1", i.e., high resistance, is written.

The following describes only the case where the memory cell M11 is selected and the programming and reading of data are performed. When M11 is a selected cell, M12 is a non-selected cell with a selected voltage in the word line and a non-selected voltage in the bit line, M21 is a non-selected cell with a non-selected voltage in the word line and a selected voltage in the bit line, and M22 is a non-selected cell with non-selected voltages in both of the word line and the bit line.

FIGS. 37A and 37B show also current which flows to the non-selected cells M12, M21 and M22 according to current flowing to the selected M11. In the current waveform, the current flowing in the direction from the word line to the bit line, that is, in the direction from the first electrode to the second electrode of the variable resistance element has positive polarity.

The following describes the behavior divided into periods T1 to T4, with reference to FIGS. 37A and 31B. In FIGS. 37A and 37B, VDD corresponds to the power supply voltage supplied to the variable resistance nonvolatile memory device 120.

In the cycle of writing data "0" in the memory cell M11 shown in FIG. 37A, all the word lines are previously charged to voltage VPR_WL, and all the bit line are previously charged to voltage VPR_BL. The voltage previously charged is voltage approximately intermediate of the maximum amplitude of each of the word lines and the bit lines.

The period T2 following the period T1 is a period in which the variable resistance element R11 is still in the high resistance state, and the row selection circuit 103 selects the word line WL1 and the column selection circuit 104 selects the bit line BL1, and the selected word line WL1 is driven to VLR with use of the first LR drive circuit 105a1 and the selected bit line BL1 is driven to 0 V with use of the second LR drive circuit 105c2. Over time, the voltage of WL1 increases and the voltage of BL1 decreases, and while the voltage of the bit line BL1 drops in a relatively high speed, the voltage of the word line WL1 which is driven via the current limit circuit 105b increases gradually.

The period T3 is a period in which programming or a change in resistance occurs, causing a change to the low resistance state. In the period T3, the value of current flowing to the selected cell M11 increases, and the programming is performed from the high resistance value to the low resistance value at a point of application, to the variable resistance element R11, of a voltage having such an absolute value that the first electrode 207 has a low resistance voltage VLth of the variable resistance element with respect to the second electrode 209. As the resistance decreases, the current flowing to the memory cell M11 increases, but the value of current will not increase over a certain value because of the current limit circuit 105b. The decrease in resistance therefore stops with the certain resistance value.

After that, in the period T4, the selection of the word line and the bit line was released, and all the word lines are previously charged to voltage VPR_WL while all the bit lines are previously charged to voltage VPR_BL, thus completing the writing of the data "0".

In the cycle of writing the data "1" in the memory cell M11 shown in FIG. 37B, all the word lines are previously charged to voltage VPR_WL while all the bit lines are previously charged to voltage VPR_BL in the period T1. The voltage previously charged is voltage approximately intermediate of the maximum amplitude of each of the word lines and the bit lines.

The period T2 following the period T1 is a period in which the variable resistance element R11 is still in the low resistance state, and the row selection circuit 103 selects the word line WL1 and the column selection circuit 104 selects the bit line BL1, and the selected bit line BL1 is driven to VHR with use of the first HR drive circuit 105c1 and the selected word line WL1 is driven to 0 V with use of the second HR drive circuit 105a2. Over time, the voltage of BL1 increases and the voltage of WL1 decreases, and because of no current limit circuit placed, the voltage of both the word line WL1 and the bit line BL1 changes in relatively high speed.

The period T3 is a period in which programming or a change in resistance occurs, causing a change to the high resistance state. In the period T3, the value of current flowing to the selected cell M11 increases, and the programming is performed on the variable resistance element 213 from the low resistance value to the high resistance value at a point of application, to the second electrode 209, of a voltage having an absolute value which exceeds a high resistance voltage VHth of the variable resistance element with respect to the first electrode 207.

After that, in the period T4, the selection of the word line WL1 and the bit line BL1 was released, and all the word lines are previously charged to voltage VPR_WL while all the bit lines are previously charged to VPR_BL, thus completing the writing of the data "1".

It is to be noted that the structure of the memory cell Mij is not limited to the structure shown in FIG. 36 and may be one as follows which exhibits the A mode characteristics.

FIGS. 38A to 38D all show the other examples of a memory cell operating in the A mode, each of which has a structure holding a variable resistance layer between an upper electrode and a lower electrode as in the case of FIG. 36 and in each of which the electrodes contain mutually different materials and the material of the lower electrode has a higher standard electrode potential than that of the upper electrode.

FIG. 38A shows a memory cell in which the variable resistance element 213 and the current steering element 212 are provided in contact without the second via 206.

As compared to FIG. 38A, FIG. 38B shows a memory cell in which the fourth electrode 205 comprising TaN of the current steering element 212 and the first electrode comprising TaN of the variable resistance element 213 are shared. This memory cell is easy to manufacture because of the shared electrode.

FIG. 38C shows a memory cell in which the variable resistance element 213 and the current steering element 212 each have the same diameter as the second via 206. With the same diameter as the second via 206, this memory cell can be disposed in the minimum interval of lines, allowing for a reduction in area. This memory cell is one example in which a size of section (including the above diameter as an example), orthogonal to the stacking direction, of the variable resistance element 213 and the current steering element 212 is set to be equal to or smaller than that of the via.

As compared to FIG. 38C, FIG. 38D shows a memory cell in which the first-layer line 201 contains Pt so that the first-layer line is used as the second electrode of the variable resistance element 213, and the second-layer line 211 contains TaN so that the second-layer line is used as the third electrode of the current steering element 212. In this case, it is no longer necessary to provide the second electrode of the variable resistance element 213 and the third electrode of the current steering element 212, which allows for a reduction in area. While FIG. 38D shows an example in which both of the second-layer line 211 and the first-layer line 201 are shared by respective ends of the memory cell, it may also be possible that only one of these is shared.

While the above describes configuration examples in which the variable resistance element 213, the current steering element 212, and the second-layer line 211 are positioned in this order on the first-layer line 201, it may also be possible in the cases of FIGS. 36, 38A, 38C, and 38D that the current steering element 212, the variable resistance element 213, and the second-layer line 211 are positioned in this order on the first-layer line 201. In such a configuration, the fourth electrode 205, the current steering layer 204, and the third electrode 203, of the current steering element 212, and the second electrode 209, the variable resistance layer 208, and the first electrode 207, of the variable resistance element 213, and the second-layer line 211 are formed in this order on the first-layer line 201.

Figure 39:
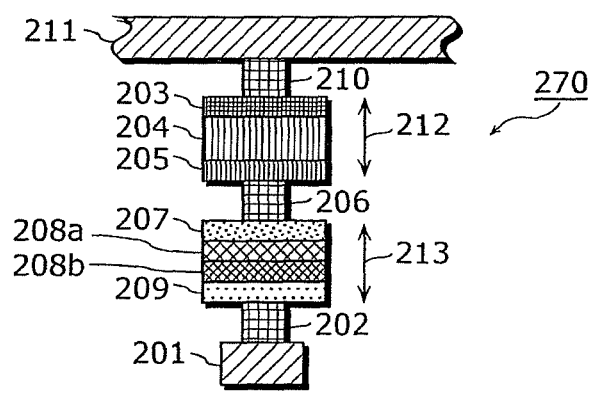
FIG. 39 is a cross-section diagram showing another configuration of the memory cell according to a basic configuration in an embodiment of the present invention.

FIG. 39 shows one example of a memory cell 270 which operates in the A mode with another structure. Parts common with FIG. 36 have the same numeric identifiers.

As shown in FIG. 39, the memory cell 270 includes, in this order, the first-layer line 201 comprising Al, the first via 202, the second electrode 209 of the variable resistance element comprising Pt, the second tantalum oxide layer 208b having a high oxygen content atomic percentage, the first tantalum oxide layer 208a having a low oxygen content atomic percentage, the first electrode 207 of the variable resistance element comprising Pt, the second via 206, the fourth electrode 205 of the current steering element comprising TaN, the current steering layer 204 comprising nitrogen-deficient silicon nitride, the third electrode 203 of the current steering element comprising TaN in the current steering element, the third via 210, and the second-layer line 211 comprising Al, and is characterized in that the second tantalum oxide layer 208b is formed in contact with the second electrode 209 that is the lower electrode of the variable resistance element.

In this configuration, as disclosed in the related application of the present invention cited in the basic data for the present invention, a change in resistance occurs in the vicinity of the interface between the second electrode 209 that is the lower electrode and the second tantalum oxide layer 208b, and this behavior corresponds to the A mode.

FIGS. 40A to 40C all show the other examples of a memory cell operating in the A mode, each of which has a structure holding a variable resistance layer between an upper electrode and a lower electrode as in the case of FIG. 39 and in each of which the second tantalum oxide layer having a high oxygen content atomic percentage is provided in contact with the lower electrode.

FIG. 40A shows a memory cell in which the variable resistance element 213 and the current steering element 212 are provided in contact without the second via 206.

FIG. 40B shows a memory cell in which the variable resistance element 213 and the current steering element 212 each have the same diameter as the second via 206. With the same diameter as the second via 206, this memory cell can be disposed in the minimum interval of lines, allowing for a reduction in area. This memory cell is one example in which a size of section (including the above diameter as an example), orthogonal to the stacking direction, of the variable resistance element 213 and the current steering element 212 is set to be equal to or smaller than that of the via.

As compared to FIG. 40B, FIG. 40C shows a memory cell in which the first-layer line 201 contains Pt so that the first-layer line is used as the second electrode of the variable resistance element 213, and the second-layer line 211 contains TaN so that the second-layer line is used as the third electrode of the current steering element 212. In this case, it is no longer necessary to provide the second electrode of the variable resistance element 213 and the third electrode of the current steering element 212, which allows for a reduction in area. While FIG. 40C shows an example in which both of the second-layer line 211 and the first-layer line 201 are shared by respective ends of the memory cell, it may also be possible that only one of these is shared.

While the above describes configuration examples in which the variable resistance element 213, the current steering element 212, and the second-layer line 211 are positioned in this order on the first-layer line 201, it may also be possible in the cases of FIGS. 39 and 40A to 40C that the current steering element 212, the variable resistance element 213, and the second-layer line 211 are positioned in this order on the first-layer line 201. In such a configuration, the fourth electrode 205, the current steering layer 204, and the third electrode 203, of the current steering element 212, and the second electrode 209, the variable resistance layer 208, and the first electrode 207, of the variable resistance element 213, and the second-layer line 211 are formed in this order on the first-layer line 201.

Needless to say, it is also possible to provide a configuration which combines different electrodes and a tantalum oxide layer having a different concentration, such as a configuration in which the lower electrode contains a material having a higher standard electrode potential, like the electrode configuration of FIGS. 36 and 38A to 38D, and the second tantalum oxide layer having a high oxygen content atomic percentage shown in FIGS. 39 and 40A to 40C is provided in contact with the lower electrode. Furthermore, the third electrode 203 or the third electrode 203 and the current steering layer 204 may be formed in the same wiring pattern on the second-layer line 211. The second electrode 209 may also be formed in the same wiring pattern under the first-layer line 201.

[Variable Resistance Nonvolatile Memory Device According to Embodiment of the Present Invention]

The following describes an embodiment of the present invention in detail based on the basic configuration in the embodiment of the present invention and the first to fourth variations thereof, which have been described so far.

According to the basic configuration in the embodiment and the first to fourth variations thereof described above, the resistance of the variable resistance element is increased by flowing current from the HR drive circuit connected on the side of the second electrode of the variable resistance element while the resistance of the variable resistance element is decreased by flowing current from the LR drive circuit connected on the side of the first electrode of the variable resistance element via the current limit circuit and controlling the current limit circuit. By so doing, the supply of a smaller amount of current than an amount of current supplied for the change to the high resistance state makes it possible to prevent more current than expected from flowing to the memory cells, so that the variable resistance elements can have desired resistance values with small variation. Moreover, the prevention of current more than expected from flowing to the memory cells leads to the prevention of the current steering elements from degraded reliability and breakage.

However, when the resistance of the variable resistance element is decreased, the current is provided via the current limit circuit, which prolongs the charging and discharging time for the bit line or the word line and thereby reduces the programming speed.

The current limit function only needs to have been performed at the time when the variable resistance element changes to the low resistance state, and there is no need to limit current from a start of the resistance-decreasing programming to a change of the variable resistance element to the low resistance state. The present embodiment therefore provides a boost circuit that improves the capability of driving current, to allow a reduction in the charging and discharging time for the bit line or the word line by using the boost circuit, in addition to the current limit circuit, from a start of the programming to the low resistance state to a change of the variable resistance element to the low resistance state, with the result that the programming speed can be improved.

As an embodiment of the variable resistance nonvolatile memory device according to an implementation of the present invention, a 1D1R cross point memory device which includes a boost circuit in addition to the current limit circuit is described below. Descriptions on configurations which are the same as the basic configuration of the embodiment and variations thereof described above will be accordingly omitted hereinbelow.

Figure 41:
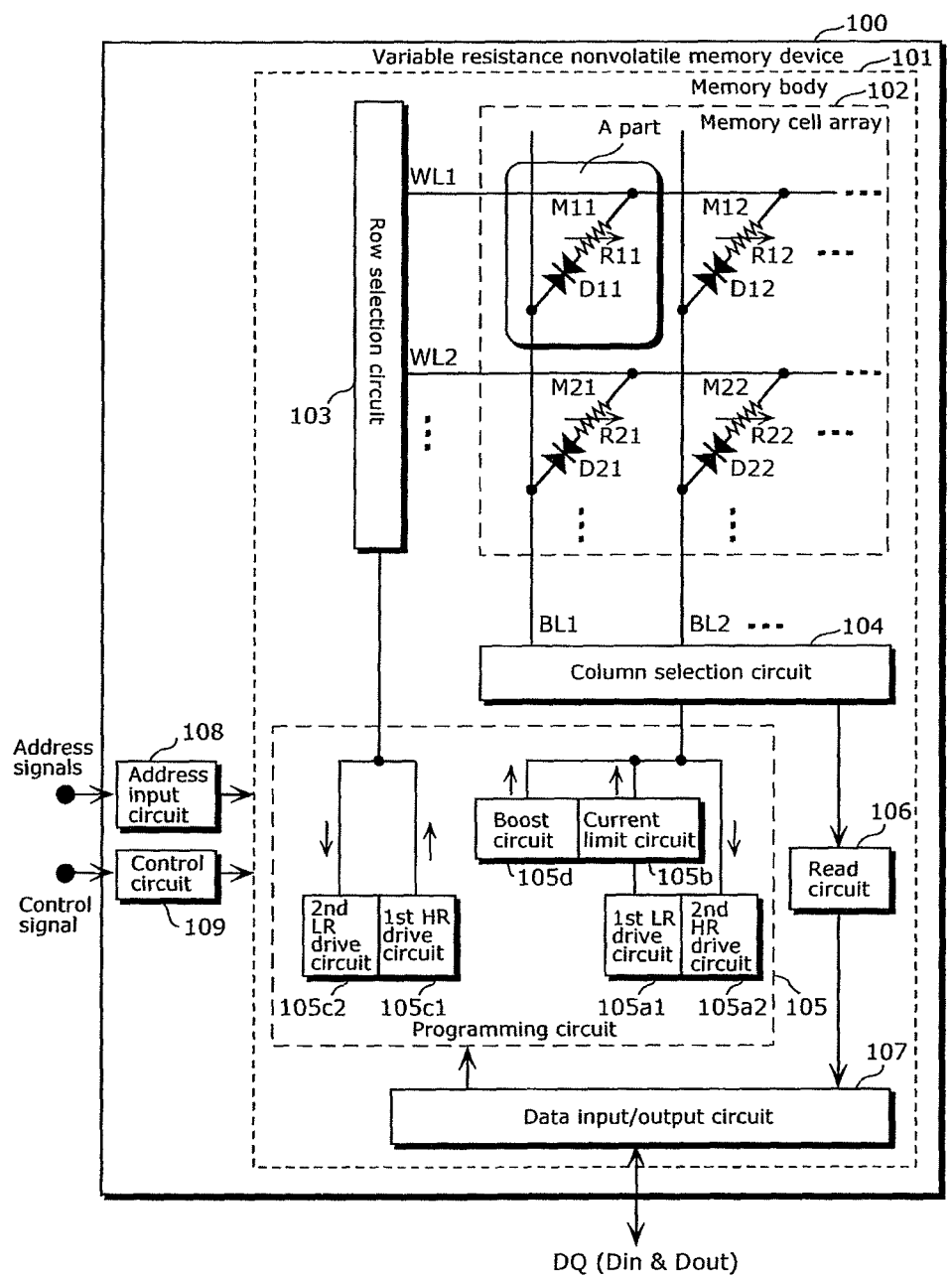
FIG. 41 is a configuration diagram of a variable resistance nonvolatile memory device according to an embodiment of the present invention.

FIG. 41 is a block diagram showing a configuration of the nonvolatile memory device according to the embodiment of the present invention. It shows, as this embodiment, a configuration of a memory cell that operates in the B mode in which the variable resistance phenomenon occurs presumably in the vicinity of the upper electrode, and a control circuit which is capable of performing an optimum control for the configuration and capable of reducing speed degradation caused by such a control. In the following descriptions for the present embodiment, the variable resistance element operates in the B mode, and to the case where the variable resistance element operates in the A mode, the fourth embodiment of the basic configuration in the embodiment described above applies.

In FIG. 41, the variable resistance nonvolatile memory device 100 includes the memory body 101 on the semiconductor substrate. The memory body 101 includes the memory array 102, the row selection circuit 103, the column selection circuit 104, the programming circuit 105, the read circuit which detects an amount of current flowing to a selected bit line and determines whether stored data is "1" or "0", and the data input/output circuit 107 which inputs/outputs data via the terminal DQ.

Furthermore, the variable resistance nonvolatile memory device 100 includes the address input circuit 108 to which address signals are input from outside of the variable resistance nonvolatile memory device 100 and which selects and indicates a predetermined address, and the control circuit 109 to which a control signal is input. Signals output from these address input circuit 108 and control circuit 109 are provided to the memory body 101 to control an operation of the memory body 101.

The memory array 102, the row selection circuit 103, the column selection circuit 104, and the data input/output circuit 107 are the same as those in FIG. 21.

In the memory array 102, the plurality of memory cells M11, M12, M21, and M22 are placed at cross points of the plurality of bit lines BL1 and BL2 with the plurality of word lines WL1 and WL2. The both ends of a memory cell placed at each of the cross points are connected to a pair of the bit line and the word line which intersect with each other.

Each memory cell Mij includes: a variable resistance element Rij that changes to the low resistance state in which the resistance value falls within the first range, when the first voltage of the first polarity determined in advance is applied, and changes to the high resistance state in which the resistance value falls within the second range that is higher than the first range, when the second voltage of the second polarity opposite to the first polarity is applied; and a two-terminal current steering element Dij connected in series to the variable resistance element Rij.

The programming circuit 105 generates bipolar voltages which are applied to the plurality of memory cells Mij via the plurality of bit lines BLj and the plurality of word lines WLi. The programming circuit 105 is connected to the data input/output circuit 107. The programming circuit 105 includes: the first LR drive circuit 105a1 for high voltage level driving in the writing of the data "0", i.e., the resistance-decreasing programming; a current limit circuit 105b to which an output of the first LR drive circuit 105a1 is input; the second LR drive circuit 105c2 for low voltage level driving in the resistance-decreasing programming: and a boost circuit 105d for high voltage level driving for a certain period of time after a start of the programming. The programming circuit 105 further includes: the first HR drive circuit 105c1 for high voltage level driving in the writing of the data "1", i.e., the resistance-increasing programming; and the second HR drive circuit 105a2 for low voltage level driving in the writing of the data "1", i.e., the resistance-increasing programming.

Upon resistance-decreasing programming, the programming circuit 105 provides a signal having current limited by the current limit circuit 105b, to the selected bit line BLj via the column selection circuit 104, and furthermore, for a certain period of time after a start of the resistance-decreasing programming, the programming circuit 105 provides the signal, not via the current limit circuit 105b, but from the boost circuit 105d to the selected bit line BLj via the column selection circuit 104. On the other hand, upon resistance-increasing programming, the programming circuit 105 provides a signal from the first HR drive circuit 105c1 having no current limiting function to the selected word line WLi via the row selection circuit 103, which is one of the features.

In the variable resistance nonvolatile memory device 100 thus configured, the bit line BLj and the word line WLi are an example of the first signal line and the second signal line, respectively, according to an implementation of the present invention. The first LR drive circuit 105a1, the first HR drive circuit 105c1, the second LR drive circuit 105c2, and the second HR drive circuit 105a2 are an example of the first drive circuit, the second drive circuit, the third drive circuit, and the fourth drive circuit, respectively, according to an implementation of the present invention. The current limit circuit 105b is an example of the current limit circuit according to an implementation of the present invention, and the boost circuit 105d is an example of the boost circuit according to an implementation of the present invention. The column selection circuit 104 and the row selection circuit 103 are the examples of the first selection circuit and the second selection circuit according to an implementation of the present invention.

The cross-sectional diagram showing a configuration of the memory cell M11 is the same as that in FIG. 22. Furthermore, the first LR drive circuit 105a1, the first HR drive circuit 105c1, the second LR drive circuit 105c2, and the second HR drive circuit 105a2 can each be implemented with a circuitry layout shown in FIG. 23A, 23B, 25A, 28A, 29A or 29B.

The current limit circuit 105b is inserted into a path of a current flowing from the programming circuit 105 to the plurality of memory cells. Furthermore, the current limit circuit 105b limits only the first current among the first current that flows in a direction for changing the plurality of memory cells to the low resistance state and the second current that flows in a direction for changing the plurality of memory cell to the high resistance state.

The boost circuit 105b includes an output terminal 130 connected to the path of a current flowing from the programming circuit 105 to the plurality of memory cells. Furthermore, upon changing any one of the plurality of memory cells to the low resistance state, the boost circuit 105d increases the first current by short-circuiting the output terminal 130 to a boost voltage supply during the first period before the memory cell changes to the low resistance state.

Figure 42:
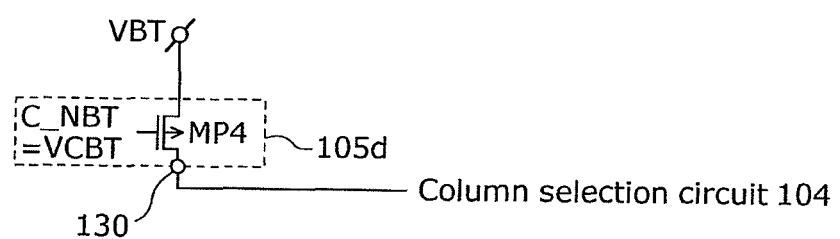
FIG. 42 is a circuit diagram showing an implementation of a boost circuit according to an embodiment of the present invention.

FIG. 42 shows one example of a specific circuitry layout of the boost circuit 105d included in the programming circuit 105 of FIG. 41. The first LR drive circuit 105a1, the second HR drive circuit 105a2, the first HR drive circuit 105c1, the second LR drive circuit 105c2, and the current limit circuit 105b which are included in the programming circuit 105 are the same as those shown in any one of FIGS. 23A, 23B, 25A, 28A, 29A and 29B.

The boost circuit 105d includes a P-type MOS transistor MP4 which functions as a switch. This P-type MOS transistor MP4 is connected between the boost voltage supply and the output terminal 130. Specifically, the source terminal of the P-type MOS transistor MP4 is connected to the boost voltage supply, and the drain terminal of the P-type MOS transistor MP4 is connected to the output terminal 130.

C_NBT indicates a boost control signal which is at low voltage level when pulses for resistance-decreasing programming are being generated and in a certain period of time after activation of the pulses (in a certain period of time after a start of the programming to the low resistance state). This means that the P-type MOS transistor MP4 is in on-state in the above certain period of time (the first period) and turns off before the memory cell changes to the low resistance state.

Furthermore, the source terminal of the P-type MOS transistor MP4 is supplied with a boost power supply voltage VBT supplied from the boost voltage supply, so that the P-type MOS transistor MP4 is capable of supplying enough boost current.

In the programming mode, when an instruction is issued to write the data "0", that is, when the resistance-decreasing programming is instructed, C_NBT is set at low voltage level (voltage: VCBT) for a certain period of time (several ns to several tens of ns) from a start of the resistance-decreasing programming to the change of the memory cell to the low resistance state so that the P-type MOS transistor MP4 of the boost circuit 105d is in on-state, which form a path of a current flowing from the boost voltage supply that provides the boost power supply voltage VBT, into the second LR drive circuit 105c2 by way of the boost circuit 105d, the bit line BLj, the memory cell Mij, and the word line WLi. In addition, in any one of the circuits shown in FIGS. 23A, 23B, 25A, 28A, 29A, and 29B, C_NLR is set at low voltage level and C_LR is set at high voltage level so that the P-type MOS transistor MP1 of the first LR drive circuit 105a1 and the N-type MOS transistor MN2 of the second LR drive circuit 105c2 turn on, which form a current path for a current output from the first LR drive circuit 105a1, to flow into the second LR drive circuit 105c2 by way of a main path including the current limit circuit 105b, the bit line BLj, the memory cell Mij, and the word line WLi. As to the output of the current limit circuit 105b, the current is limited by the N-type MOS transistor MN3, and the output voltage VLR_O has an upper limit determined by VCL-Vth_MN3 where Vth_MN3 represents a threshold voltage of the transistor MN3. The current limit circuit 105b has the source follower characteristics as well and therefore operates as a constant power supply when the resistance-decreasing programming power supply voltage VLR is set to a predetermined level or higher. Thus, the current flowing to the memory cells becomes constant.

It is to be noted that the current limit circuit 105b may operate at the same time as the boost circuit 105d. At this time, the current from the boost circuit 105d becomes dominant so that previous charging of a line connected to the selected memory cell is performed promptly.

The boost circuit 105d, however, needs to be turned off before the voltage which is applied to the selected variable resistance element reaches the low resistance voltage VLth of the variable resistance element, so as to make the above current limiting effective.

In the programming mode, when an instruction is issued to write the data "1", that is, when the resistance-increasing programming is instructed, the above-described basic configuration in the embodiment applies.

[Operation of Variable Resistance Nonvolatile Memory Device According to Embodiment of the Present Invention]

An operation of the variable resistance nonvolatile memory device 100 configured as above is described. An operation of the memory cell is the same as that described above according to the basic configuration in the embodiment, and is therefore not described below.

FIG. 43A shows a temporal voltage change of the bit line BL1, observed in a simulation, in the resistance-decreasing programming using the programming circuit shown in. FIG. 25A. As in the above-described case of the basic configuration in the embodiment, the variable resistance element R11 of the memory cell 11 has a fixed resistance of 10 kΩ for the low resistance state, for example. Furthermore, in FIG. 43A, a broken line indicates, for comparison, a temporal voltage change of the bit line BL1 in the case where the current limit circuit 105b is not used.

As shown in FIG. 43A, it is found that the voltage of bit line BL1 has a lower rising speed when the current limit circuit 105b is used. This increases the length of time from the setting of C_LR at high voltage level to when the voltage which is applied to the variable resistance element R11 of the memory cell 11 reaches the low resistance voltage VLth, as compared to the case where the current limit circuit 105b is not used.

In contrast, FIG. 43B shows a temporal voltage change of the bit line BL1 observed when, in addition to the programming circuit shown in FIG. 25A, the boost circuit 105d is connected, and the boost control signal C_NBT is set at low voltage level for a certain period of time after a start of the resistance-decreasing programming to when the voltage of the selected bit line BL1 reaches the low resistance voltage VLth. As shown in FIG. 43B, it is found that, as compared to FIG. 43A, the voltage of bit line BL1 has a higher rising speed, and the length of time from the setting of C_LR at high voltage level to when the voltage which is applied to the variable resistance element R11 of the memory cell 11 reaches the low resistance voltage VLth is shorter.

As described in the above basic configuration of the embodiment, the current limit needs to be performed at the time when the variable resistance element changes to the low resistance state at the latest. An adjustment therefore has desirably been made such that the boost control signal C_NBT becomes high voltage level immediately before the variable resistance element starts to change to the low resistance state and thereby cuts off output of the boost circuit 105d.

The boost control signal C_NBT is, for example, generated by the control circuit 109 or the like.

Furthermore, the driving capability of the boost circuit 105d shown in FIG. 42 can be adjusted by adjusting one or both of the boost power supply voltage VBT and the boost control voltage VCBT (the gate voltage of the P-type MOS transistor MP4). By increasing the boost power supply voltage VBT or decreasing the boost control voltage VCBT to enhance the capability of supplying current to the bit lines, it is possible to shorten the length of time from the setting of C_LR at high voltage level to when the voltage which is applied to the variable resistance element R11 of the memory cell M11 reaches the low resistance voltage VLth.

When the boost power supply voltage VBT decreases or the boost control voltage VCB increases, it is possible to reduce the voltage which is applied to the memory cell upon activation of the boost circuit 105d. As a result, the resistance-decreasing programming can be performed more stably. Furthermore, when the boost power supply voltage VBT is set at a value equal to or less than the low resistance voltage VLth of the variable resistance element, no current is supplied from the boost circuit 105d, but current is supplied only from the current limit circuit 105b at the time when the resistance of the variable resistance element decreases, which enables reliable current limit for the variable resistance element.

Figure 44:
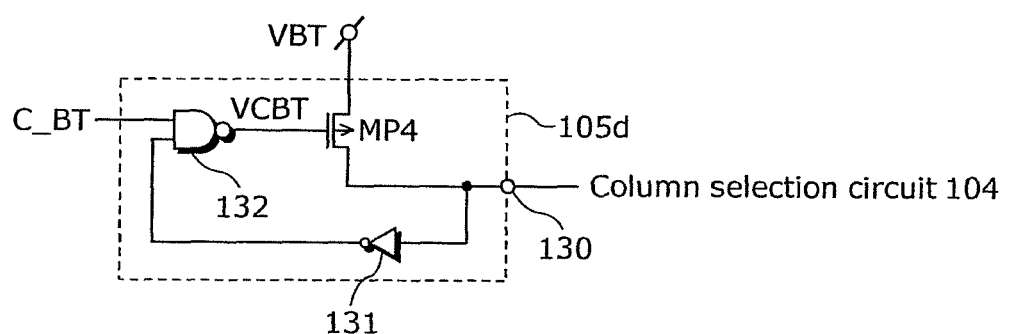
FIG. 44 is a circuit diagram showing another implementation of a boost circuit according to an embodiment of the present invention.

The boost control voltage VCBT is at low voltage level (the P-type MOS transistor MP4 is in on-state) for a certain period of time until the variable resistance element of the memory cell changes to the low resistance state. This certain period of time may be determined using an output signal of the boost circuit 105d as shown in FIG. 44. That is, the boost circuit 105d may use a feedback signal of a voltage of the output terminal 130, and turn off the P-type MOS transistor MP4 when the voltage of the output terminal 130 reaches a predetermined voltage after the P-type MOS transistor MP4 is turned on.

The boost circuit 105*d* shown in FIG. 44 further includes an inverter 131 and a NAND circuit 132.

The drain terminal (the output terminal 130) of the P-type MOS transistor MP4 is connected to one input terminal of the NAND circuit 132 via the inverter 131. Furthermore, to the other input terminal of the NAND circuit 132, a boost control signal C_BT is input. Herein, C_BT indicates a boost control signal which is set at high voltage level for a certain period of time after a start of the resistance-decreasing programming. Owing to the configuration shown in FIG. 44, while the output voltage of the boost circuit 105*d* is low, VCBT is at low voltage level and the boost circuit 105*d* is in on-state. When the output voltage of the boost circuit 105*d* increases, then VCBT becomes high voltage level and the boost circuit 105*d* is turned off.

Figure 45:
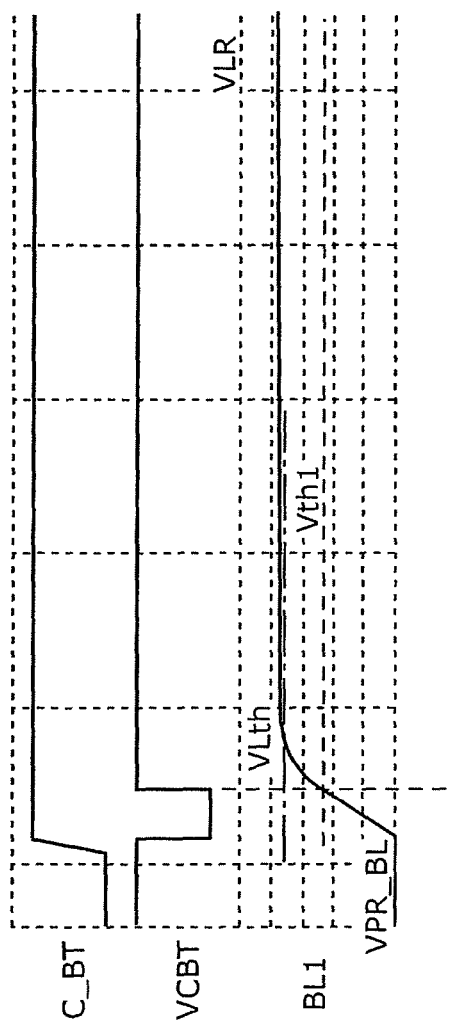
FIG. 45 shows operations of another programming circuit according to an embodiment of the present invention.

FIG. 45 shows a temporal voltage change of each signal in this case. As shown in FIG. 45, when the boost control signal C_BT changes from low to high, the control voltage VCBT changes from high to low. This turns on the P-type MOS transistor MP4 and thereby turns on the boost circuit 105*d*.

Subsequently, when the voltage of the output terminal 130 (BL1) becomes equal to or more than a predetermined voltage Vth1, the control voltage VCBT changes from low to high. This turns off the P-type MOS transistor MP4 and thereby turns off the boost circuit 105*d*.

It is to be noted that the voltage Vth1 is lower than the low resistance voltage VLth. Furthermore, this voltage Vth1 is determined according to a logic threshold voltage (an input voltage which changes an output voltage) of the inverter 131.

When it is designed such that the output signal of the inverter 131 of FIG. 44 changes slowly with respect to an input signal, and likewise, it is designed such that the output signal of the NAND circuit 132 changes slowly with respect to an input signal, the boost control voltage VCBT changes gradually from low to high along with an increase in the output voltage of the boost circuit 105*d*. This allows a gradual decrease in the driving capability of the boost circuit 105*d*. With this configuration, it is possible to more appropriately control the current driving capability of the boost circuit 105*d*.

Furthermore, using a commonly-used replica circuit (in which a reference cell has the same structure of a memory cell), a signal which inverts the logic may be generated until the low resistance voltage VLth is applied to the variable resistance element, and the period in which the logic is inverted by the signal may be used as the above certain period of time.

Figure 46:
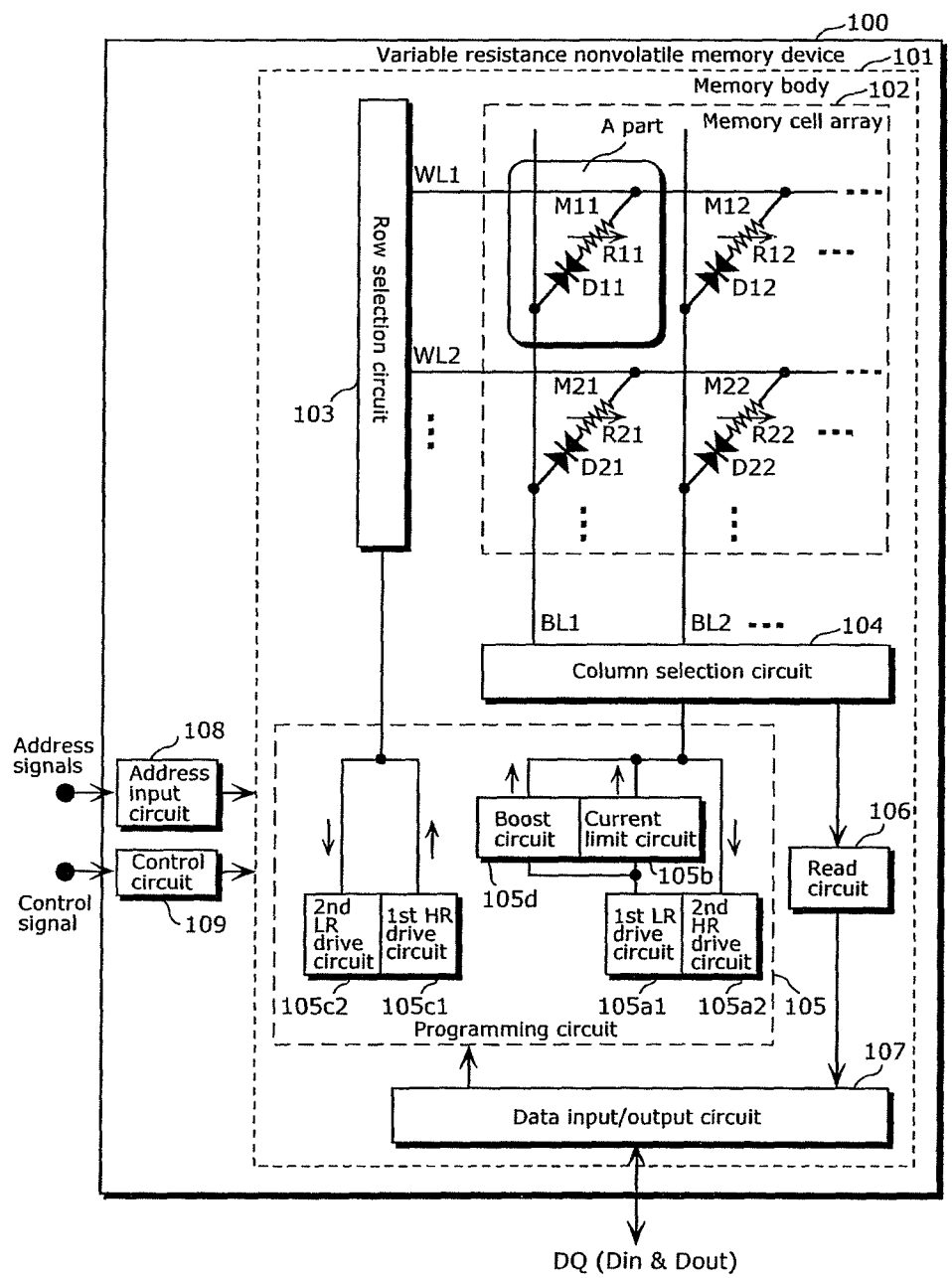
FIG. 46 is another configuration diagram of a variable resistance nonvolatile memory device according to an embodiment of the present invention.

With the configuration of FIG. 41, the boost circuit 105*d* is connected to the column selection circuit 104 so that drive current is supplied from the boost voltage supply which supplies the voltage VBT, but it may be such that, as shown in FIG. 46, the boost circuit 105*d* is connected to the column selection circuit 104 and the first LR drive circuit 105*a*1 so that the boost current is supplied to the boost circuit 105*d* from the first LR drive circuit 105*a*1 serving as a voltage supply.

In other words, with the configuration shown in FIG. 46, the boost circuit 105*d* is connected in parallel to the current limit circuit 105*b*. Furthermore, the current limit circuit 105*b* and the boost circuit 105*d* are interposed between the first LR drive circuit 105*a*1 and the column selection circuit 104.

[First Variation of Variable Resistance Nonvolatile Memory Device According to Embodiment of the Present Invention]

Figure 47:
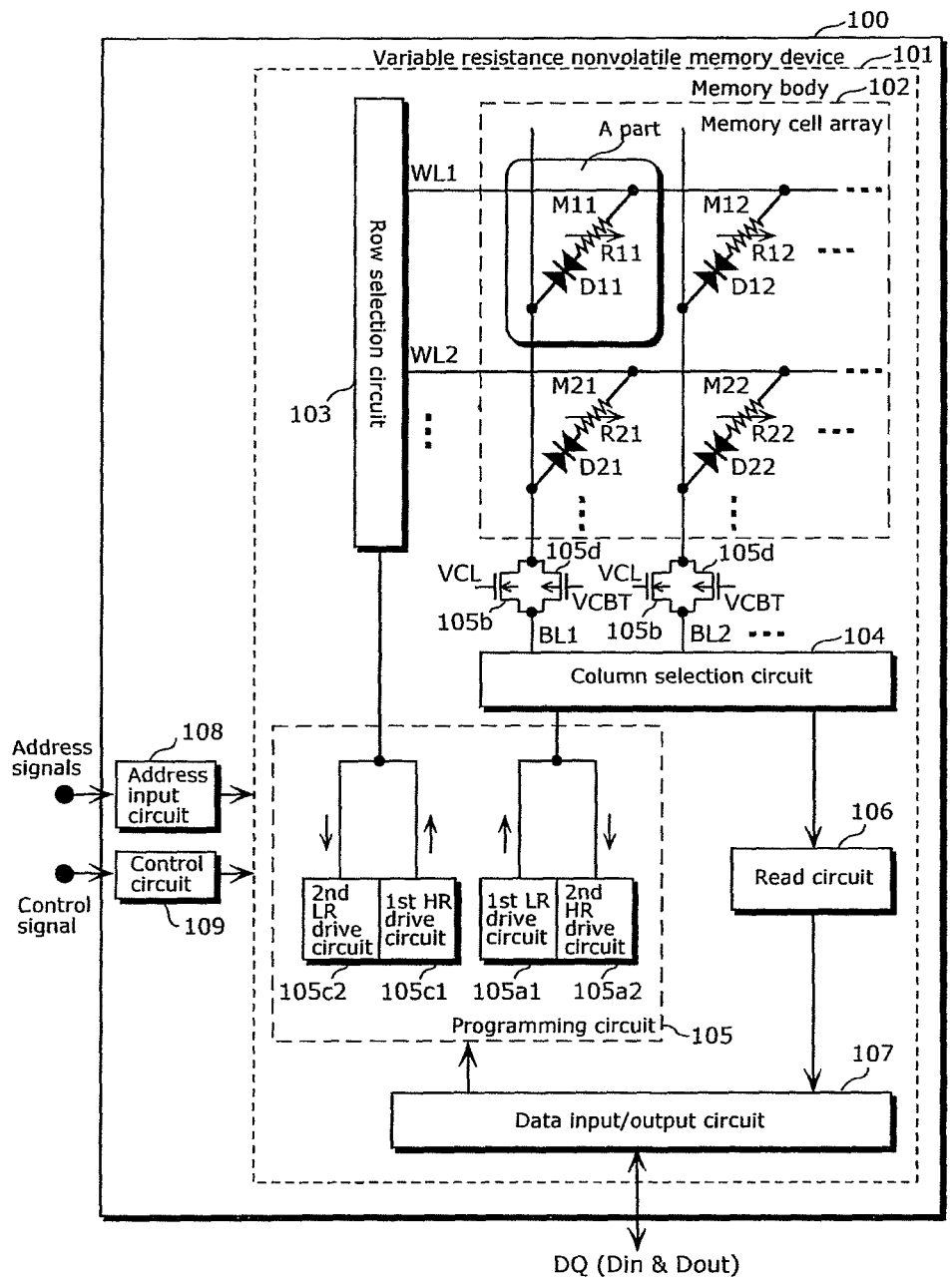
FIG. 47 is a configuration diagram of a variable resistance nonvolatile memory device according to the first variation of an embodiment of the present invention.

FIG. 47 shows the first variation which is different from FIG. 41, in which variation the boost circuit 105*d* in the embodiment includes the P-type MOS transistor.

In FIG. 47, the boost circuit 105*d* is positioned between the first electrode of the variable resistance element and the column selection circuit 104. This is equivalent to a configuration in which the boost circuit 105*d* is positioned between the first electrode of the variable resistance element and the column selection circuit 104 in the above-described first variation of the basic configuration (FIG. 26).

That is, in the configuration shown in FIG. 47, the current limit circuit 105*b* includes a plurality of limit circuits that are provided for the respective columns, and between the column selection circuit 104 and the bit lines, the plurality of limit circuits (N-type MOS transistors) are interposed. Furthermore, the boost circuit 105*d* includes a plurality of boost circuit units (P-type MOS transistors) that are provided for the respective columns, and between the column selection circuit 104 and the bit lines, the plurality of boost circuit units are interposed. Moreover, the limit circuit (N-type MOS transistor) and the boost circuit unit (P-type MOS transistor) which are provided for a common column are connected in parallel.

In the configuration of FIG. 47, the boost circuit 105*d* is positioned close to the memory cell array, which allows a boost control to be performed at a position closer to the memory cell as compared to the case of FIG. 41. As a result, upon resistance-decreasing programming, the load for charging and discharging via the boost circuit 105*d* can be smaller, which allows the boost to be performed according to any change.

The column selection circuit 104 generally includes a P-type MOS transistor, an N-type MOS transistor, and a decoder circuit, and one bit line corresponding to a selected memory cell is selected. When the gate voltage of the P-type MOS transistor of this column selection circuit 104 is controlled using a column selection signal and a boost control signal, the column selection circuit 104 can be provided with a function of boosting current. In this case, it is no longer necessary to provide the boost circuit 105*d*, allowing for a reduction in area. This means that the current limit circuit 105*b* and the boost circuit 105*d* may be shared with the column selection circuit 104 by providing selection signals to the gates of the respective N-type MOS transistors (limit circuits) and the respective P-type MOS transistors (boost circuit units).

[Second Variation of Variable Resistance Nonvolatile Memory Device According to Embodiment of the Present Invention]

Figure 48:
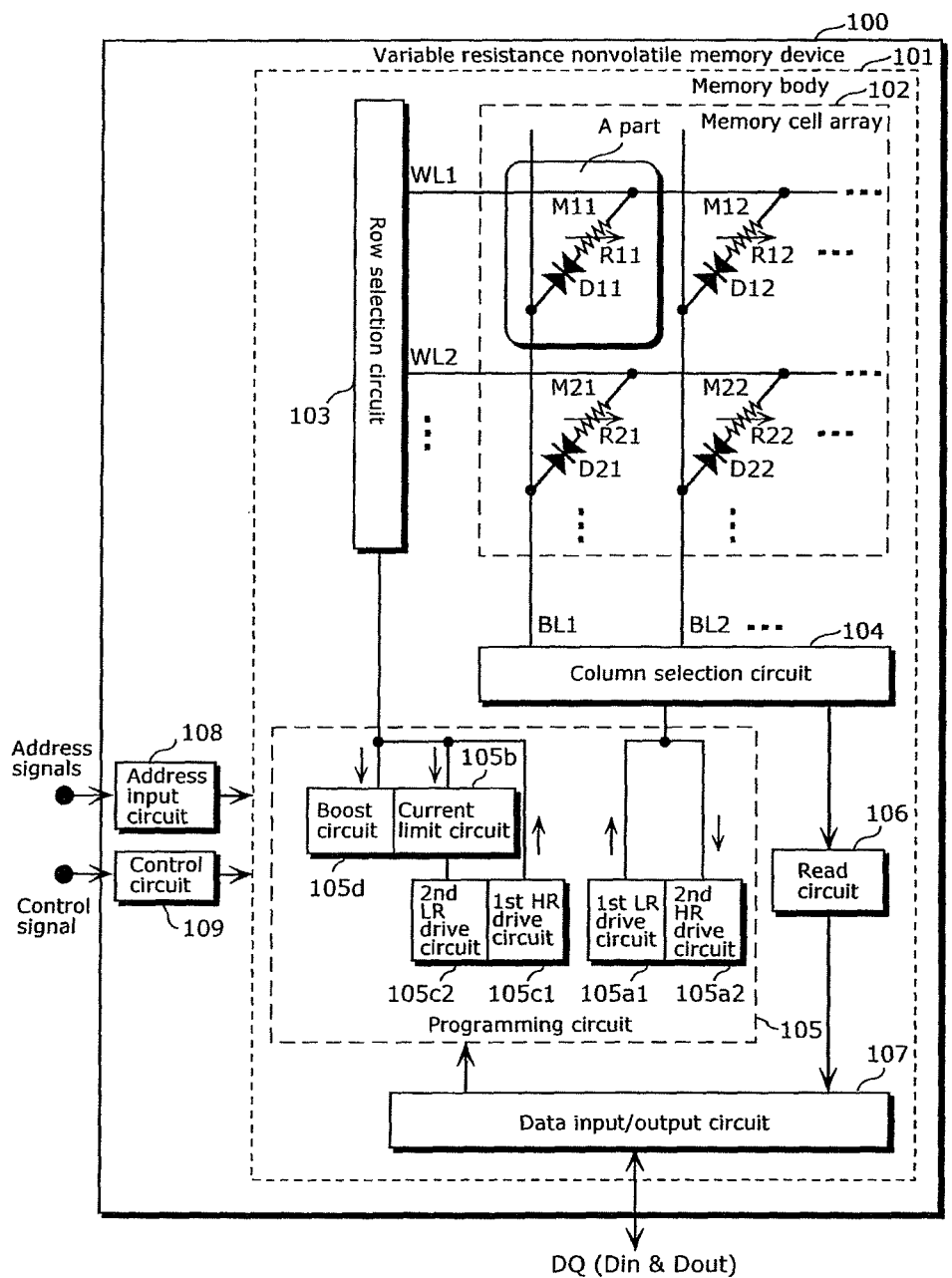
FIG. 48 is a configuration diagram of a variable resistance nonvolatile memory device according to the second variation of an embodiment of the present invention.
Figure 49:
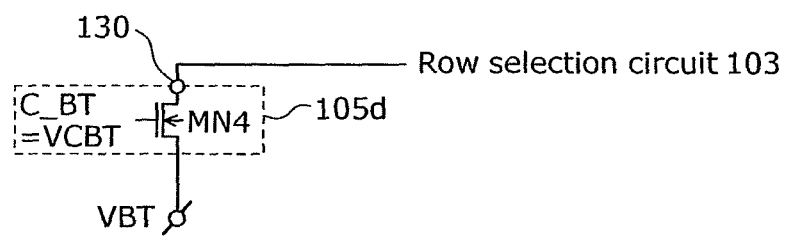
FIG. 49 is a circuit diagram of a boost circuit according to the second variation of an embodiment of the present invention.

As described in the second variation of the basic configuration in the embodiment. (FIG. 27), the current limit circuit 105*b* may be provided not on the side of the first LR drive circuit 105*a*1 but on the side of the second LR drive circuit 105*c*2 as shown in FIG. 48. In the case where the current limit circuit 105*b* is provided on the side of the second LR drive circuit 105*c*2, it is only necessary that the boost circuit 105*d* be also provided on the side of the second LR drive circuit 105*c*2 as shown in FIG. 48 (the boost circuit 105*d* be connected to the row selection circuit 103 and the second LR drive circuit 105*c*2) and furthermore, the boost circuit 105*d* include the N-type MOS transistor MN4 as shown in FIG. 49 so that the boost control signal C_BT is at high voltage level when pulses for resistance-decreasing programming are being generated and in a certain period of time after activation of the pulses.

Figure 50:
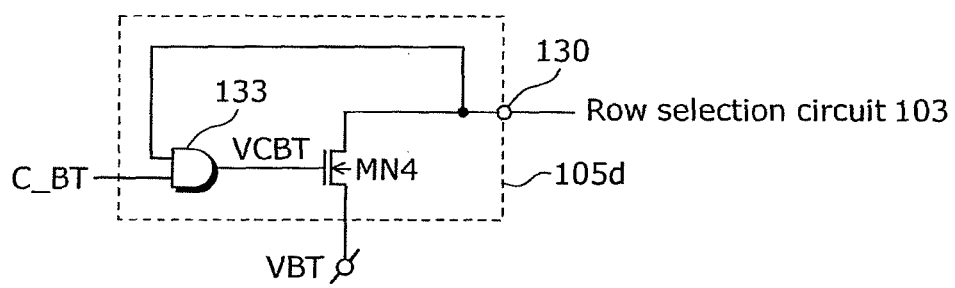
FIG. 50 is another circuit diagram of the boost circuit according to the second variation of the embodiment of the present invention.

In this second variation, the boost control voltage VCBT is at high voltage level for a certain period of time until the variable resistance element of the memory cell changes to the low resistance state. This certain period of time may be determined using an output voltage of the boost circuit 105d as shown in FIG. 50. That is, the boost circuit 105d may use a signal which represents a feedback voltage of the output terminal 130, and turn off the transistor MN4 when the voltage of the output terminal 130 reaches a predetermined voltage after the transistor MN4 is turned on.

Furthermore, in the configuration of FIG. 50, the drain terminal (the output terminal 130) of the N-type MOS transistor MN4 is connected to one input terminal of the AND circuit 133, and to the other input terminal thereof, a boost control signal C_BT is input. Herein, C_BT indicates a boost control signal which is set at high voltage level for a certain period of time after a start of the resistance-decreasing programming. Owing to the configuration shown in FIG. 50, while the output voltage of the boost circuit 105d is high, VCBT is controlled to be at high voltage level, and when the output voltage of the boost circuit 105d lowers, then VCBT is controlled to be at low voltage level. Furthermore, as the output voltage of the boost circuit 105d decreases, the boost control voltage VCBT changes gradually from high to low, which allows a decrease in the driving capability of the boost circuit, and it is therefore possible to more appropriately control the current driving capability of the boost circuit.

Figure 51:
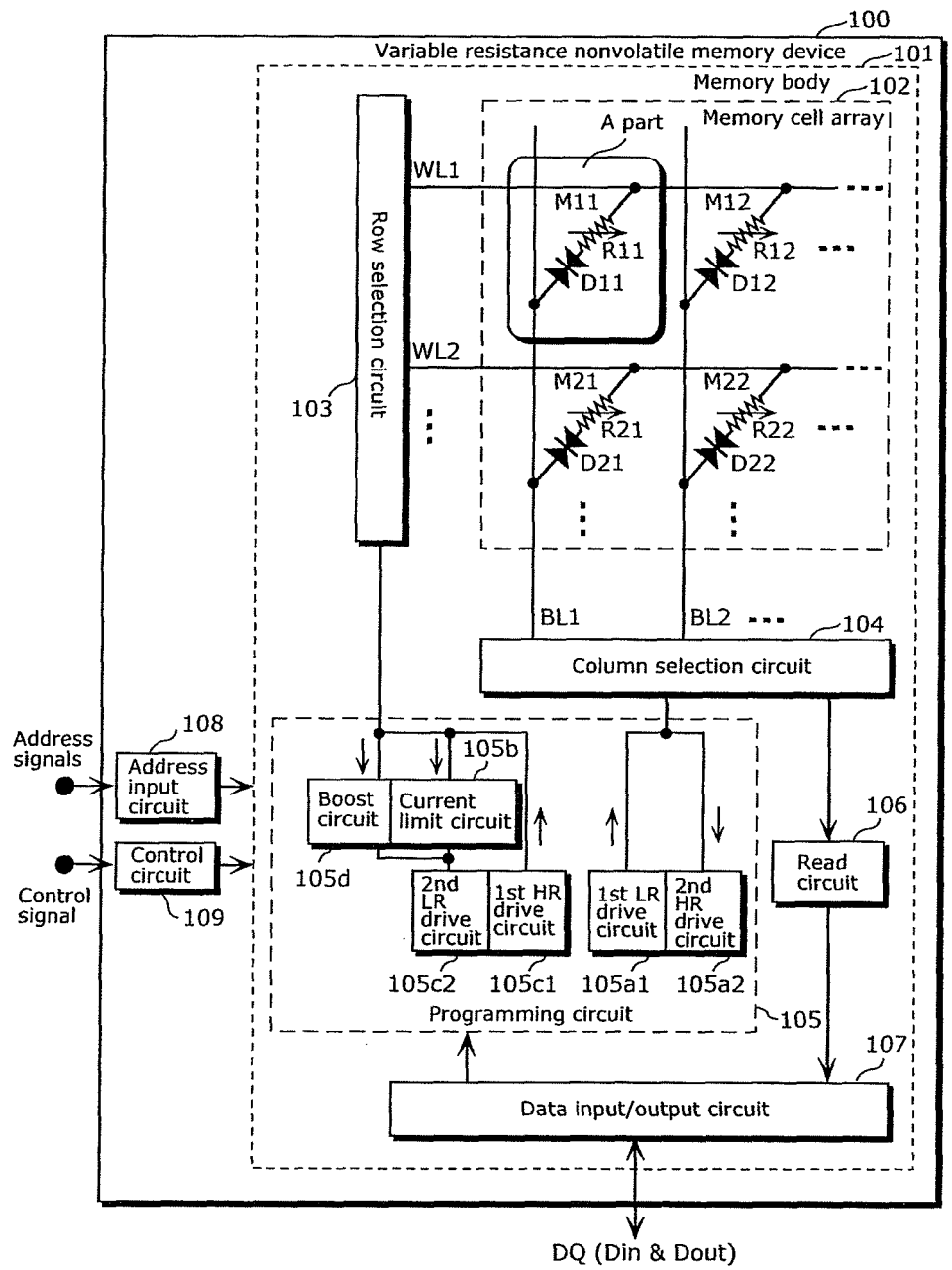
FIG. 51 is another configuration diagram of the variable resistance nonvolatile memory device according to the second variation of the embodiment of the present invention.

Furthermore, it may be such that, as shown in FIG. 51, the input terminal of the boost circuit 105d is connected to the second LR drive circuit 105c2 so that the boost current is supplied from the second LR drive circuit 105c2 to the boost circuit 105d. In other words, with the configuration shown in FIG. 51, the boost circuit 105d is connected in parallel to the current limit circuit 105b. Furthermore, the current limit circuit 105b and the boost circuit 105d are interposed between the second LR drive circuit 105c2 and the row selection circuit 103.

Figure 52:
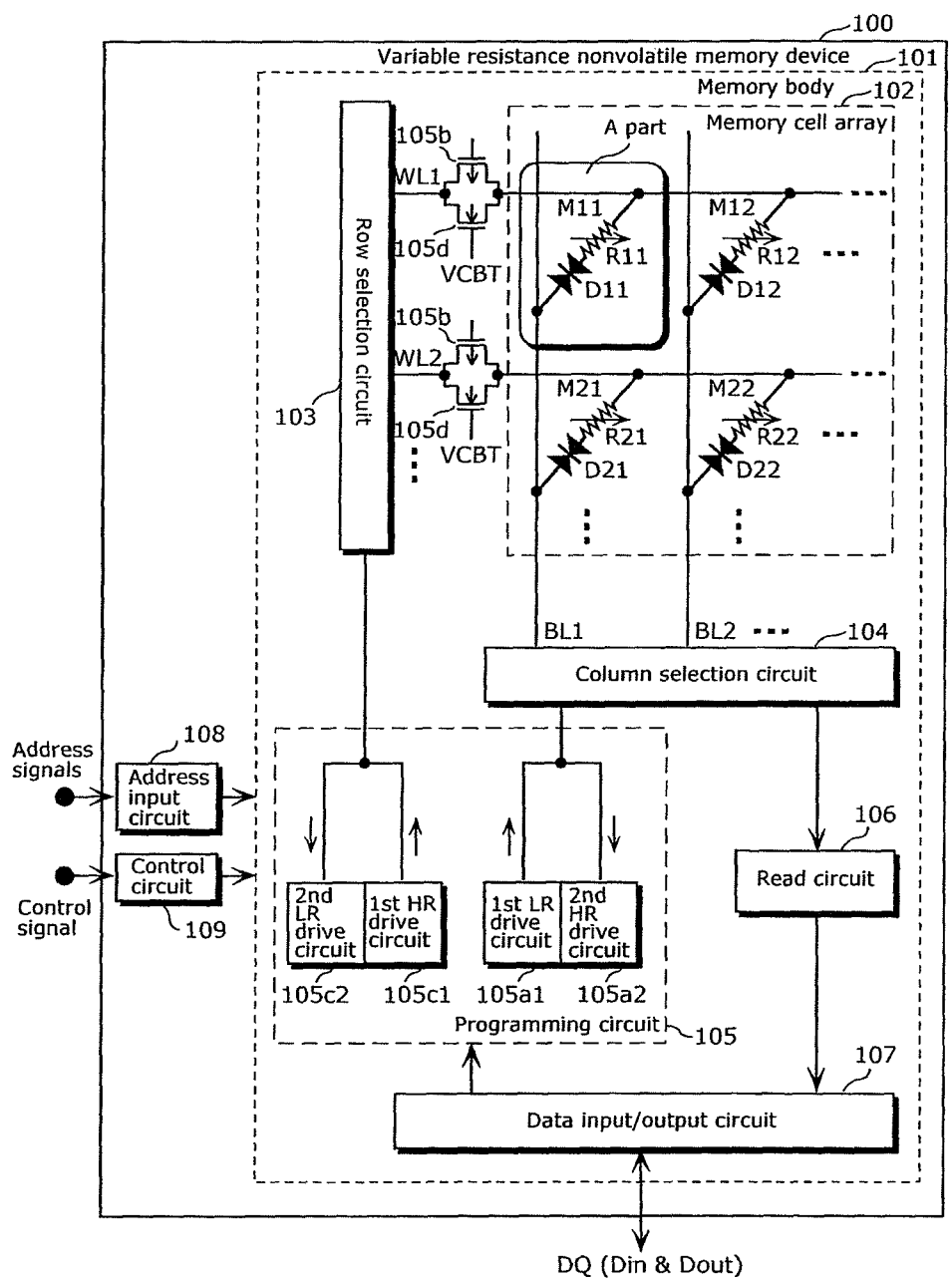
FIG. 52 is another configuration diagram of the variable resistance nonvolatile memory device according to the second variation of the embodiment of the present invention.

Furthermore, it may also be possible that, as shown in FIG. 52, the boost circuit 105d is positioned between the second electrode of the variable resistance element and the row selection circuit 103.

That is, in the configuration shown in FIG. 52, the current limit circuit 105b includes a plurality of limit circuits that are provided for the respective rows, and between the row selection circuit 103 and the word lines, the plurality of limit circuits (P-type MOS transistors) are interposed. Furthermore, the boost circuit 105d includes a plurality of boost circuit units (N-type MOS transistors) that are provided for the respective rows, and between the row selection circuit 103 and the word lines, the plurality of boost circuit units are interposed. Moreover, the limit circuit (P-type MOS transistor) and the corresponding boost circuit unit (N-type MOS transistor) which are provided for a common row are connected in parallel.

In the configuration of FIG. 52, the boost circuit 105d is positioned close to the memory cell array, which allows a boost control to be performed at a position closer to the memory cell as compared to the case of FIG. 48. As a result, upon resistance-decreasing programming, the load for charging and discharging via the boost circuit 105d can be smaller, which allows boosting according to any change.

The row selection circuit 103 generally includes a P-type MOS transistor, an N-type MOS transistor, and a decoder circuit, and one word line corresponding to a selected memory cell is selected. When the gate voltage of the P-type MOS transistor of this row selection circuit 103 is controlled using a row selection signal and a boost control signal, the row selection circuit 103 can be provided with a function of boosting current. In this case, it is no longer necessary to provide the boost circuit 105d, allowing for a reduction in area. This means that the current limit circuit 105b and the boost circuit 105d may be shared with the row selection circuit 103 by providing selection signals to the gates of the respective P-type MOS transistors (limit circuits) and the respective N-type MOS transistors (boost circuit units).

Next, a behavior example, in a programming cycle, of the variable resistance nonvolatile memory device 100 according to the present embodiment in the case where data is programmed in the device is described with reference to the timing chart shown in FIG. 53.

Figure 53:
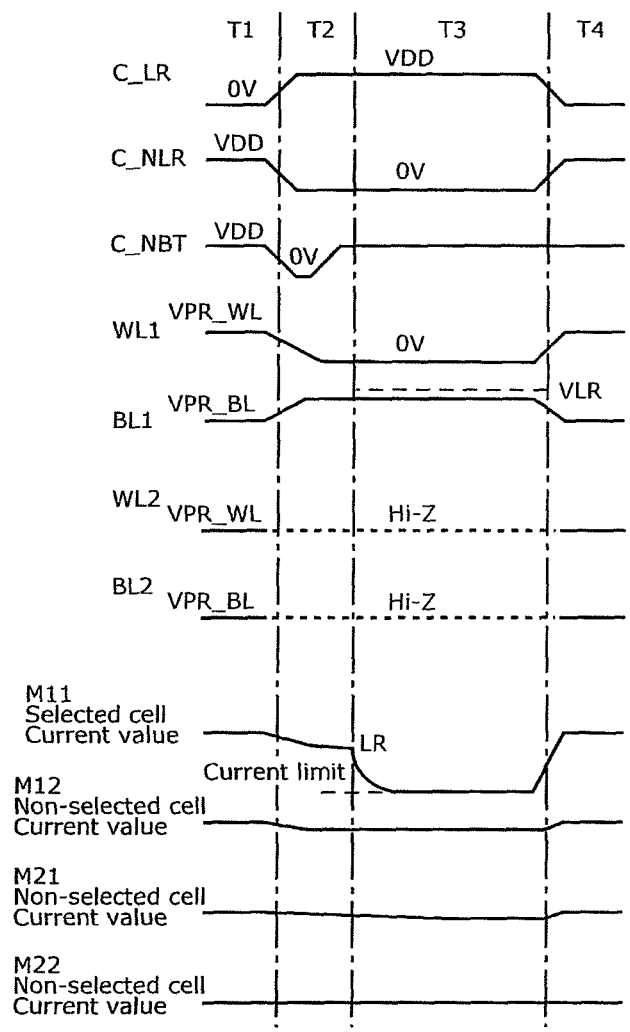
FIG. 53 shows a timing chart of a variable resistance nonvolatile memory device according to an embodiment of the present invention.
Figure 54:
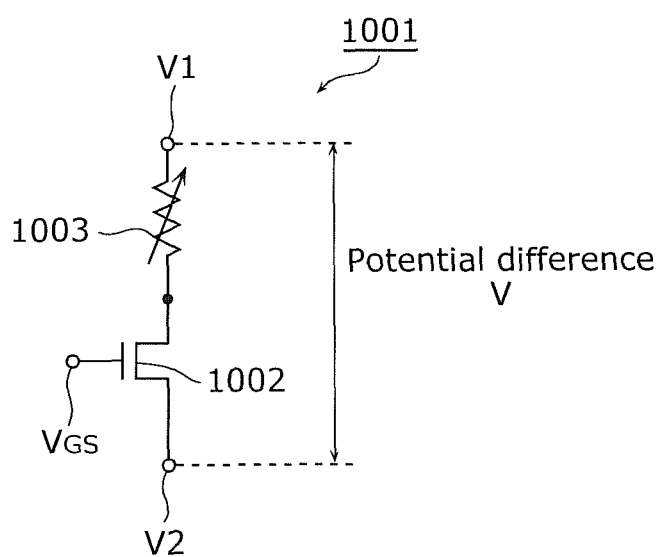
FIG. 54 is a circuit diagram of a memory cell of a conventional variable resistance nonvolatile memory device.
Figure 55:
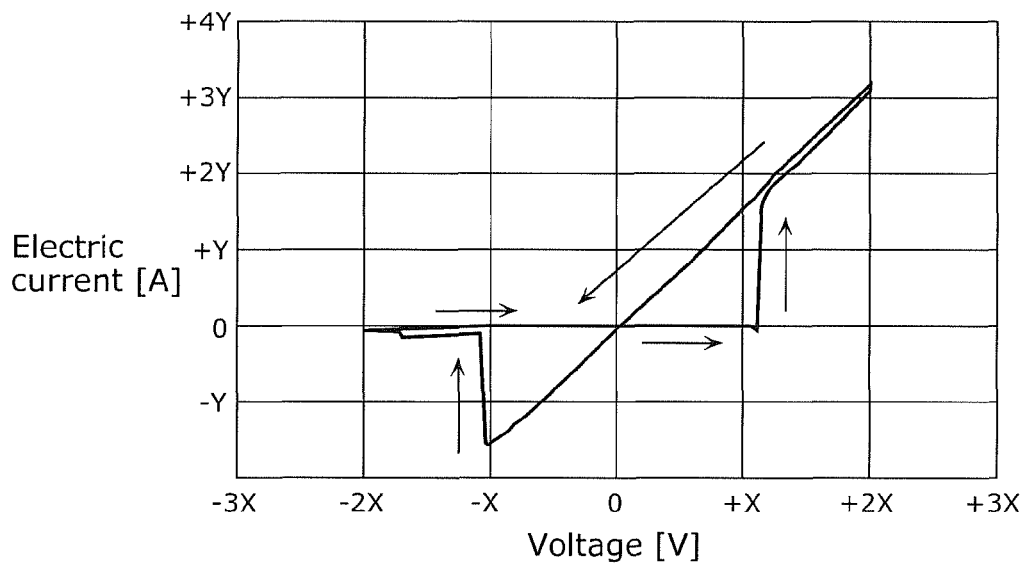
FIG. 55 is a graph showing voltage-current characteristics of a variable resistance element of the conventional variable resistance nonvolatile memory device.
Figure 56:
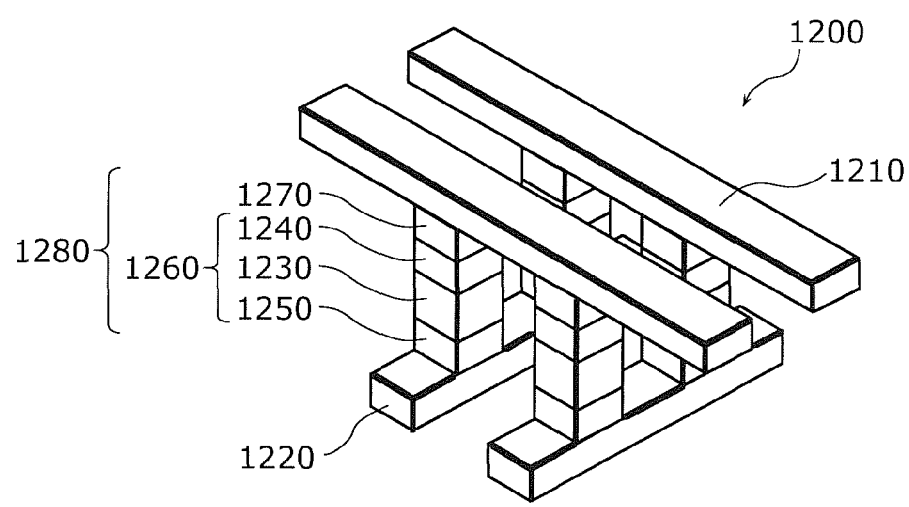
FIG. 56 schematically shows a memory cell of a conventional variable resistance nonvolatile memory device.
Figure 57:
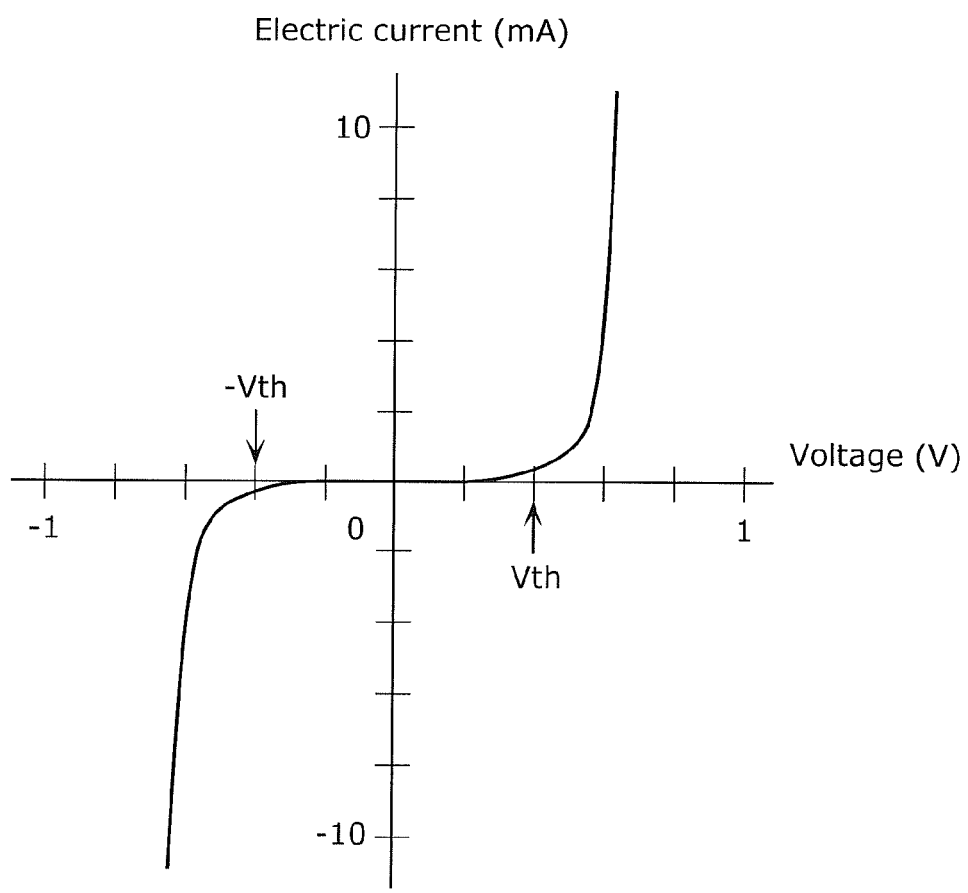
FIG. 57 is a graph showing voltage-current characteristics of a non-linear element of a conventional variable resistance nonvolatile memory device.

FIG. 53 shows only the case where data "0", i.e., low resistance state, is written, and to the case where data "1", i.e., high resistance state, is written, the same as the first example of FIG. 31B applies.

The following describes only the case where the memory cell M11 is selected and the programming of data are performed. When the memory cell M11 is a selected cell, the memory cell M12 is a non-selected cell with a selected voltage in the word line and a non-selected voltage in the bit line, the memory cell M21 is a non-selected cell with a non-selected voltage in the word line and a selected voltage in the bit line, and the memory cell M22 is a non-selected cell with non-selected voltages in both of the word line and the bit line. FIG. 53 shows also current which flows to the non-selected cells M12, M21 and M22 in addition to current which flows to the selected memory cell M11. In the current waveform, the current flowing in the direction from the word line to the bit line, that is, in the direction from the second electrode to the first electrode of the variable resistance element has positive polarity.

The following describes the behavior divided into periods T1 to T4, with reference to FIG. 53. In FIG. 53, VDD corresponds to the power supply voltage supplied to the variable resistance nonvolatile memory device 100.

In the cycle of writing data "0" in the memory cell M11 shown in FIG. 53, all the word lines (WL1 and WL2) are previously charged to voltage VPR_WL, and all the bit lines (BL1 and BL2) are previously charged to voltage VPR_BL. The precharge voltage is a voltage approximately intermediate of the maximum amplitude of each of the word lines and the bit lines.

The period T2 following the period T1 is a period in which the variable resistance element R11 is still in the high resistance state, and the row selection circuit 103 selects the word line WL1 and the column selection circuit 104 selects the bit line BL1, and the selected bit line BL1 is driven to VLR with use of the first LR drive circuit 105a1 and the selected word line WL1 is driven to 0 V with use of the second LR drive circuit 105c2. Furthermore, the selected bit line BL1 is driven using the boost circuit 105d, and in the period T2, the boost control signal C_NBT is OFF, i.e., at high voltage level. Over time, the voltage of BL1 increases and the voltage of the word line WL1 decreases. While the voltage of the word line WL1 drops in a relatively high speed as in the case of the first example shown in FIGS. 31A and 31B, the voltage of the bit line BL1 increases in a relatively high speed as compared to the case of the first example because the bit line BL1 is driven by not only the first LR drive circuit 105a1 but also the boost circuit 105d.

The period T3 is a period in which programming or a change in resistance occurs, causing a change to the low resistance state. In the period T3, the value of current flowing to the selected memory cell M11 increases, and the programming is performed on the variable resistance element R11 from the high resistance value to the low resistance value at a point of application, to the first electrode 207, of a voltage having an absolute value which exceeds a low resistance voltage VLth of the variable resistance element with respect to the second electrode 209. As the resistance decreases, the current flowing to the memory cell M11 increases, but the value of current will not increase over a certain value because of the current limit circuit 105b. The decrease in resistance therefore stops with the certain resistance value.

After that, in the period T4, the selection of the word line WL1 and the bit line BL1 was released, and all the word lines are previously charged to voltage VPR_WL while all the bit lines are previously charged to voltage VPR_BL, thus completing the writing of the data "0".

It is to be noted that the structure of the memory cell Mij is not limited to the structure shown in FIG. 22 and may be a structure shown in one of FIGS. 32A to 32D, 33, and 34A to 34C. Furthermore, as in the above-described case of the basic configuration of the embodiment, it is also possible to provide a configuration which combines different electrodes and a tantalum oxide layer having a different concentration, such as a configuration in which the upper electrode contains a material having a higher standard electrode potential, like the electrode configuration of FIGS. 22 and 32A to 32D, and the second tantalum oxide layer having a high oxygen content atomic percentage shown in FIGS. 33 and 34A to 34C is provided in contact with the upper electrode.

Furthermore, the variable resistance nonvolatile memory device according to an implementation of the present invention may also be applied likewise to a zirconium oxide or the like which is a transition metal oxide other than the tantalum oxide and the hafnium oxide. Furthermore, the transition metal oxide layer held between the upper and lower electrodes only needs to include an oxide layer of tantalum, hafnium, zirconium, or the like as a primary variable resistance layer which causes a change in resistance, and thus may contain a small amount of other chemical elements. It is also possible to add a small amount of other chemical elements on purpose to make a fine control on a resistance value, which is also included in the scope of the present invention. In forming a resistance film by sputtering, a small amount of an element may be mixed unintentionally due to residual gas or gas emission from a wall of a vacuumed vessel, and it is a matter of course that such a case where a small amount of a chemical element is mixed in the resistance film is also included in the scope of the present invention.

While the corners and sides of each component are drawn linearly in the above figures, components with round corners and sides for manufacturing reasons are also encompassed by the present invention.

It is also possible to combine at least part of functions or configurations of the variable resistance nonvolatile memory device and variations thereof according to the above embodiment.

All numerals used above are merely illustrative for specific descriptions of the present invention and thus, the present invention is not limited by the illustrated numerals. Moreover, a logic level represented by high/low or a switching state represented by on/off is merely illustrative for specific descriptions of the present invention, and it is therefore possible to obtain an equivalent result with a different combination of illustrated logic levels or switching states. Furthermore, the above-described configurations of the logic circuit is merely illustrative for specific descriptions of the present invention, and it is therefore possible to attain an equivalent input-output relation with a different configuration of the logic circuit. In addition, the above-described materials of the components are all illustrative for specific descriptions of the present invention and thus, the present invention is not limited by the illustrated materials.

While the above description shows examples using MOS transistors, other transistors such as a bipolar transistor may also be used.

Furthermore, the present invention includes numerous variations obtained by making modifications that those skilled in the art could think of, to the present embodiments, without departing from the spirit and scope of the present invention.

The variable resistance nonvolatile memory device according to an implementation of the present invention has high reliability and stable programming characteristics, and is thus useful as a nonvolatile memory device which is used in variable electronic devices such as digital home appliances, memory cards, mobile phones, and personal computers.

| [Reference Signs List] | |
|---|---|
| 100, 120 | Variable resistance nonvolatile memory device |
| 101, 121 | Memory body |
| 102, 122 | Memory array |
| 103 | Row selection circuit |
| 104 | Column selection circuit |
| 105 | Programming circuit |
| 105a1 | First LR drive circuit |
| 105a2 | Second HR drive circuit |
| 105b | Current limit circuit |
| 105c1 | First HR drive circuit |
| 105c2 | Second LR drive circuit |
| 105d | Boost circuit |
| 106 | Read circuit |
| 107 | Data input/output circuit |
| 108 | Address input circuit |
| 109 | Control circuit |
| 130 | Output terminal |
| 131 | Inverter |
| 132 | NAND circuit |
| 133 | AND circuit |
| 200, 220, 250, 270, 1001, 1280, Mij, M11, M12, M21, M22 | Memory cell |
| 201 | First-layer line |
| 202 | First via |
| 203 | Third electrode |
| 204 | Current steering layer |
| 205 | Fourth electrode |
| 206 | Second via |
| 207 | First electrode |
| 208, 1230, 3302 | Variable resistance layer |
| 208a | First tantalum oxide layer |
| 208b | Second tantalum oxide layer |
| 209 | Second electrode |
| 210 | Third via |
| 211 | Second-layer line |
| 212, Dij, D11, D12, D21, D22 | Current steering element |
| 213, 1003, 1260, Rij, R11, R12, R21, R22 | Variable resistance element |
| 500 | Nonvolatile memory device |
| 501 | Monocrystal silicon substrate |
| 502 | Oxide layer |
| 503, 1250, 1401, 1501, 3301 | Lower electrode |
| 504, 1402, 1502 | Oxygen-deficient Ta oxide layer (Oxygen-deficient Hf oxide layer) |
| 505, 1240, 1403, 1503, 3303 | Upper electrode |
| 506 | Element region |
| 1002, MN1, MN2, MN3, MN4, MP1, MP2, MP3, MP4 | Transistor |
| 1200 | Nonvolatile memory device |
| 1270 | Diode element |
| 1404, 1504 | Oxygen ion |
| BLj, BL1, BL2 | Bit line |
| WLi, WL1, WL2 | Word line |

The invention claimed is:

1. A variable resistance nonvolatile memory device comprising:
    memory cells each of which includes a variable resistance element and a current steering element having two terminals connected in series, the variable resistance element changing, by application of a first voltage having a predetermined first polarity, to a low resistance state with a resistance value in a first range, and changing, by application of a second voltage having a second polarity opposite to the first polarity, to a high resistance state with a resistance value in a second range higher than the first range;
    first signal lines and second signal lines crossing the first signal lines;
    a memory cell array in which the memory cells are arranged at cross-points of the first signal lines and the second signal lines and each of the memory cells has ends connected to a set of one of the first signal lines and one of the second signal lines which crosses one of the first signal lines;
    a programming circuit which generates a bipolar voltage to be applied to the memory cells through the first signal lines and the second signal lines;
    a current limit circuit placed in a path of a current flowing from the programming circuit to the memory cells, the current limit circuit limiting only a first current among the first current and a second current, the first current flowing in a direction for changing the memory cells to the low resistance state, and the second current flowing in a direction for changing the memory cells to the high resistance state; and
    a boost circuit that is connected in parallel to the current limit circuit and increases, when one of the memory cells changes to the low resistance state, the first current by short-circuiting the path of the current and a voltage supply during a first period before the memory cell changes to the low resistance state.

2. The variable resistance nonvolatile memory device according to claim 1,
    wherein the boost circuit includes:
    an output terminal connected to the path of the current; and
    a switch connected between the voltage supply and the output terminal,
    wherein the switch is in on-state during the first period.

3. The variable resistance nonvolatile memory device according to claim 2,
    wherein the switch is a transistor,
    a source terminal of the transistor is connected to the voltage supply,
    a drain terminal of the transistor is connected to the output terminal, and
    the transistor is in on-state during the first period.

4. The variable resistance nonvolatile memory device according to claim 2,
    wherein the switch is turned off before a memory cell changes to the low resistance state.

5. The variable resistance nonvolatile memory device according to claim 4,
    wherein the boost circuit turns off the switch, using a feedback signal of a voltage of the output terminal, when the voltage of the output terminal reaches a predetermined voltage after the switch is turned on.

6. The variable resistance nonvolatile memory device according to claim 1,
    wherein each of the memory cells changes to the low resistance state when the first voltage having the first polarity such that a corresponding one of the first signal lines has a higher voltage than a corresponding one of the second signal lines is applied to a corresponding one of the memory cells through the corresponding one of the first signal lines and the corresponding one of the second signal lines connected to the corresponding one of the memory cells, and each of the memory cells changes to the high resistance state when the second voltage having the second polarity opposite to the first polarity is applied to the corresponding one of the memory cells through the corresponding one of the first signal lines and the corresponding one of the second signal lines connected to the corresponding one of the memory cells,
    the programming circuit comprises: a first drive circuit which generates a first drive voltage equal to or higher than the first voltage; a second drive circuit which generates a second drive voltage equal to or higher than the second voltage; a third drive circuit which generates a voltage serving as a basis for the first drive voltage; and a fourth drive circuit which generates a voltage serving as a basis for the second drive voltage,
    the variable resistance nonvolatile memory device further comprises:
    a first selection circuit which connects the first drive circuit and the fourth drive circuit to a selected one of the first signal lines; and
    a second selection circuit which connects the second drive circuit and the third drive circuit to a selected one of the second signal lines, and
    the current limit circuit and the boost circuit are placed between the first drive circuit and the first selection circuit.

7. The variable resistance nonvolatile memory device according to claim 1,
    wherein each of the memory cells changes to the low resistance state when the first voltage having the first polarity such that a corresponding one of the first signal lines has a higher voltage than a corresponding one of the second signal lines is applied to a corresponding one of the memory cells through the corresponding one of the first signal lines and the corresponding one of the second signal lines connected to the corresponding one of the memory cells, and each of the memory cells changes to the high resistance state when the second voltage having the second polarity opposite to the first polarity is applied to the corresponding one of the memory cells through the corresponding one of the first signal lines and the corresponding one of the second signal lines connected to the corresponding one of the memory cells,
    the programming circuit comprises: a first drive circuit which generates a first drive voltage equal to or higher than the first voltage; a second drive circuit which generates a second drive voltage equal to or higher than the second voltage; a third drive circuit which generates a voltage serving as a basis for the first drive voltage; and a fourth drive circuit which generates a voltage serving as a basis for the second drive voltage,
    the variable resistance nonvolatile memory device further comprises:
    a first selection circuit which connects the first drive circuit and the fourth drive circuit to a selected one of the first signal lines; and
    a second selection circuit which connects the third drive circuit and the second drive circuit to a selected one of the second signal lines, the current limit circuit includes a plurality of limit circuits, and each of the current limit circuits is placed between the first selection circuit and a corresponding one of the first signal lines, and the boost circuit includes a plurality of boost circuit units, and each of the boost circuit units is placed between the first selection circuit and a corresponding one of the first signal lines.

8. The variable resistance nonvolatile memory device according to claim 1, wherein each of said memory cells changes to the low resistance state when the first voltage having the first polarity such that a corresponding one of the first signal lines has a higher voltage than a corresponding one of the second signal lines is applied to a corresponding one of the memory cells through the corresponding one of the first signal lines and the corresponding one of the second signal lines connected to the corresponding one of the memory cells, and each of the memory cells changes to the high resistance state when the second voltage having the second polarity opposite to the first polarity is applied to the corresponding one of the memory cells through the corresponding one of the first signal lines and the corresponding one of the second signal lines connected to corresponding one of the memory cells, the programming circuit comprises: a first drive circuit which generates a first drive voltage equal to or higher than the first voltage; a second drive circuit which generates a second drive voltage equal to or higher than the second voltage; a third drive circuit which generates a voltage serving as a basis for the first drive voltage; and a fourth drive circuit which generates a voltage serving as a basis for the second drive voltage, the variable resistance nonvolatile memory device further comprises:

a first selection circuit which connects the first drive circuit and the fourth drive circuit to a selected one of the first signal lines; and a second selection circuit which connects the third drive circuit and the second drive circuit to a selected one of the second signal lines, and the current limit circuit and the boost circuit are placed between the third drive circuit and the second selection circuit.

9. The variable resistance nonvolatile memory device according to claim 1, wherein each of the memory cells changes to the low resistance state when the first voltage having the first polarity such that a corresponding one of the first signal lines has a higher voltage than a corresponding one of the second signal lines is applied to a corresponding one of the memory cells through the corresponding one of the first signal lines and the corresponding one of the second signal lines connected to the corresponding one of the memory cells, and each of the memory cells changes to the high resistance state when the second voltage having the second polarity opposite to the first polarity is applied to the corresponding one of the memory cells through the corresponding one of the first signal lines and the corresponding one of the second signal lines connected to the corresponding one of the memory cells, the programming circuit comprises: a first drive circuit which generates a first drive voltage equal to or higher than the first voltage; a second drive circuit which generates a second drive voltage equal to or higher than the second voltage; a third drive circuit which generates a voltage serving as a basis for the first drive voltage; and a fourth drive circuit which generates a voltage serving as a basis for the second drive voltage, the variable resistance nonvolatile memory device further comprises:

a first selection circuit which connects the first drive circuit and the fourth drive circuit to a selected one of the first signal lines; and a second selection circuit which connects the third drive circuit and the second drive circuit to a selected one of the second signal lines, and the current limit circuit includes a plurality of limit circuits, and each of the current limit circuits is placed between the second selection circuit and a corresponding one of the second signal lines, and the boost circuit includes a plurality of boost circuit units, and each of the boost circuit units is placed between the second selection circuit and a corresponding one of the second signal lines.

10. The variable resistance nonvolatile memory device according to claim 6, wherein the current limit circuit comprises an N-type MOS transistor, and the boost circuit comprises a P-type MOS transistor connected in parallel to the N-type MOS transistor.

11. The variable resistance nonvolatile memory device according to claim 6, wherein the current limit circuit comprises an N-type MOS transistor, and when the variable resistance element is set to have a resistance value which is, among resistance values in the first range, larger than a third resistance value that is set when a third voltage is applied to the corresponding one of the memory cells, and smaller than a fourth resistance value that is set when a fourth voltage smaller than the third voltage is applied to the corresponding one of the memory cells, a gate voltage of the N-type MOS transistor is set to be (i) larger than a value obtained by adding an absolute value of a threshold voltage of the N-type MOS transistor to the fourth voltage, (ii) smaller than a value obtained by adding the absolute value of the threshold voltage of the N-type MOS transistor to the third voltage, and (iii) equal to or lower than the first drive voltage.

12. The variable resistance nonvolatile memory device according to claim 8, wherein the current limit circuit comprises an N-type MOS transistor, and when the variable resistance element is set to have a resistance value which is, among resistance values in the first range, larger than a third resistance value that is set when a third voltage is applied to the corresponding one of the memory cells, and smaller than a fourth resistance value that is set when a fourth voltage smaller than the third voltage is applied to the corresponding one of the memory cells, a gate voltage of the N-type MOS transistor is set to be (i) larger than a value obtained by subtracting the third voltage from the first drive voltage and adding up an absolute value of a threshold voltage of the N-type MOS transistor, and (ii) smaller than a value obtained by subtracting the fourth voltage from the first drive voltage and adding up the absolute value of the threshold voltage of the N-type MOS transistor.

13. The variable resistance nonvolatile memory device according to claim 7, wherein each of the current limit circuit in the current limit circuit comprises an N-type MOS transistor, each of the boost circuit units in the boost circuit comprises a P-type MOS transistor connected in parallel to the N-type MOS transistor, and the current limit circuit and the boost circuit are used as the first selection circuit when a selection signal is provided to a gate of the N-type MOS transistor and a gate of the P-type MOS transistor.

14. The variable resistance nonvolatile memory device according to claim 8, wherein the current limit circuit comprises a P-type MOS transistor, and the boost circuit comprises an N-type MOS transistor connected in parallel to the P-type MOS transistor.

15. The variable resistance nonvolatile memory device according to claim 6, wherein the current limit circuit comprises a P-type MOS transistor, and when the variable resistance element is set to have a resistance value which is, among resistance values in the first range, larger than a third resistance value that is set when a third voltage is applied to the corresponding one of the memory cells, and smaller than a fourth resistance value that is set when a fourth voltage smaller than the third voltage is applied to the corresponding one of the memory cells, a gate voltage of the P-type MOS transistor is set to be (i) larger than a value obtained by subtracting an absolute value of a threshold voltage of the P-type MOS transistor from the fourth voltage, and (ii) smaller than a value obtained by subtracting the absolute value of the threshold voltage of the P-type MOS transistor from the third voltage.

16. The variable resistance nonvolatile memory device according to claim 8, wherein the current limit circuit comprises a P-type MOS transistor, and when the variable resistance element is set to have a resistance value which is, among resistance values in the first range, larger than a third resistance value that is set when a third voltage is applied to the corresponding one of the memory cells, and smaller than a fourth resistance value that is set when a fourth voltage smaller than the third voltage is applied to the corresponding one of the memory cells, a gate voltage of the P-type MOS transistor is set to be (i) larger than a value obtained by subtracting the third voltage and an absolute value of a threshold voltage of the P-type MOS transistor from the first drive voltage, (ii) smaller than a value obtained by subtracting the fourth voltage and the threshold voltage of the P-type MOS transistor from the first drive voltage, and (iii) equal to or higher than a reference voltage of the first drive voltage.

17. The variable resistance nonvolatile memory device according to claim 9, wherein each of the current limit circuit in the current limit circuit comprises a P-type MOS transistor, each of the boost circuit units in the boost circuit comprises an N-type MOS transistor connected in parallel to the P-type MOS transistor, and the current limit circuit and the boost circuit are used as the second selection circuit when a selection signal is provided to a gate of the P-type MOS transistor and a gate of the N-type MOS transistor.

18. The variable resistance nonvolatile memory device according to claim 11, wherein the third resistance value is a minimum resistance value in the first range, and a current flowing to the memory cell when the variable resistance element is set at the third resistance value is equal to or less than a maximum current that the current steering element is resistant to breakage.

19. The variable resistance nonvolatile memory device according to claim 11, wherein the fourth resistance value is a maximum resistance value in the first range and is a maximum resistance value that the low resistance state and the high resistance state can be distinguished using a read circuit.

* * * * *